US011552261B2

(12) United States Patent
Chen et al.

(10) Patent No.: US 11,552,261 B2
(45) **Date of Patent: *Jan. 10, 2023**

(54) ORGANIC ELECTROLUMINESCENT MATERIALS AND DEVICES

(71) Applicant: Universal Display Corporation, Ewing, NJ (US)

(72) Inventors: Hsiao-Fan Chen, Taipei (TW); Tyler Fleetham, Newtown, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 408 days.

This patent is subject to a terminal disclaimer.

(21) Appl. No.: 15/967,732

(22) Filed: May 1, 2018

(65) Prior Publication Data

US 2018/0375036 A1 Dec. 27, 2018

Related U.S. Application Data

(60) Provisional application No. 62/524,080, filed on Jun. 23, 2017, provisional application No. 62/524,086, filed on Jun. 23, 2017.

(51) Int. Cl.
*H01L 51/00* (2006.01)
*C09K 11/06* (2006.01)
(Continued)

(52) U.S. Cl.
CPC ...... *H01L 51/0087* (2013.01); *C07F 15/0086* (2013.01); *C09K 11/06* (2013.01);
(Continued)

(58) Field of Classification Search
CPC ............................ C09K 11/06; H01L 51/5012
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 106117269 11/2016
CN 108299505 7/2018
(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Sean M DeGuire
(74) *Attorney, Agent, or Firm* — Duane Morris LLP

(57) ABSTRACT

A compound having the following formula

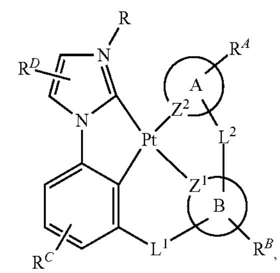

Formula I, is disclosed. The compound is useful as an emitter in OLED applications.

18 Claims, 2 Drawing Sheets

(51) Int. Cl.
*C07F 15/00* (2006.01)
*H01L 51/50* (2006.01)
*H01L 51/56* (2006.01)

(52) U.S. Cl.
CPC ...... *H01L 51/0054* (2013.01); *H01L 51/0067* (2013.01); *C09K 2211/1029* (2013.01); *C09K 2211/1044* (2013.01); *C09K 2211/185* (2013.01); *H01L 51/001* (2013.01); *H01L 51/0059* (2013.01); *H01L 51/0072* (2013.01); *H01L 51/0074* (2013.01); *H01L 51/0094* (2013.01); *H01L 51/5012* (2013.01); *H01L 51/5016* (2013.01); *H01L 51/56* (2013.01); *H01L 2251/558* (2013.01)

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2012/0302753 A1 11/2012 Li
2013/0026909 A1* 1/2013 Zeng .................... C07F 7/0814 313/504
2015/0105556 A1* 4/2015 Li ...................... C07F 15/0086 546/4
2015/0295189 A1 10/2015 Brooks
2016/0072082 A1 3/2016 Brooks
2017/0183368 A1 6/2017 Hara
2018/0090691 A1 3/2018 Brooks
2018/0305384 A1 10/2018 Chen
2018/0370978 A1 12/2018 Wolohan

FOREIGN PATENT DOCUMENTS

EP 0650955 5/1995
EP 1725079 11/2006
EP 2034538 3/2009
JP 200511610 1/2005
JP 2007123392 5/2007
JP 2007254297 10/2007
JP 2008074939 4/2008
WO 01/39234 5/2001
WO 02/02714 1/2002
WO 02015654 2/2002
WO 03040257 5/2003
WO 03060956 7/2003
WO 2004093207 10/2004
WO 2004107822 12/2004
WO 2005014551 2/2005
WO 2005019373 3/2005
WO 2005030900 4/2005
WO 2005089025 9/2005
WO 2005123873 12/2005
WO 2006009024 1/2006
WO 2006056418 6/2006
WO 2006072002 7/2006
WO 2006082742 8/2006
WO 2006098120 9/2006
WO 2006100298 9/2006
WO 2006103874 10/2006
WO 2006114966 11/2006
WO 2006132173 12/2006
WO 2007002683 1/2007
WO 2007004380 1/2007
WO 2007063754 6/2007
WO 2007063796 6/2007
WO 2008056746 5/2008
WO 2008101842 8/2008
WO 2008132085 11/2008
WO 2009000673 12/2008
WO 2009003898 1/2009
WO 2009008311 1/2009
WO 2009018009 2/2009
WO 2009021126 2/2009
WO 2009050290 4/2009
WO 2009062578 5/2009
WO 2009063833 5/2009
WO 2009066778 5/2009
WO 2009066779 5/2009
WO 2009086028 7/2009

(56) References Cited

FOREIGN PATENT DOCUMENTS

| | | |
|---|---|---|
| WO | 2009100991 | 8/2009 |
| WO | 2016/162488 | 11/2012 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on lndolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1)162-164(2002).
Lamansky, Sergey et al., "Synthesis and Characterization of Phosphorescent Cyclometalated Iridium Complexes," Inorg Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Tum-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N∧C∧N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- å]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).

(56) References Cited

OTHER PUBLICATIONS

Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Extended European Search Report dated Jun. 19, 2020 for corresponding EP Application No. 20165219.5.
Marie-Paule Van Den Eede et al: "Controlled Polymerization of a Cyclopentadithiophene-Phenylene Alternating Copolymer", Macromolecules, vol. 51, No. 21, Nov. 13, 2018 (Nov. 13, 2018), pp. 9043-9051, XP55702090, Washington, DC, United States ISSN: 0024-9297, DOI: 10.1021/acs.macromol.8b01820 *Figure 1 [Pd-PEPPSI-(Anisole)C12]*.
Joydev Dinda et al: ")-NHC", New Journal of Chemistry, vol. 37, No. 2, Jan. 1, 2013 (Jan. 1, 2013), pp. 431-438, XP55702144,GB ISSN: 1144-0546, DOI: 10.1039/C2NJ40740J *the whole document*.
Fleetham, T., et al., "Efficient "Pure" Blue OLEDs Employing Tetradentate Pt Complexes with a Narrow Spectral Bandwidth," Adv. Mater., Nov. 2014, pp. 7116-7121, vol. 26, No. 41. DOI: 10.1002/adma.201401759.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Applications No. 62/524,080, filed Jun. 23, 2017, and No. 62/524,086, filed Jun. 23, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

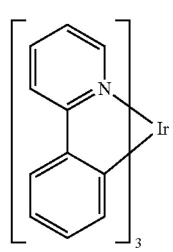

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

Tetradentate platinum complexes comprising an imidazole/benzimidazole carbene are disclosed. These platinum carbenes with the specific substituents disclosed herein are novel and provides phosphorescent emissive compounds that exhibit physical properties that can be tuned, such as sublimation temperature, emission color, and device stability. These compounds are useful in OLED applications.

A compound having the following formula

Formula I

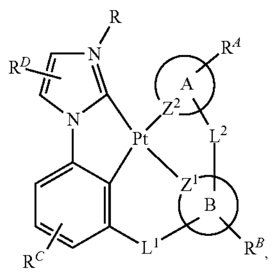

is disclosed. The variables in Formula I are defined in detail below.

An OLED comprising the compound having the Formula I in one of its organic layers is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
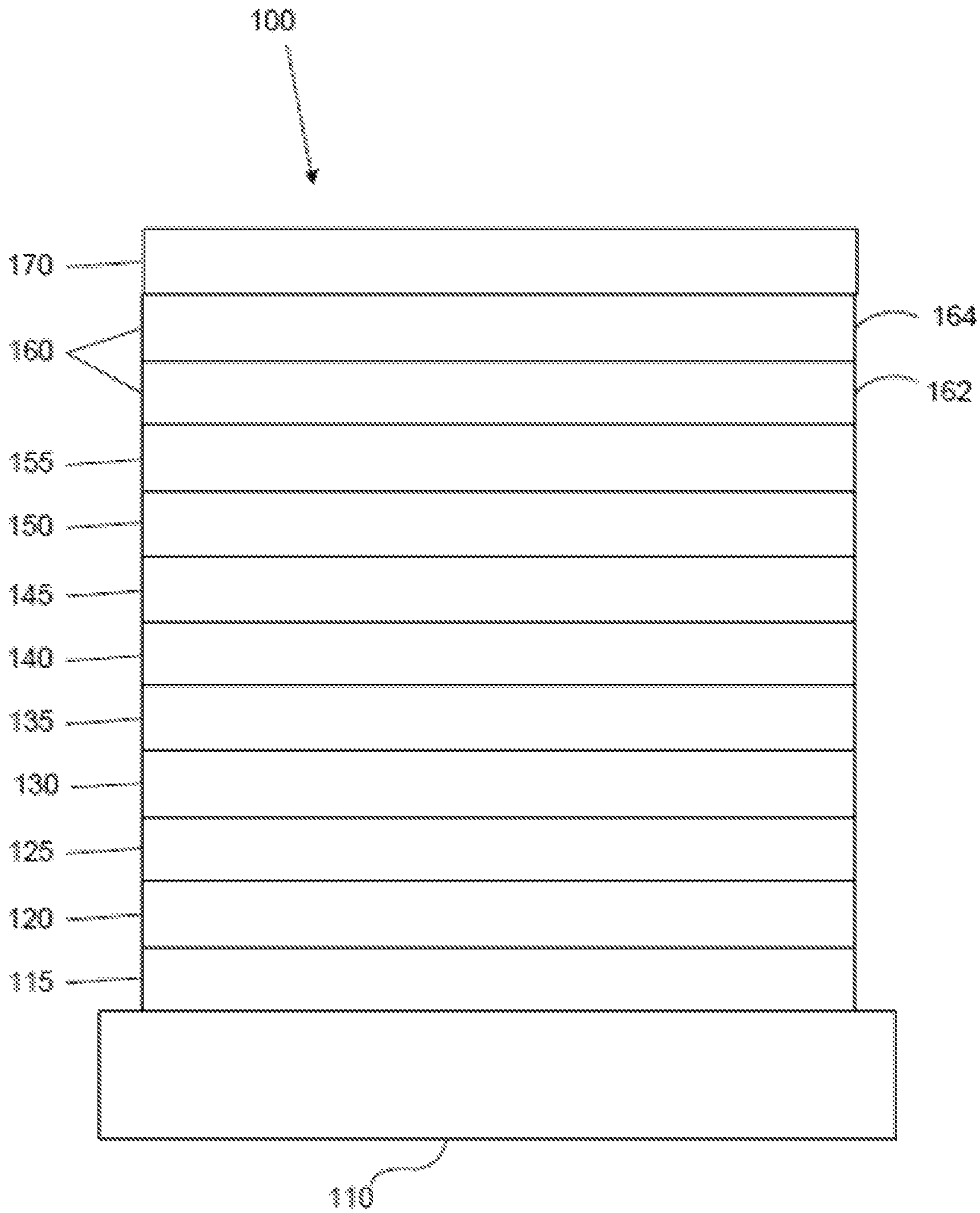
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
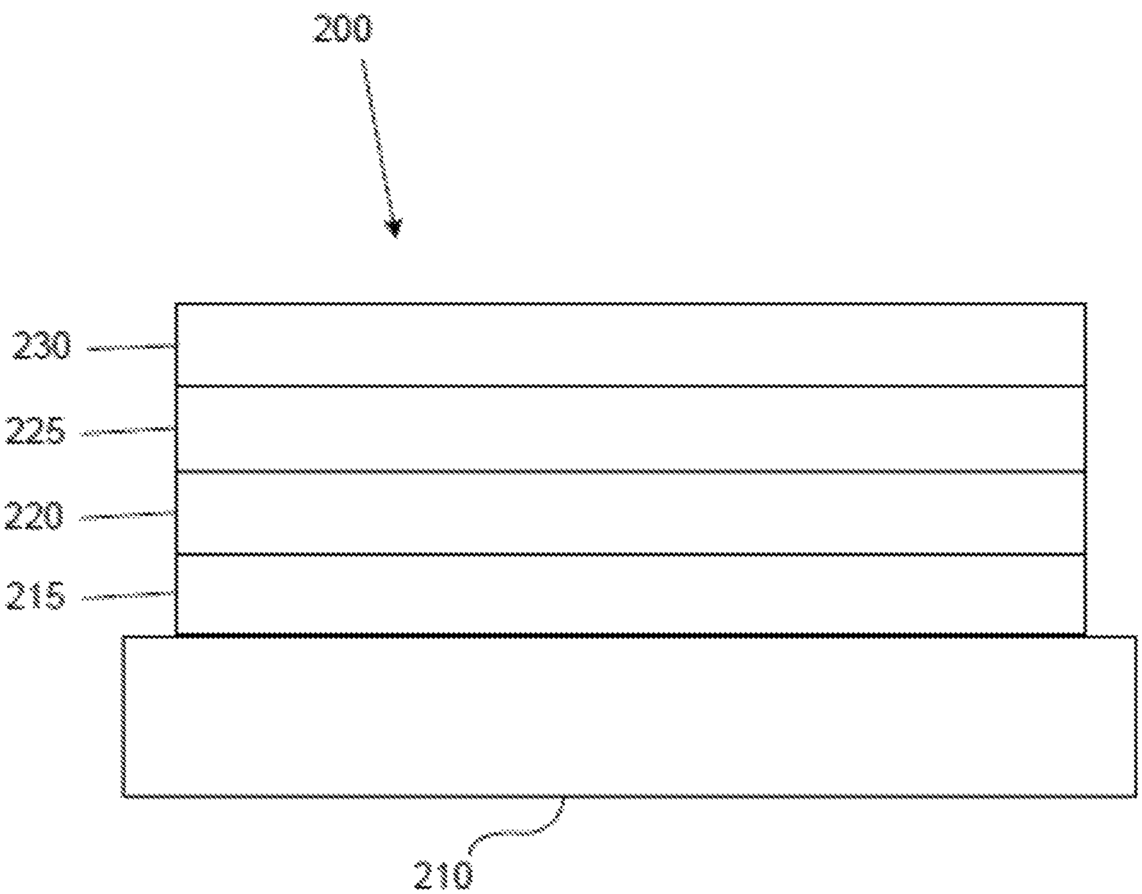
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions. The maximum number of substitutions possible in a structure (for example, a particular ring or fused ring system) will depend on the number of atoms with available valencies.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

A compound having the following formula

Formula I

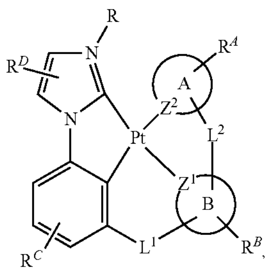

is disclosed. In Formula I, A and B are each independently a 5- or 6-membered aromatic ring; $Z^1$ and $Z^2$ are each independently selected from the group consisting of C and N; $L^1$ and $L^2$ are each independently selected from the group consisting of a direct bond, BR', NR', PR', O, S, Se, C═O, S═O, $SO_2$, CR'R", SiR'R", GeR'R", alkyl, cycloalkyl, and combinations thereof; $R^A$, $R^B$, $R^C$, and $R^D$, each represents mono to a maximum allowable substitutions, or no substitution; each of R', R", $R^A$, $R^B$, $R^C$, and $R^D$ is independently selected from the group consisting of hydrogen, deuterium, halide, alkyl, cycloalkyl, fluorinated alkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; R is selected from the group consisting of deuterium, alkyl, cycloalkyl, heteroalkyl, arylalkyl, silyl, aryl, heteroaryl, and combinations thereof; any substitutions in $R^A$, $R^B$, $R^C$, and $R^D$ may be joined or fused into a ring; $R^A$ or $R^B$ may be fused with $L^2$ to form a ring; wherein at least one of the following conditions (a), (b), and (c) is true:

(a) at least one of $R^A$ and $R^C$ is present and is a 5- or 6-membered aromatic ring attached to a carbon atom;

(b) $R^A$ is present and is an alkyl or cycloalkyl attached to a carbon atom, and each $R^C$ is independently H or aryl; and (c) both $R^A$ and $R^C$ are present and are an alkyl or cycloalkyl attached to a carbon atom, and R has a molecular weight equal to or greater than 16.0 grams per mole.

In some embodiments of the compound, each of R', R", $R^A$, $R^B$, $R^C$, and $R^D$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

In some embodiments, $R^A$ is a 6-membered aromatic ring. In some embodiments, $R^C$ is a 6-membered aromatic ring. In some embodiments, A is a pyridine ring.

In some embodiments of the compound, $R^A$ contains substituents selected from the group consisting of hydrogen, deuterium, methyl, alkyl, cycloalkyl, and fluorinated alkyl.

In some embodiments of the compound where $R^A$ is a 6-membered aromatic ring, $R^C$ contains substituents selected from the group consisting of hydrogen, deuterium, methyl, alkyl, cycloalkyl, and fluorinated alkyl.

In some embodiments of the compound, two adjacent $R^D$ substituents are joined to form a fused 6-membered aromatic ring. In some embodiments of the compound, L' is an oxygen atom. In some embodiments of the compound, $L^2$ is NAr; and Ar is a 6-membered aromatic group.

In some embodiments of the compound, R is a 6-membered aromatic ring. In some embodiments of the compound, R is an alkyl group. In some embodiments of the compound, at least one of $R^A$ and $R^C$ is a tert-butyl group.

In some embodiments of the compound, the compound is selected from the group consisting of:

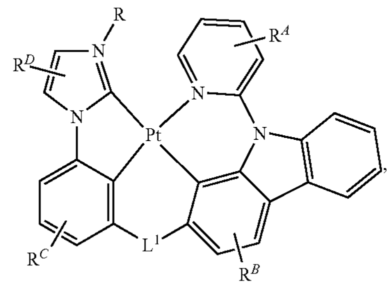

,

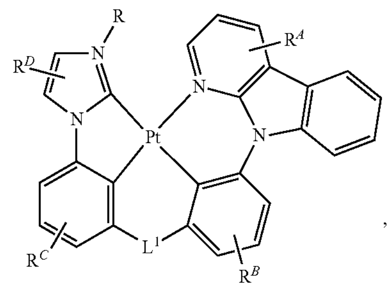

,

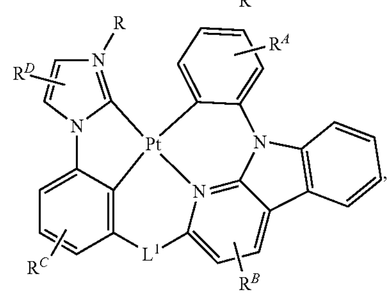

,

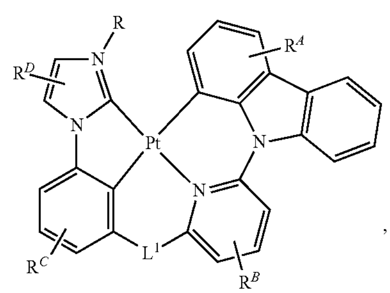

,

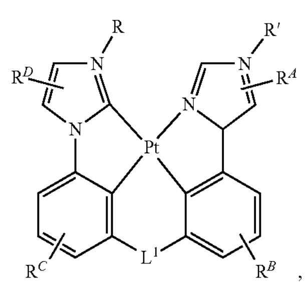

, and

-continued

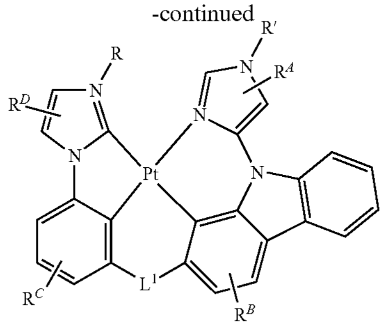

;

and wherein R' is selected from the group consisting of deuterium, alkyl, cycloalkyl, heteroalkyl, arylalkyl, silyl, aryl, heteroaryl, and combinations thereof.

In some embodiments of the compound, the compound is selected from the group consisting of Compound x having the formula $Pt(L_{Ay})(L_{Bz})$, wherein x is an integer defined by x=7320(z−1)+y, wherein y is an integer from 1 to 7320 and z is an integer from 1 to 17795, wherein $L_{Ay}$ has the following structures:

| $L_{Ay}$ | Structure of $L_{Ay}$ | $Ar^1$, $R^1$ | y |
|---|---|---|---|
| wherein $L_{A1}$ to $L_{A900}$ have the structure | 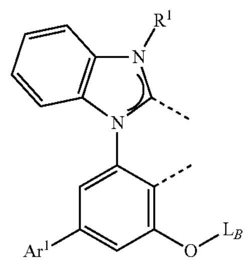 | wherein $Ar^1$ = Ai and $R^1$ = Rk, wherein i is an integer from 1 to 30 and k is an integer from 1 to 30, and | y = 30(i − 1) + k |
| wherein $L_{A901}$-$L_{A1800}$ have the structure | 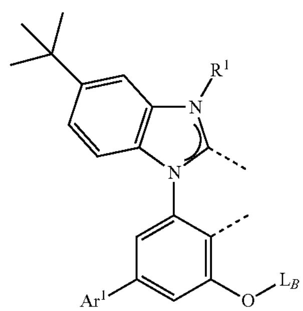 | wherein $Ar^1$ = Ai and $R^1$ = Rk, wherein i is an integer from 1 to 30 and k is an integer from 1 to 30, and | y = 30(i − 1) + k + 900 |
| wherein $L_{A1801}$-$L_{A2700}$ have the structure | 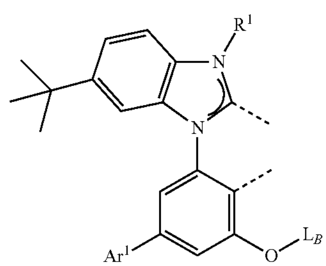 | wherein $Ar^1$ = Ai and $R^1$ = Rk, wherein i is an integer from 1 to 30 and k is an integer from 1 to 30, and | y = 30(i − 1) + k + 1800 |
| wherein $L_{A2701}$-$L_{A3600}$ have the structure | 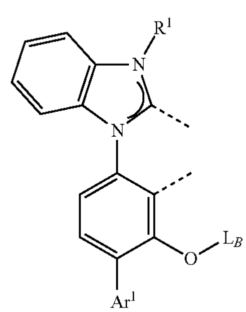 | wherein $Ar^1$ = Ai and $R^1$ = Rk, wherein i is an integer from 1 to 30 and k is an integer from 1 to 30, and | y = 30(i − 1) + k + 2700 |

-continued

| $L_{Ay}$ | Structure of $L_{Ay}$ | $Ar^1$, $R^1$ | y |
|---|---|---|---|
| wherein $L_{A3601}$-$L_{A4500}$ have the structure | 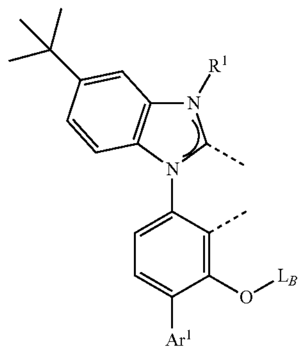 | wherein $Ar^1$ = Ai and $R^1$ = Rk, wherein i is an integer from 1 to 30 and k is an integer from 1 to 30, and | y = 30(i − 1) + k + 3600 |
| wherein $L_{A4501}$-$L_{A5400}$ have the structure | 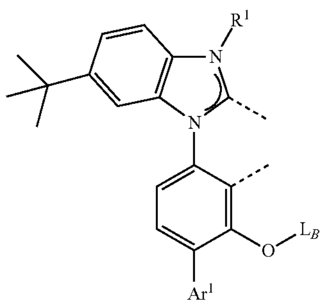 | wherein $Ar^1$ = Ai and $R^1$ = Rk, wherein i is an integer from 1 to 30 and k is an integer from 1 to 30, and | y = 30(i − 1) + k + 4500 |
| wherein $L_{A5401}$-$L_{A6300}$ have the structure | 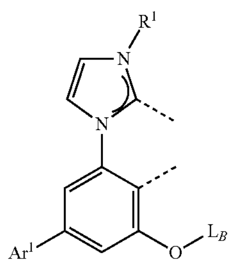 | wherein $Ar^1$ = Ai and $R^1$ = Rk, wherein i is an integer from 1 to 30 and k is an integer from 1 to 30, and | y = 30(i − 1) + k + 5400 |
| wherein $L_{A6301}$-$L_{A7200}$ have the structure | 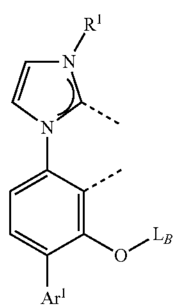 | wherein $Ar^1$ = Ai and $R^1$ = Rk, wherein i is an integer from 1 to 30 and k is an integer from 1 to 30, and | y = 30(i − 1) + k + 6300 |
| wherein $L_{A7200}$ to $L_{A7230}$ have the structure | 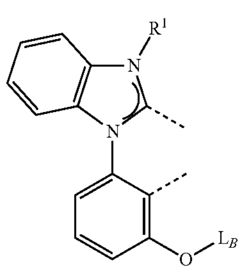 | wherein $R^1$ = Rk, wherein k is an integer from 1 to 30, and | y = k + 7200 |

-continued

| $L_{Ay}$ | Structure of $L_{Ay}$ | $Ar^1$, $R^1$ | y |
|---|---|---|---|
| wherein $L_{A7231}$-$L_{A7260}$ have the structure | 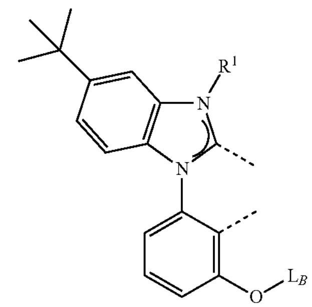 | wherein $R^1$ = Rk, wherein k is an integer from 1 to 30, and | y = k + 7230 |
| wherein $L_{A7261}$-$L_{A7290}$ have the structure | 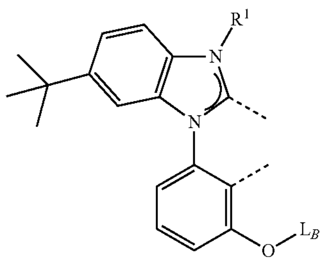 | wherein $R^1$ = Rk, wherein k is an integer from 1 to 30, and | y = k + 7260 |
| wherein $L_{A7291}$-$L_{A7320}$ have the structure | 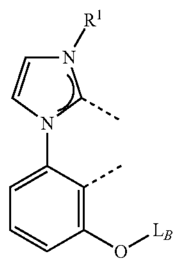 | wherein $R^1$ = Rk, wherein k is an integer from 1 to 30, and | y = k + 7290, |

in one embodiment, when k=1 in the formulas for $L_{Ay}$ listed above, i is an integer from 1 to 10, or j is an integer from 1 to 10, wherein $L_{Bz}$ has the following structures:

| $L_{Bz}$ | $L_{Bz}$ structure | $Ar^2$, $Ar^3$, $R^2$ | z |
|---|---|---|---|
| wherein $L_{B1}$-$L_{B30}$ have the structure | 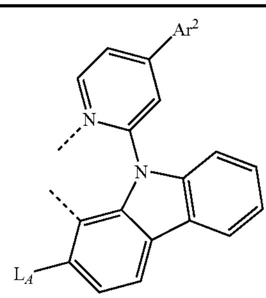 | wherein $Ar^2$ = Aj, wherein j is an integer from 1 to 30, and | z = j |
| wherein $L_{B31}$ have the structure | 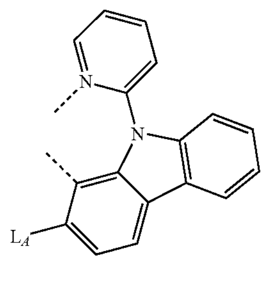 | | z = 31 |

-continued

| $L_{Bz}$ | $L_{Bz}$ structure | $Ar^2$, $Ar^3$, $R^2$ | z |
|---|---|---|---|
| wherein $L_{B32}$-$L_{B931}$ have the structure | 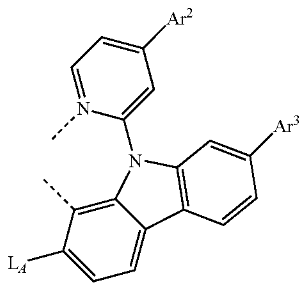 | wherein $Ar^2$ = Aj and $Ar^3$ = Am, wherein j is an integer from 1 to 30 and m is an integer from 1 to 30, and | z = 30(j − 1) + m + 31 |
| wherein $L_{B932}$-$L_{B961}$ have the structure | 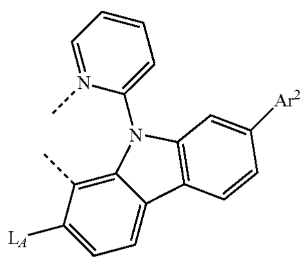 | wherein $Ar^2$ = Aj, wherein j is an integer from 1 to 30, and | z = j + 931 |
| wherein $L_{B962}$-$L_{B1861}$ have the structure | 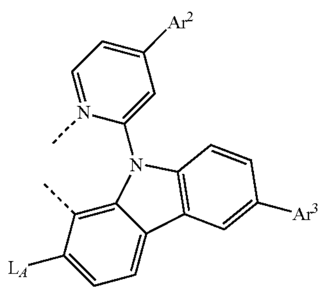 | wherein $Ar^2$ = Aj and $Ar^3$ = Am, wherein j is an integer from 1 to 30 and m is an integer from 1 to 30, and | z = 30(j − 1) + m + 961 |
| wherein $L_{B1862}$-$L_{B1891}$ have the structure | 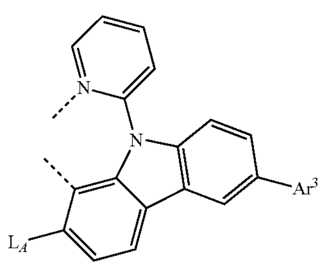 | wherein $Ar^2$ = Aj, wherein j is an integer from 1 to 30, and | z = j + 1861 |
| wherein $L_{B1892}$-$L_{B1921}$ have the strucutre | 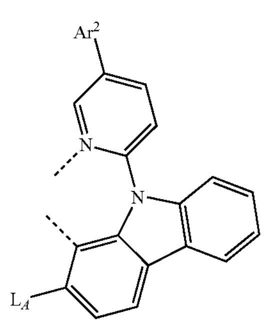 | wherein $Ar^2$ = Aj, wherein j is an integer from 1 to 30, and | z = j + 1891 |

-continued

| $L_{Bz}$ | $L_{Bz}$ structure | $Ar^2$, $Ar^3$, $R^2$ | z |
|---|---|---|---|
| wherein $L_{B1922}$-$L_{B2821}$ have the structure | 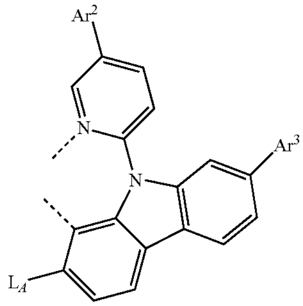 | wherein $Ar^2$ = Aj and $Ar^3$ = Am, wherein j is an integer from 1 to 30 and m is an integer from 1 to 30, and | z = 30(j − 1) + m + 1921 |
| wherein $L_{B2822}$-$L_{B3721}$ have the structure | 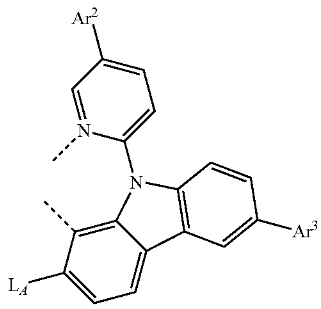 | wherein $Ar^2$ = Aj and $Ar^3$ = Am, wherein j is an integer from 1 to 30 and m is an integer from 1 to 30, and | z = 30(j − 1) + m + 2821 |
| wherein $L_{B3722}$-$L_{B4621}$ have the structure | 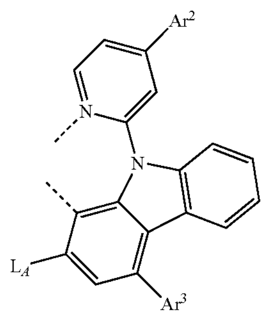 | wherein $Ar^2$ = Aj and $Ar^3$ = Am, wherein j is an integer from 1 to 30 and m is an integer from 1 to 30, and | z = 30(j − 1) + m + 3721 |
| wherein $B_{B4622}$-$L_{B4641}$ have the structure | 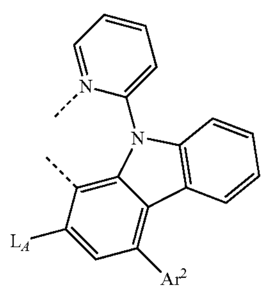 | wherein $Ar^2$ = Aj, wherein j is an integer from 1 to 30, and | z = j + 4621 |
| wherein $L_{B4652}$-$L_{B5551}$ have the structure | 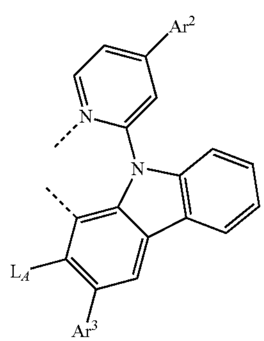 | wherein $Ar^2$ = Aj and $Ar^3$ = Am, wherein j is an integer from 1 to 30 and m is an integer from 1 to 30, and | z = 30(j − 1) + m + 4651 |

-continued

| $L_{Bz}$ | $L_{Bz}$ structure | $Ar^2$, $Ar^3$, $R^2$ | z |
|---|---|---|---|
| wherein $L_{B5552}$-$L_{B5581}$ have the structure | 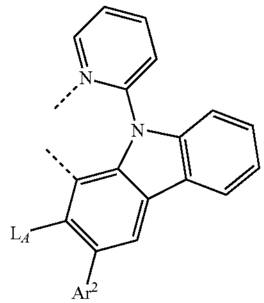 | wherein $Ar^2$ = Aj, wherein j is an integer from 1 to 30, and | z = J + 5551 |
| wherein $L_{B5582}$-$L_{B6481}$ have the structure | 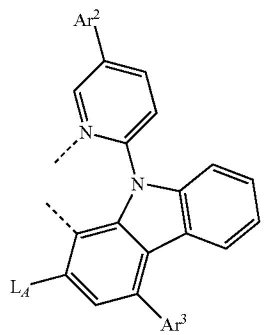 | wherein $Ar^2$ = Aj and $Ar^3$ = Am, wherein j is an integer from 1 to 30 and m is an integer from 1 to 30, and | z = 30(j − 1) + m + 5581 |
| wherein $L_{B6482}$-$L_{B7381}$ have the structure | 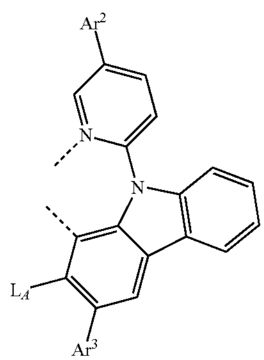 | wherein $Ar^2$ = Aj and $Ar^3$ = Am, wherein j is an integer from 1 to 30 and m is an integer from 1 to 30, and | z = 30(j − 1) + m + 6481 |
| wherein $L_{B7382}$ have the structure | 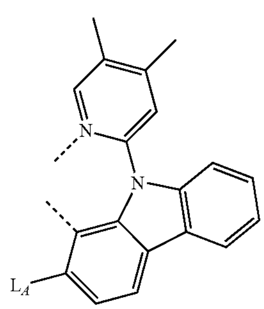 | | z = 7382 |
| wherein $L_{B7383}$-$L_{B7412}$ have the structure | 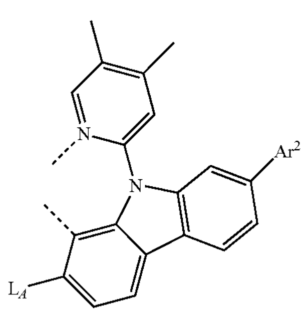 | wherein $Ar^2$ = Aj, wherein j is an integer from 1 to 30, and | z = j + 7382 |

-continued

| $L_{Bz}$ | $L_{Bz}$ structure | $Ar^2$, $Ar^3$, $R^2$ | z |
|---|---|---|---|
| wherein $L_{B7413}$-$L_{B7442}$ have the structure | 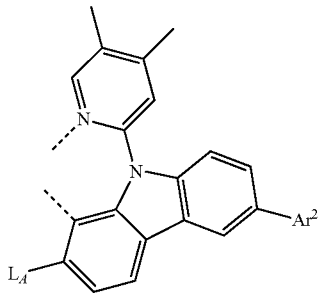 | wherein $Ar^2$ = Aj, wherein j is an integer from 1 to 30, and | z = J + 7412 |
| wherein $L_{B7443}$-$L_{B7472}$ have the structure | 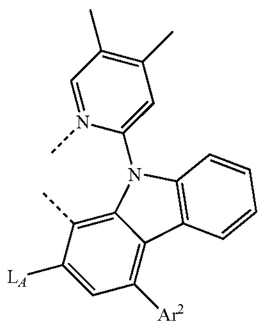 | wherein $Ar^2$ = Aj, wherein j is an integer from 1 to 30, and | z = j + 7442 |
| wherein $L_{B7473}$-$L_{B7502}$ have the structure | 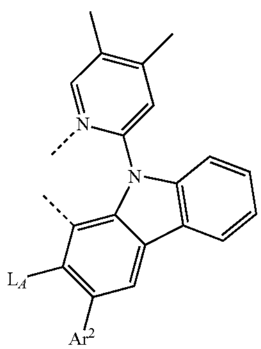 | wherein $Ar^2$ = Aj, wherein j is an integer from 1 to 30, and | z = j + 7472 |
| wherein $L_{B7503}$ have the structure | 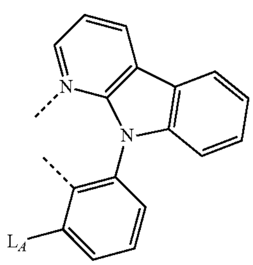 | | z = 7503 |
| wherein $L_{B7504}$-$L_{B7533}$ have the structure | 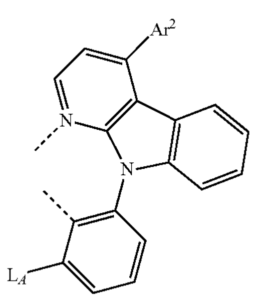 | wherein $Ar^2$ = Aj, wherein j is an integer from 1 to 30, and | z = j + 7503 |

-continued

| $L_{Bz}$ | $L_{Bz}$ structure | $Ar^2$, $Ar^3$, $R^2$ | z |
|---|---|---|---|
| wherein $L_{B7534}$-$L_{B8433}$ have the structure | 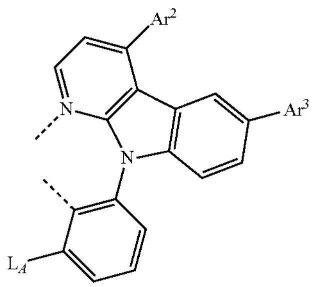 | wherein $Ar^2$ = Aj and $Ar^3$ = Am, wherein j is an integer from 1 to 30 and m is an integer from 1 to 30, and | z = 30(j − 1) + m + 7533 |
| wherein $L_{B8434}$-$L_{B8463}$ have the structure | 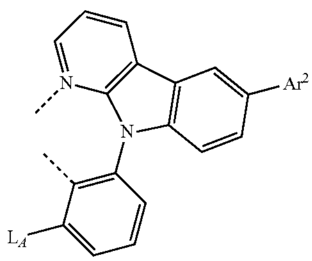 | wherein $Ar^2$ = Aj, wherein j is an integer from 1 to 30, and | z = j + 8433 |
| wherein $L_{B8464}$-$L_{B9363}$ have the structure | 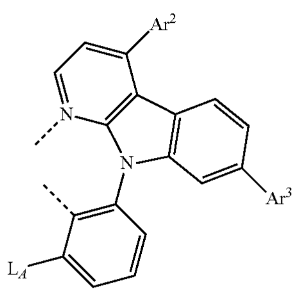 | wherein $Ar^2$ = Aj and $Ar^3$ = Am, wherein j is an integer from 1 to 30 and m is an integer from 1 to 30, and | z = 30(j − 1) + m + 8463 |
| wherein $L_{B9364}$-$L_{B9393}$ have the structure | 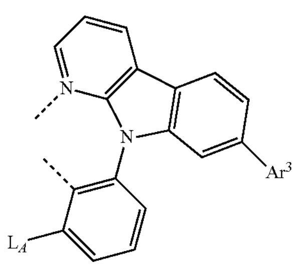 | wherein $Ar^2$ = Aj, wherein j is an integer from 1 to 30, and | z = j + 9363 |
| wherein $L_{B9394}$-$L_{B9423}$ have the structure | 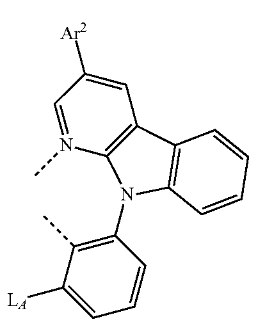 | wherein $Ar^2$ = Aj, wherein j is an integer from 1 to 30, and | z = J + 9393 |

-continued

| $L_{Bz}$ | $L_{Bz}$ structure | $Ar^2$, $Ar^3$, $R^2$ | z |
|---|---|---|---|
| wherein $L_{B9424}$-$L_{B10323}$ have the structure | 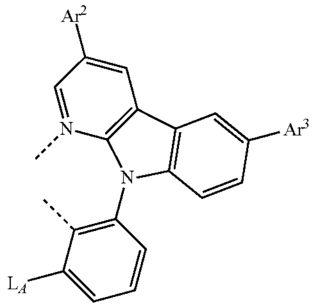 | wherein $Ar^2$ = Aj and $Ar^3$ = Am, wherein j is an integer from 1 to 30 and m is an integer from 1 to 30, and | z = 30(j − 1) + m + 9423 |
| wherein $L_{B10324}$-$L_{B11223}$ have the structure | 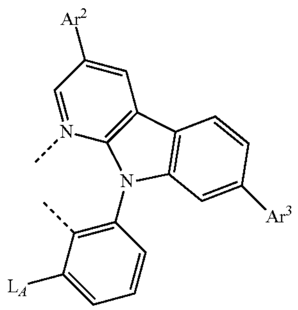 | wherein $Ar^2$ = Aj and $Ar^3$ = Am, wherein j is an integer from 1 to 30 and m is an integer from 1 to 30, and | z = 30(j − 1) + m + 10323 |
| wherein $L_{B11224}$-$L_{B11253}$ have the structure | 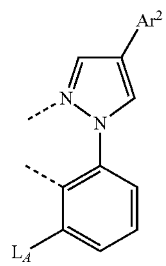 | wherein $Ar^2$ = Aj, wherein j is an integer from 1 to 30, and | z = j + 11223 |
| wherein $L_{B11254}$ have the structure | 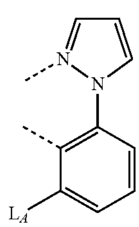 | | z = 11254 |
| wherein $L_{B11255}$-$L_{B11284}$ have the structure | 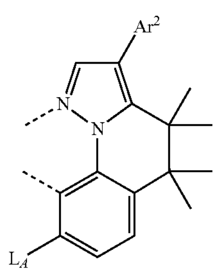 | wherein $Ar^2$ = Aj, wherein j is an integer from 1 to 30, and | z = j + 11254 |
| wherein $L_{B11285}$ have the structure | 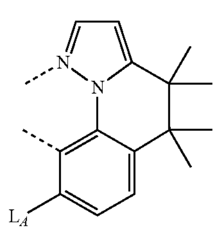 | | z = 11285 |

-continued

| $L_{Bz}$ | $L_{Bz}$ structure | $Ar^2$, $Ar^3$, $R^2$ | z |
|---|---|---|---|
| wherein $L_{B11286}$-$L_{B12185}$ have the structure | 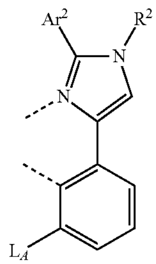 | wherein $Ar^2$ = Aj and $R^2$ = Rl, wherein j is an integer from 1 to 30 and l is an integer from 1 to 30, and | z = 30(j − 1) + l + 11285 |
| wherein $L_{B12186}$-$L_{B12215}$ have the structure | 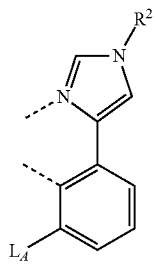 | wherein $R^2$ = Rl, wherein l is an integer from 1 to 30, and | z = l + 12185 |
| wherein $L_{B12216}$-$L_{B13115}$ have the structure | 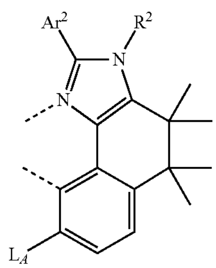 | wherein $Ar^2$ = Aj and $R^2$ = Rl, wherein j is an integer from 1 to 30 and l is an integer from 1 to 30, and | z = 30(J − 1) + l + 12215 |
| wherein $L_{B13116}$-$L_{B13145}$ have the structure | 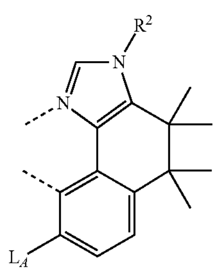 | wherein $R^2$ = Rl, wherein l is an integer from 1 to 30, and | z = l + 13115 |
| wherein $L_{B13146}$-$L_{B14045}$ have the structure | 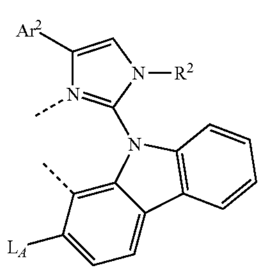 | wherein $Ar^2$ = Aj and $R^2$ = Rl, wherein j is an integer from 1 to 30 and l is an integer from 1 to 30, and | z = 30(j − 1) + l + 13145 |

-continued

| $L_{Bz}$ | $L_{Bz}$ structure | $Ar^2$, $Ar^3$, $R^2$ | z |
|---|---|---|---|
| wherein $L_{B14046}$-$L_{B14075}$ have the structure | 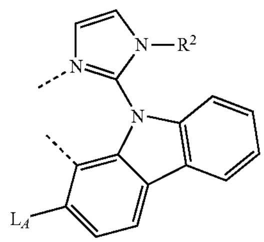 | wherein $R^2$ = Rl, wherein l is an integer from 1 to 30, and | z = l + 14045 |
| wherein $L_{B14076}$-$L_{B14975}$ have the structure | 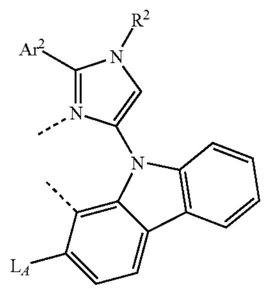 | wherein $Ar^2$ = Aj and $R^2$ = Rl, wherein j is an integer from 1 to 30 and l is an integer from 1 to 30, and | z = 30(j − 1) + l + 14075 |
| wherein $L_{B14976}$-$L_{B15005}$ have the structure | 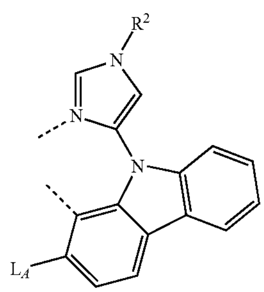 | wherein $R^2$ = Rl, wherein l is an integer from 1 to 30, and | z = l + 14975 |
| wherein $L_{B15006}$-$L_{B15905}$ have the structure | 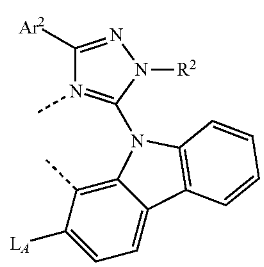 | wherein $Ar^2$ = Aj and $R^2$ = Rl, wherein j is an integer from 1 to 30 and l is an integer from 1 to 30, and | z = 30(j − 1) + l + 15005 |
| wherein $L_{B15906}$-$L_{B15935}$ have the structure | 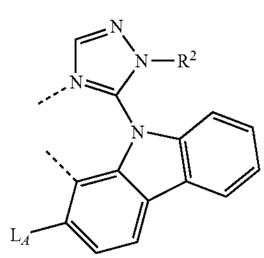 | wherein $R^2$ = Rl, where l is an integer from 1 to 30, and | z = l + 15905 |

-continued

| $L_{Bz}$ | $L_{Bz}$ structure | $Ar^2$, $Ar^3$, $R^2$ | z |
|---|---|---|---|
| wherein $L_{B15936}$-$L_{B16835}$ have the structure | 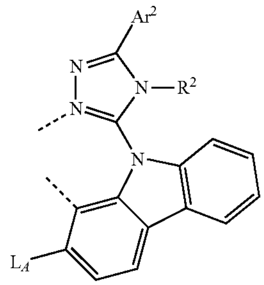 | wherein $Ar^2$ = Aj and $R^2$ = Rl, wherein j is an integer from 1 to 30 and l is an integer from 1 to 30, and | z = 30(j − 1) + l + 15935 |
| wherein $L_{B16836}$-$L_{B16865}$ have the structure | 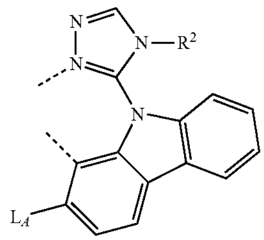 | wherein $R^2$ = Rl, wherein l is an integer from 1 to 30, and | z = l + 16835 |
| wherein $L_{B16866}$-$L_{B17765}$ have the structure | 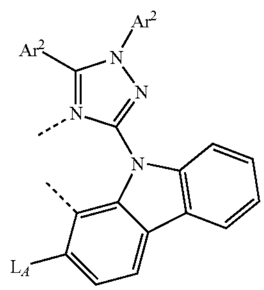 | wherein $Ar^2$ = Aj and $R^2$ = Rl, wherein j is an integer from 1 to 30 and l is an integer from 1 to 30, and | z = 30(j − 1) + l + 16865 |
| wherein $L_{B17766}$-$L_{B17795}$ have the structure | 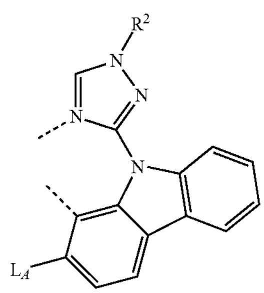 | wherein $R^2$ = R1, wherein l is an integer from 1 to 30, and | z = l + 17765, |

wherein A1 to A30 have the following structures:

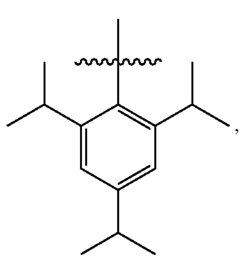

A1

-continued

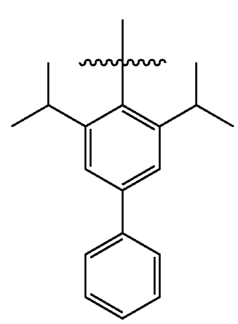

A2

-continued
A3
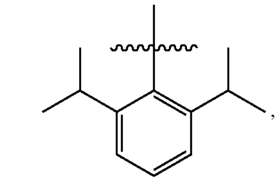
A4
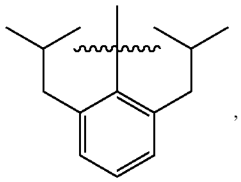
A5
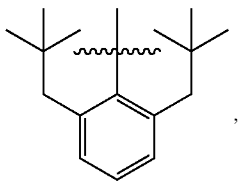
A6
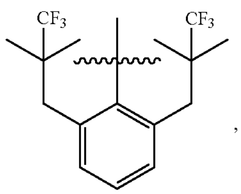
A7
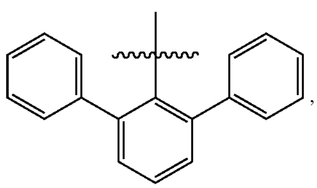
A8
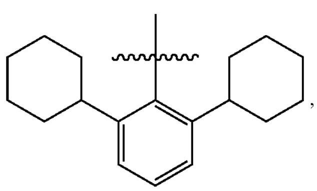
A9
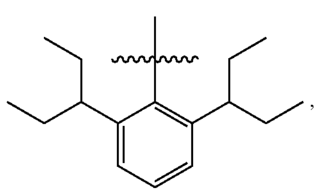
A10
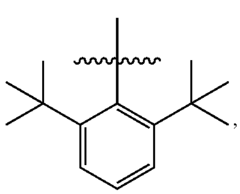
A11
Me,
A12
iPr,
-continued
A13
tBu,
A14
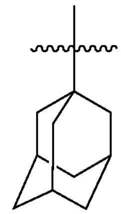
A15
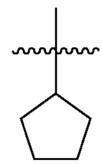
A16
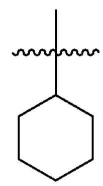
A17
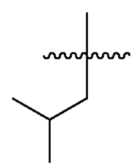
A18
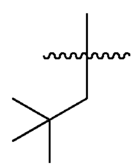
A19
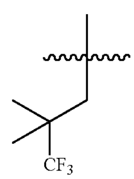
A20
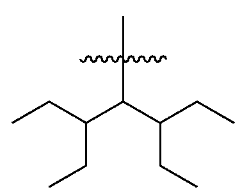
A21
$CD_3$,
A22
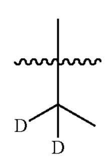

-continued
A23
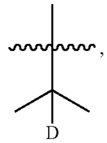
A24
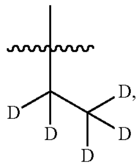
A25
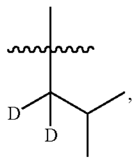
A26
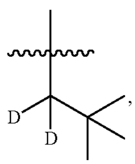
A27
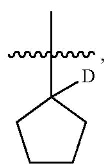
A28
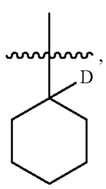
A29
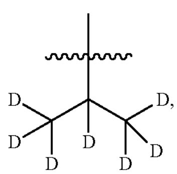
A30
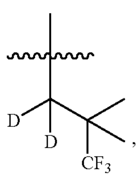
and wherein R1 to R30 have the following structures:
R1
Me,
R2
iPr,
-continued
R3
tBu,
R4
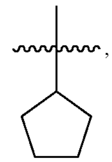
R5
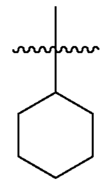
R6
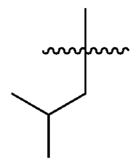
R7
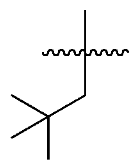
R8
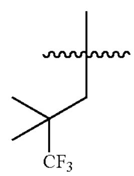
R9
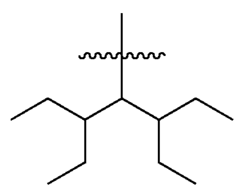
R10
$CD_3$,
R11
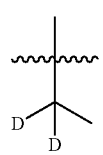
R12
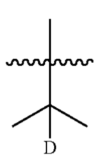

-continued
R13
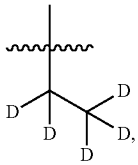
R14
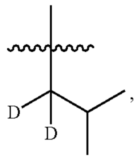
R15
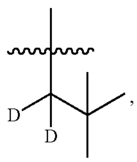
R16
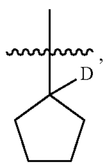
R17
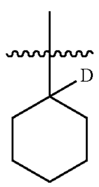
R18
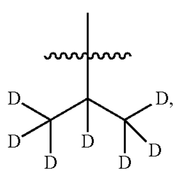
R19
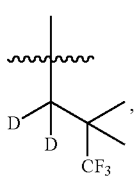
R20
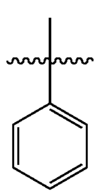
-continued
R21
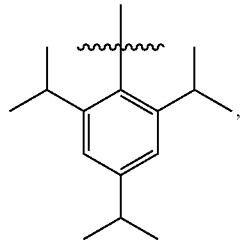
R22
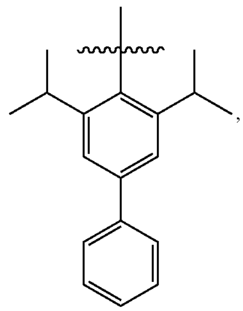
R23
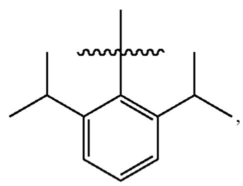
R24
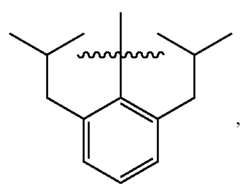
R25
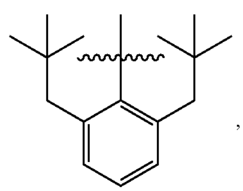
R26
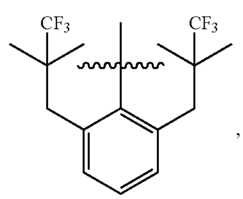
R27
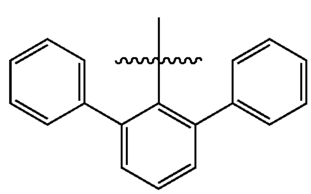

-continued

R28

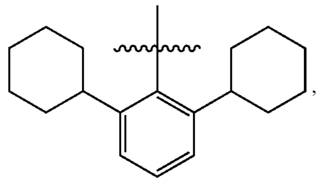

R29

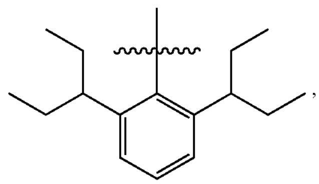

R30

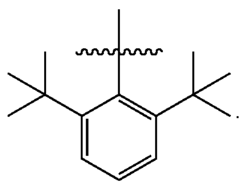

An organic light emitting device (OLED) is also disclosed. The OLED comprises: an anode; a cathode; and an organic layer, disposed between the anode and the cathode, comprising a compound having the formula:

Formula I

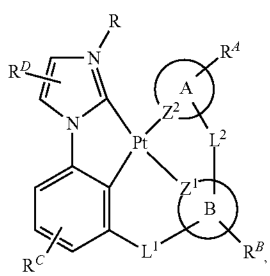

wherein Formula I is defined as provided above.

In some embodiments of the OLED, each of R', R'', $R^A$, $R^B$, $R^C$, and $R^D$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

A consumer product comprising the OLED is also disclosed, wherein the organic layer in the OLED comprises the compound having the Formula I.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is also disclosed. The emissive region comprises a compound having the formula:

Formula I

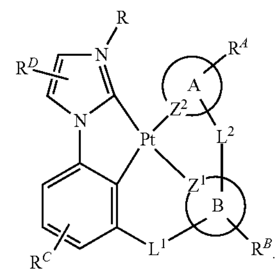

In Formula I, A and B are each independently a 5- or 6-membered aromatic ring; $Z^1$ and $Z^2$ are each independently selected from the group consisting of C and N; $L^1$ and $L^2$ are each independently selected from the group consisting of a direct bond, BR', NR', PR', O, S, Se, C═O, S═O, $SO_2$, CR'R'', SiR'R'', GeR'R'', alkyl, cycloalkyl, and combinations thereof; $R^A$, $R^B$, $R^C$, and $R^D$, each represents mono to a maximum allowable substitutions, or no substitution; each of R', R'', $R^A$, $R^B$, $R^C$, and $R^D$ is independently selected from the group consisting of hydrogen, deuterium, halide, alkyl, cycloalkyl, fluorinated alkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; R is selected from the group consisting of deuterium, alkyl, cycloalkyl, heteroalkyl, arylalkyl, silyl, aryl, heteroaryl, and combinations thereof; any substitutions in $R^A$, $R^B$, $R^C$, and $R^D$ may be joined or fused into a ring; $R^A$ or $R^B$ may be fused with $L^2$ to form a ring;

wherein at least one of the following conditions (a), (b), and (c) is true:

(a) at least one of $R^A$ and $R^C$ is present and is a 5- or 6-membered aromatic ring attached to a carbon atom;

(b) $R^A$ is present and is an alkyl or cycloalkyl attached to a carbon atom, and each $R^C$ is independently H or aryl; and (c) both $R^A$ and $R^C$ are present and are an alkyl or cycloalkyl attached to a carbon atom, and R has a molecular weight equal to or greater than 16.0 grams per mole.

In some embodiments of the emissive region, each of R', R'', $R^A$, $R^B$, $R^C$, and $R^D$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

In some embodiments of the emissive region, the compound is an emissive dopant or a non-emissive dopant.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiments of the emissive region, the emissive region further comprises a host, wherein the host is selected from the group consisting of:
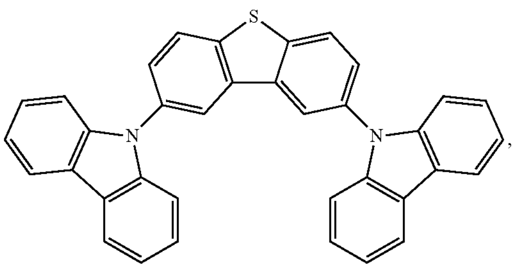
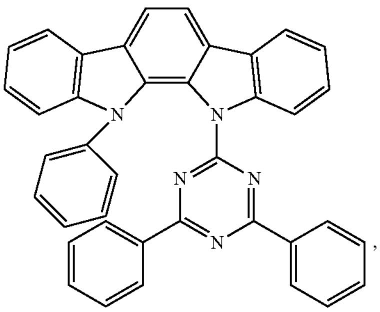
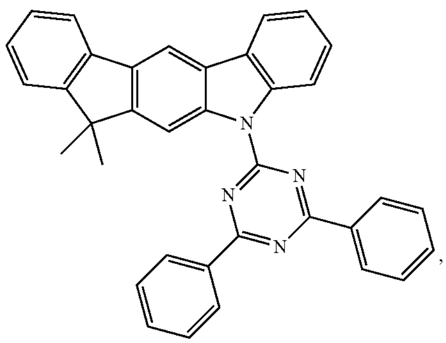
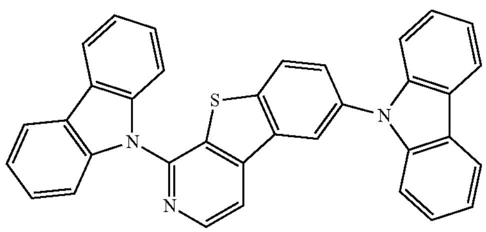
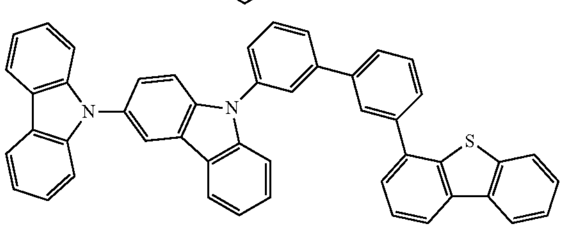
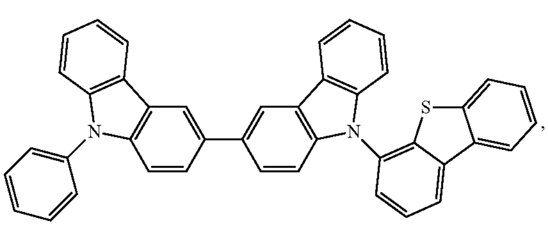
-continued
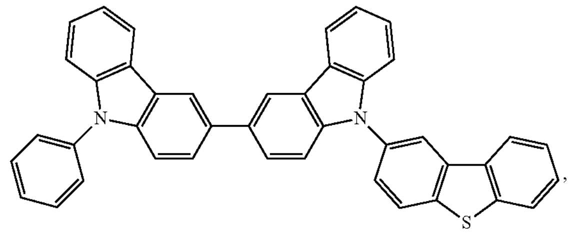
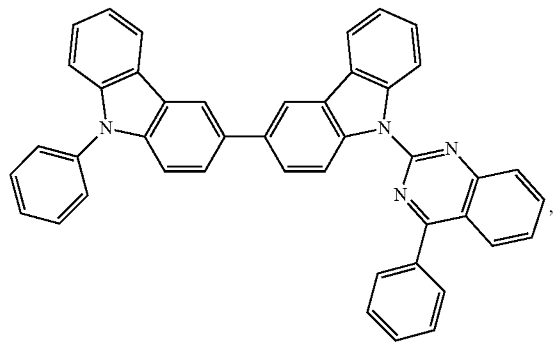
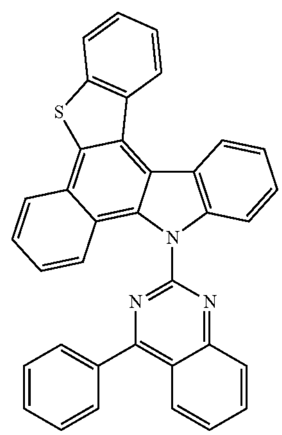
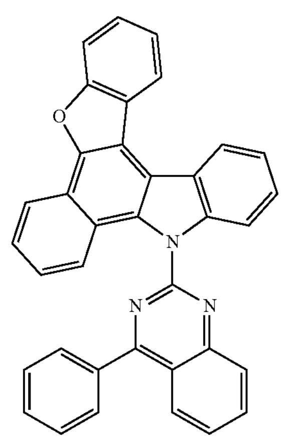

-continued
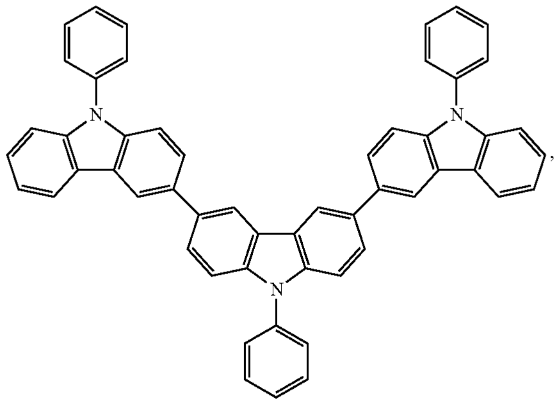
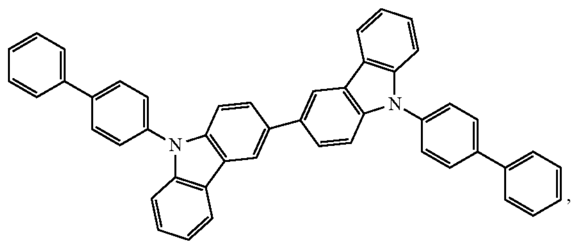
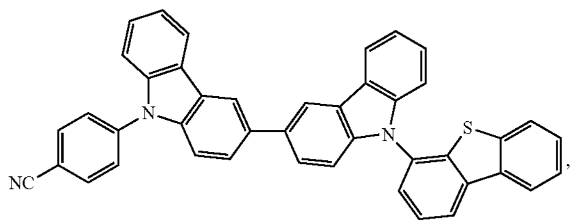
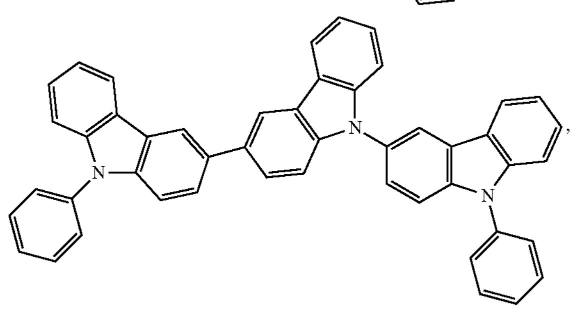
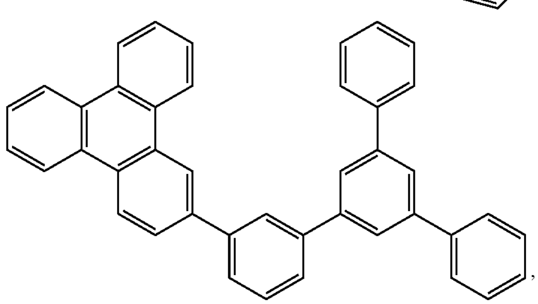
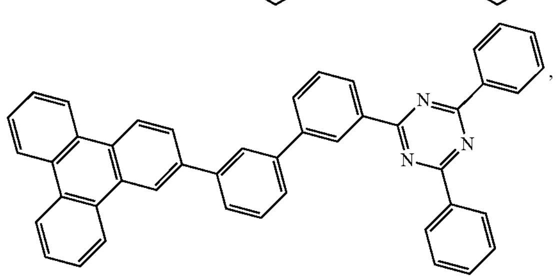
-continued
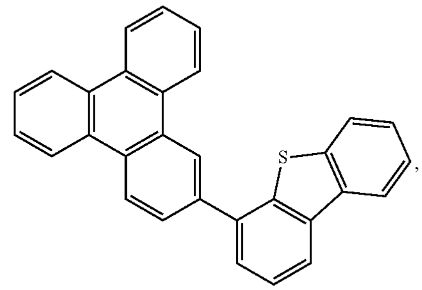
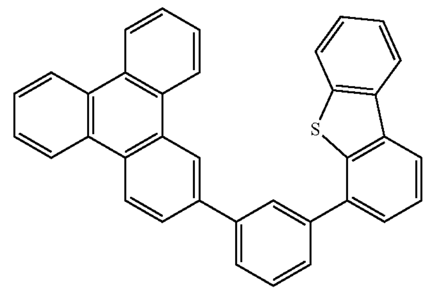
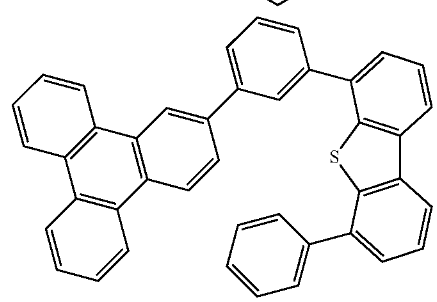
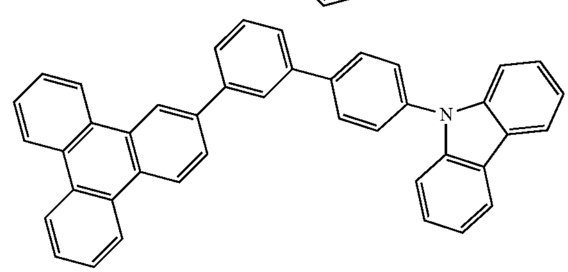
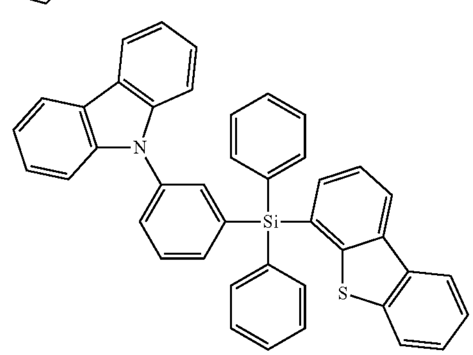
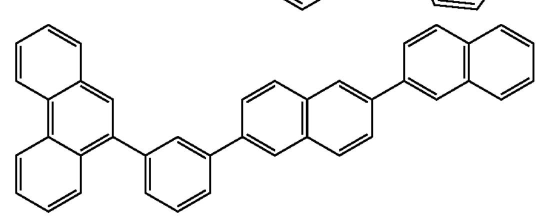
and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2+1}$, $OAr_1$, $N(C_nH_{2n+1})_2$, $N(Ar_1)(Ar_2)$, CH=CH—$C_nH_{2n+1}$, C≡C—$C_nH_{2n+1}$, $Ar_1$, $Ar_1$-$Ar_2$, and $C_nH_n$—$Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

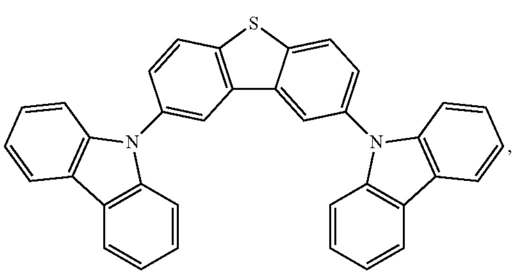

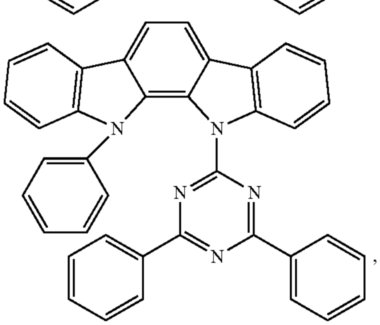

-continued

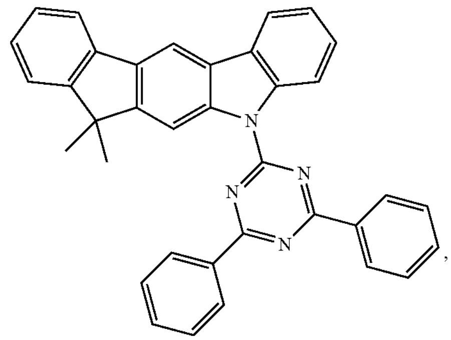

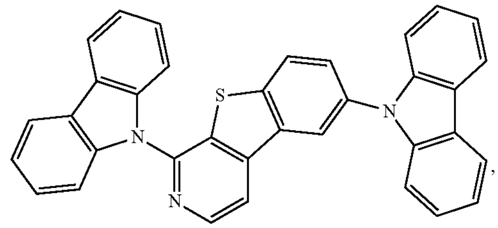

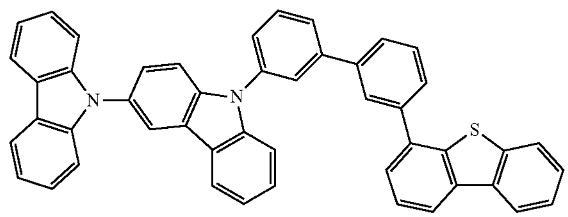

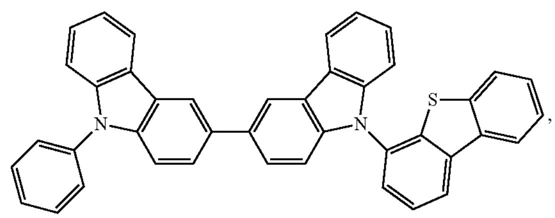

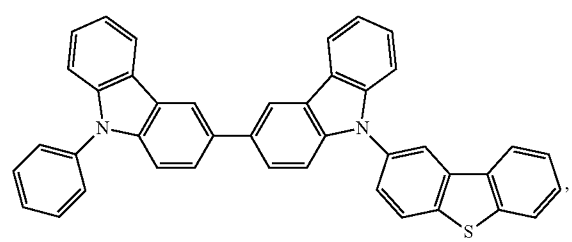

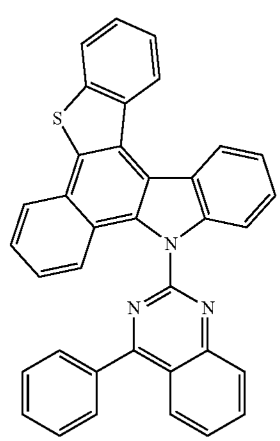

-continued
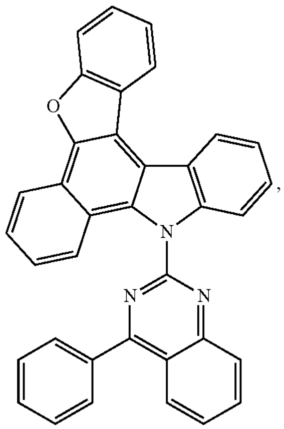
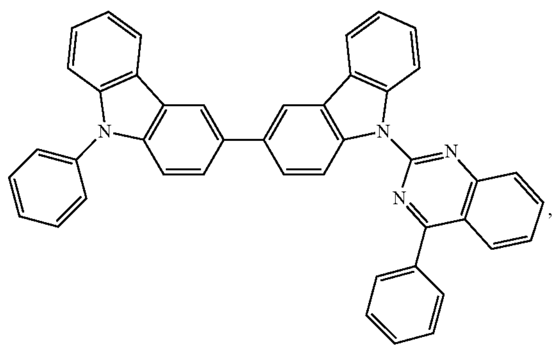
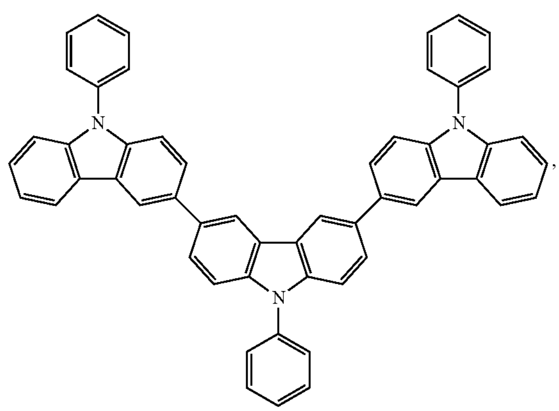
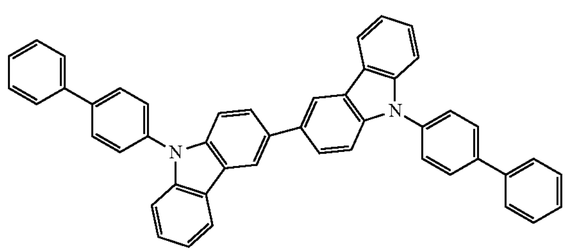
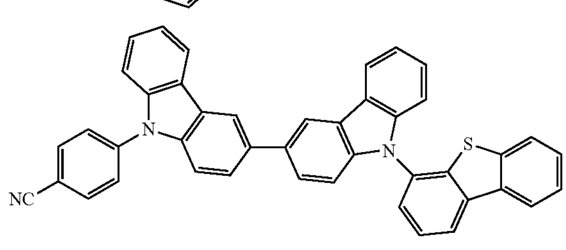
-continued
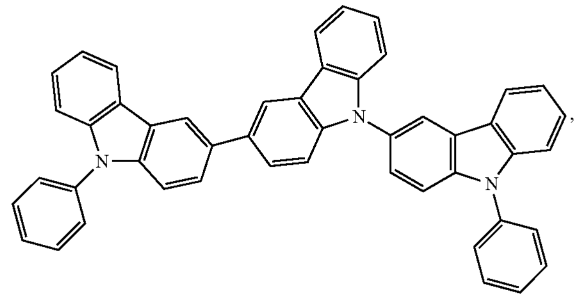
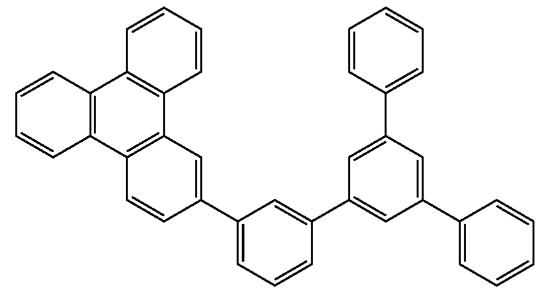
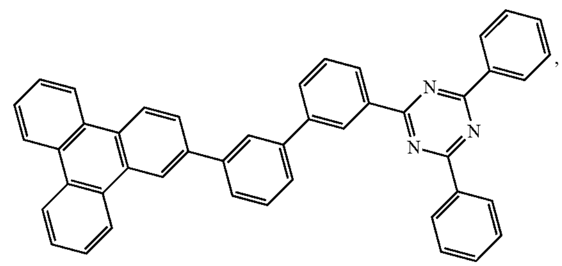
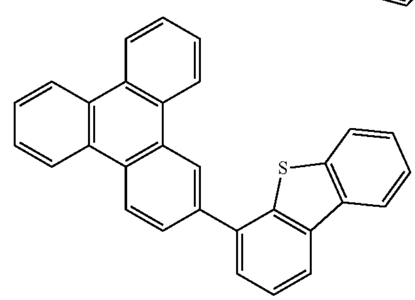
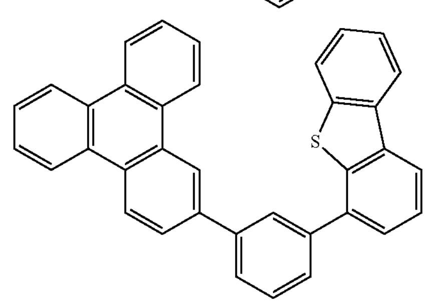
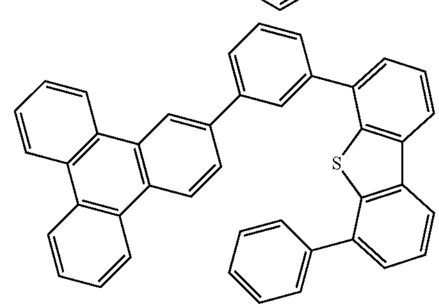

-continued

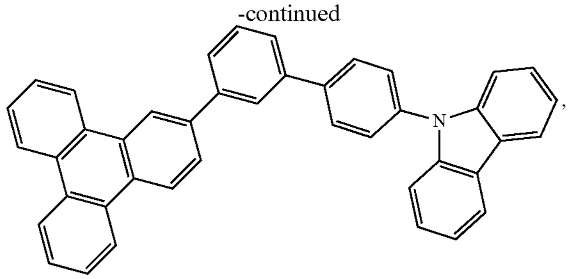

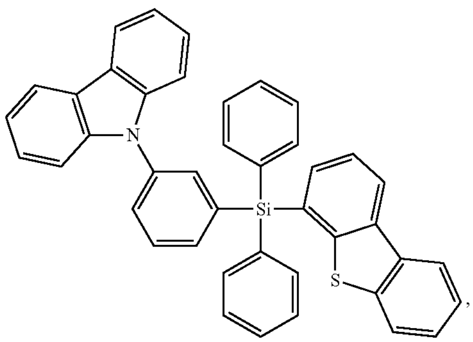

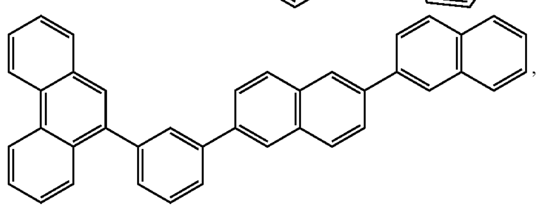

and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

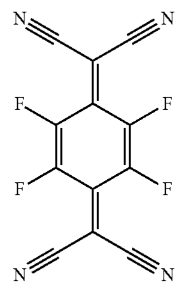

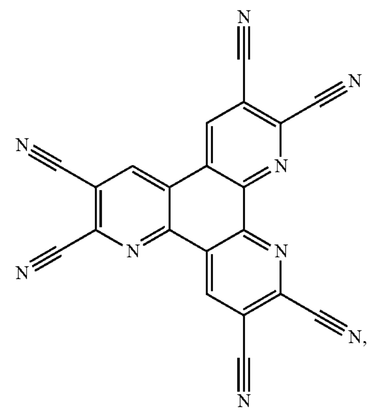

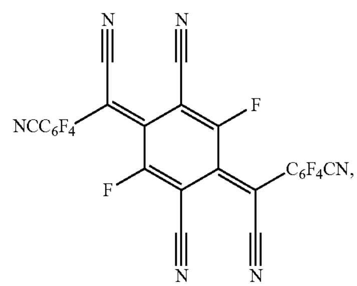

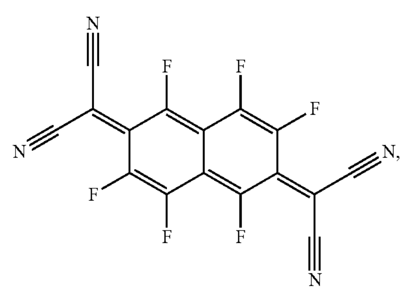

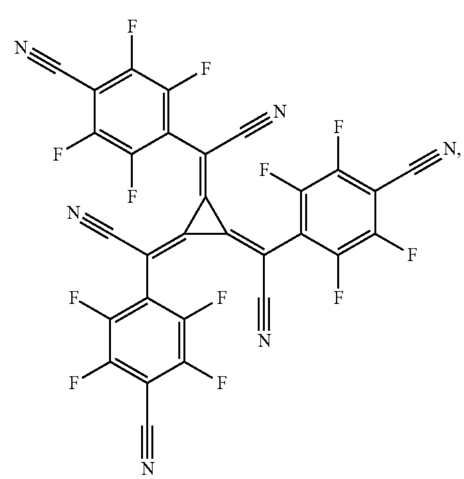

-continued

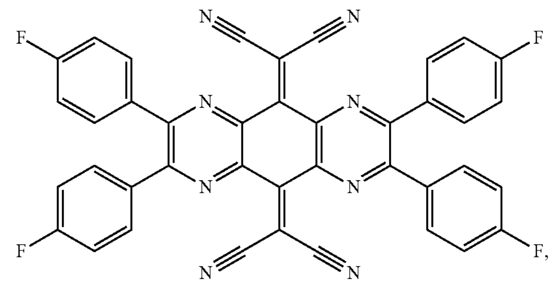

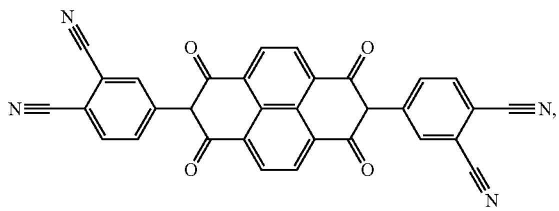

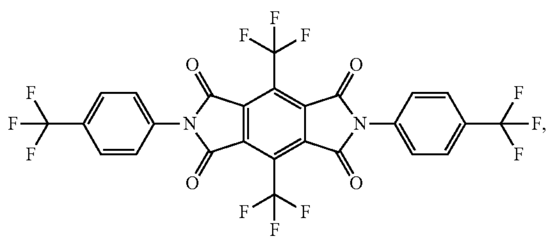

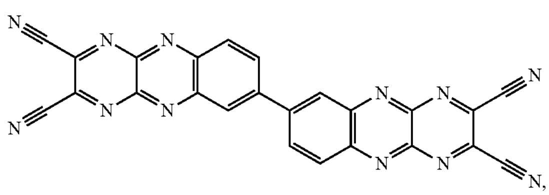

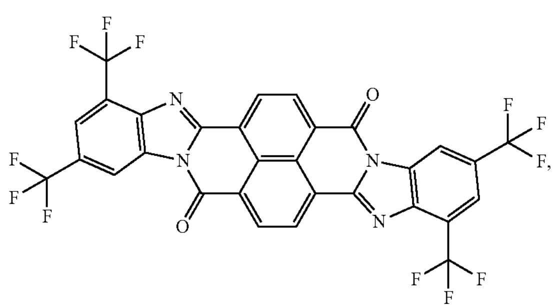

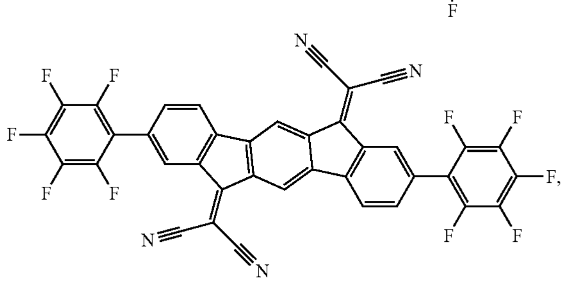

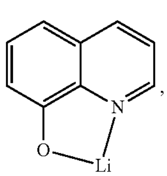

, and

-continued

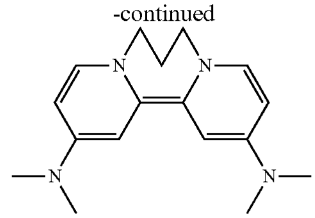

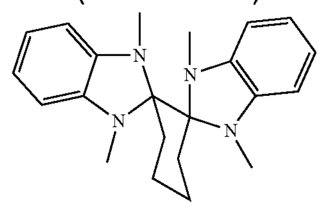

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

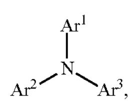

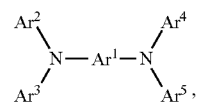

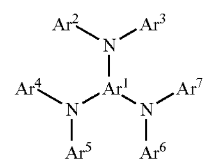

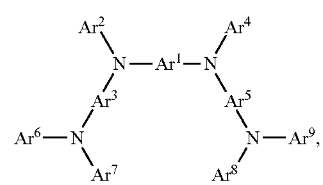

and

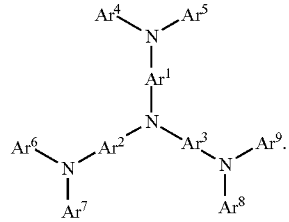

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

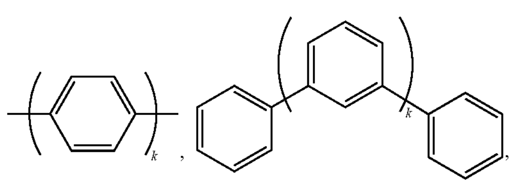

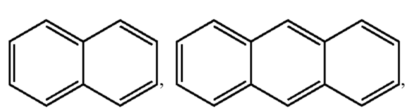

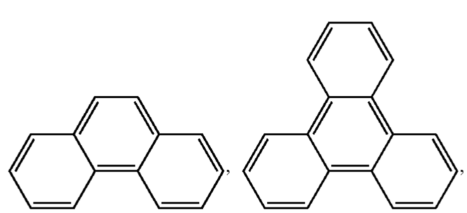

-continued

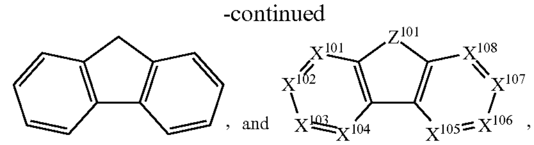

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

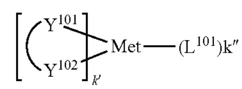

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

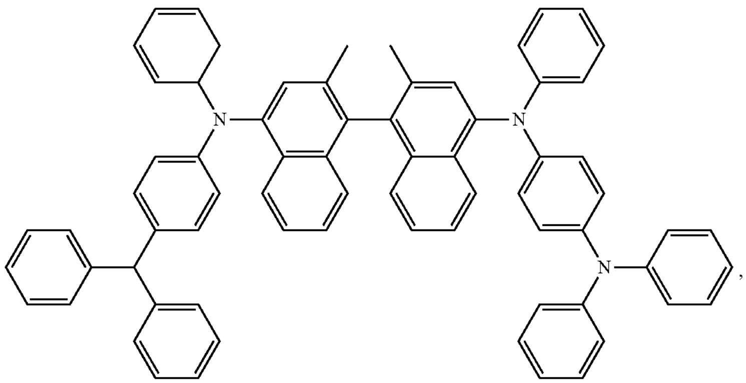
,
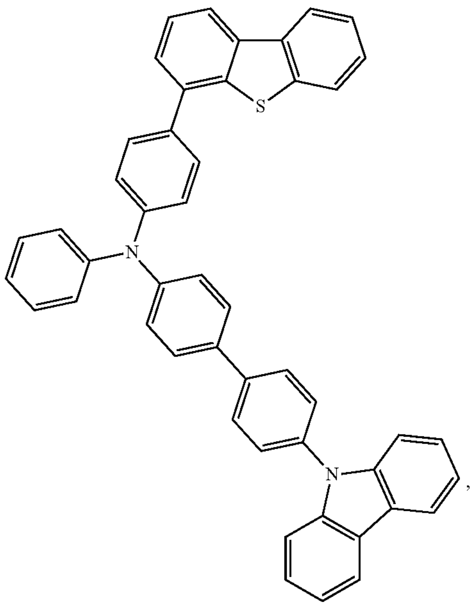
,
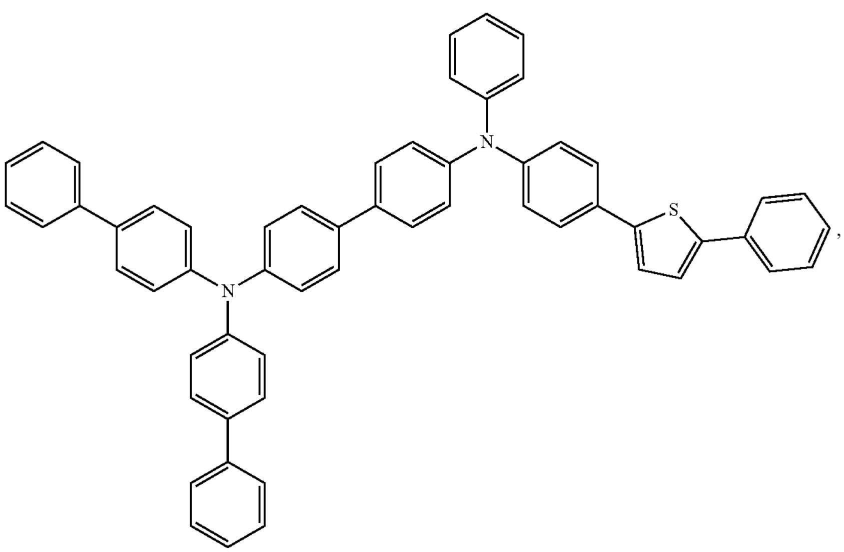
,

-continued
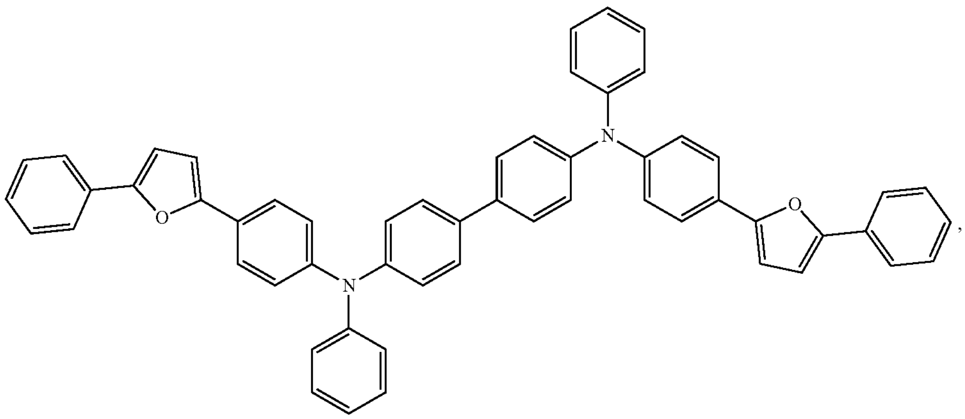
,
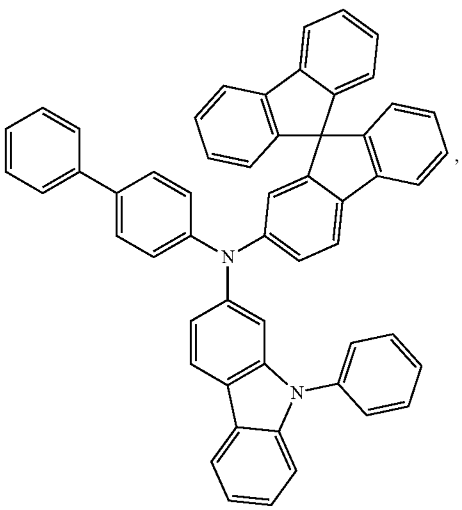
,
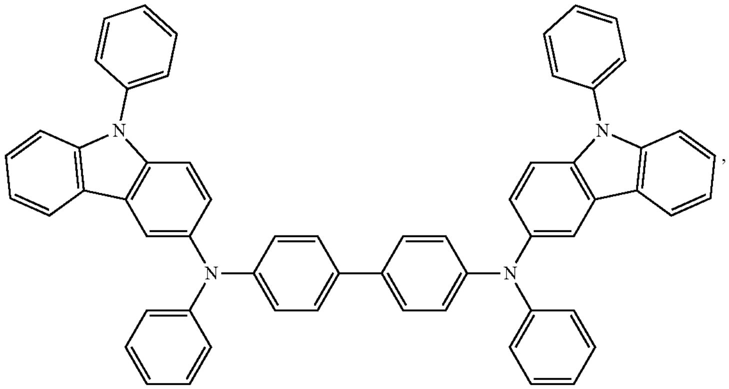
,

-continued
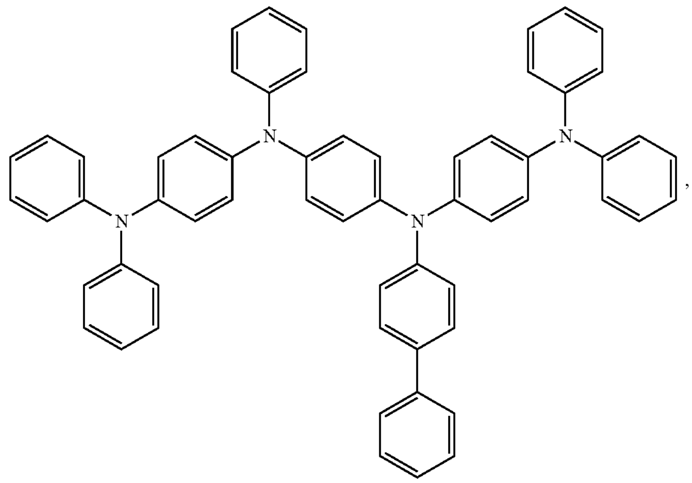
,
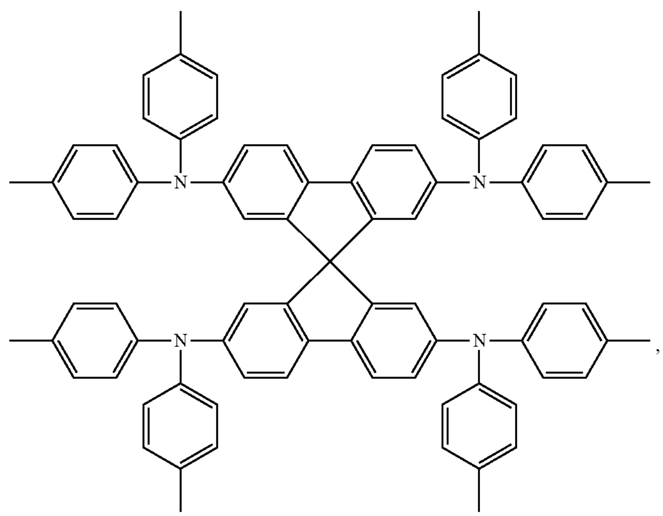
,
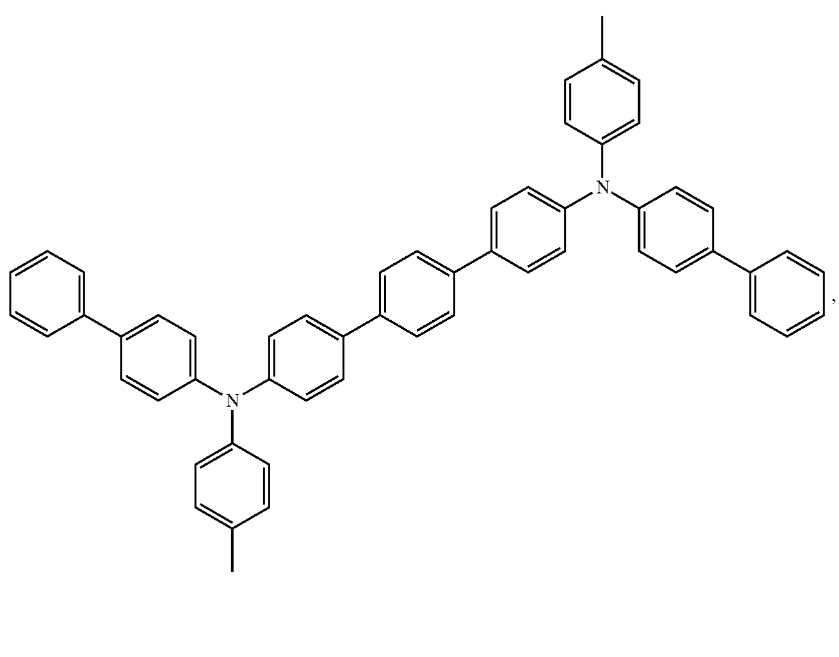
,

-continued
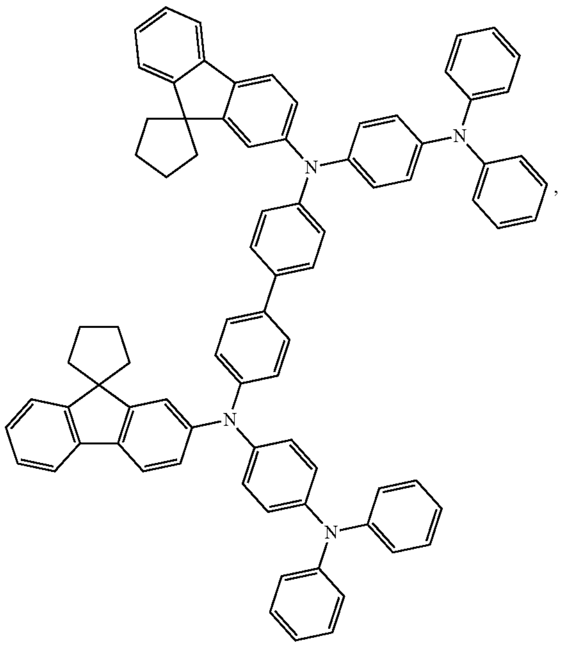
,
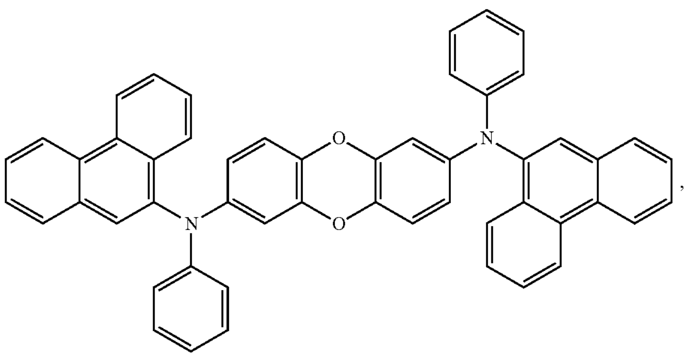
,
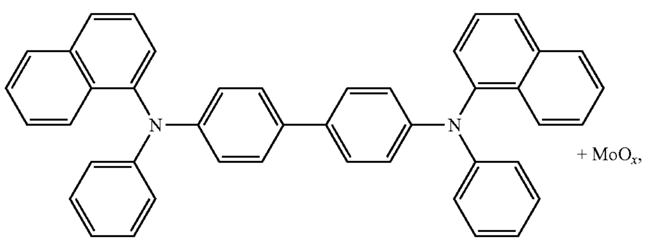
+ $MoO_x$,
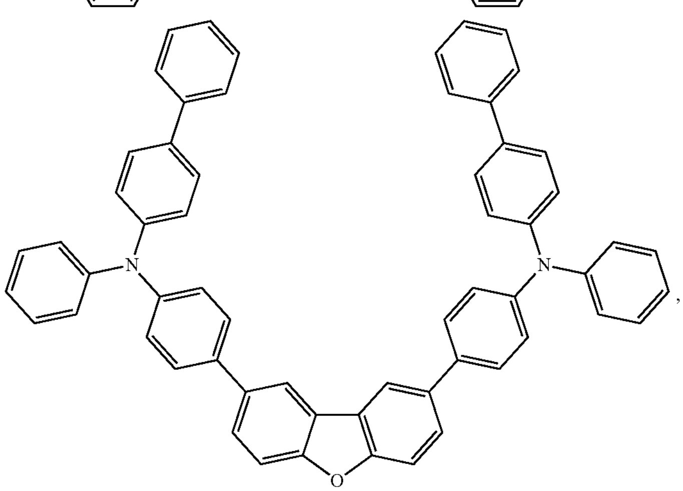
,
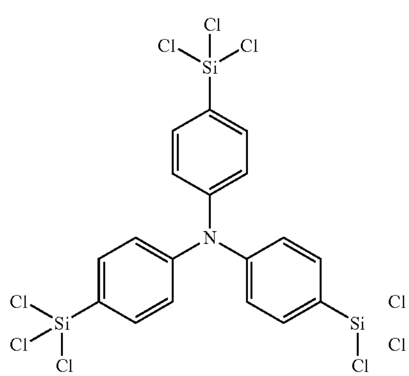
, -continued
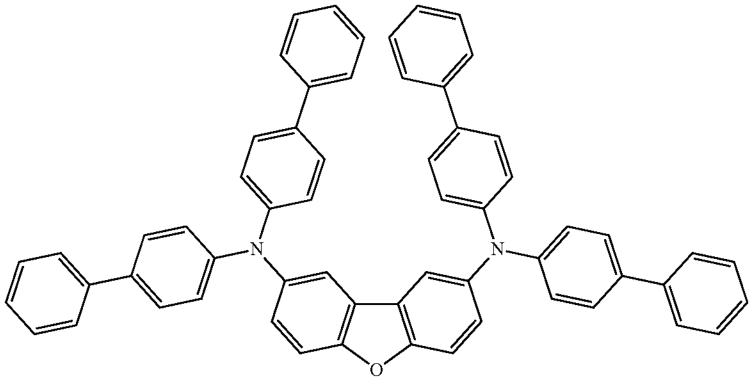
,
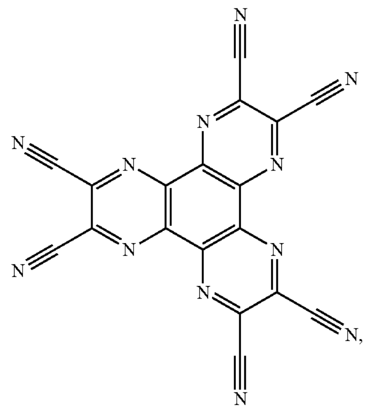
,
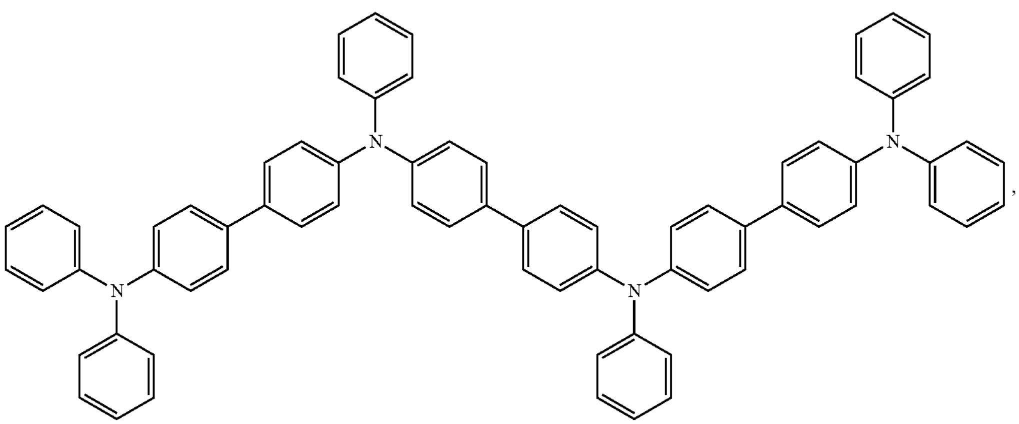
,
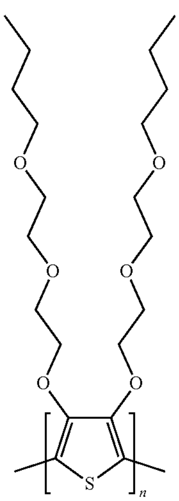
,
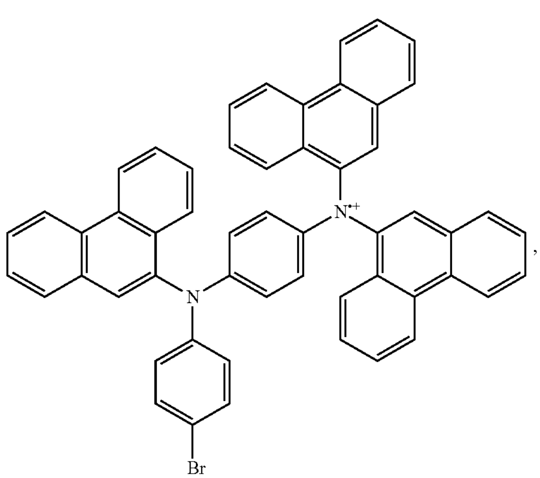
, -continued
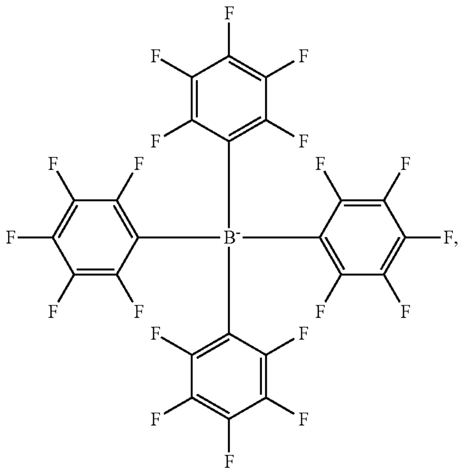
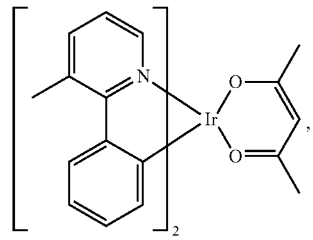
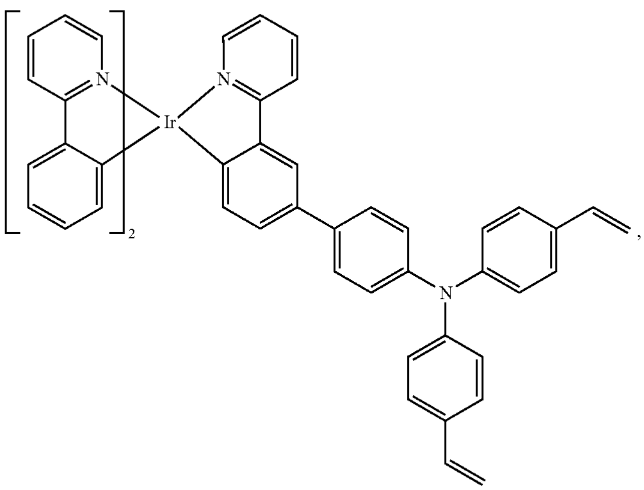
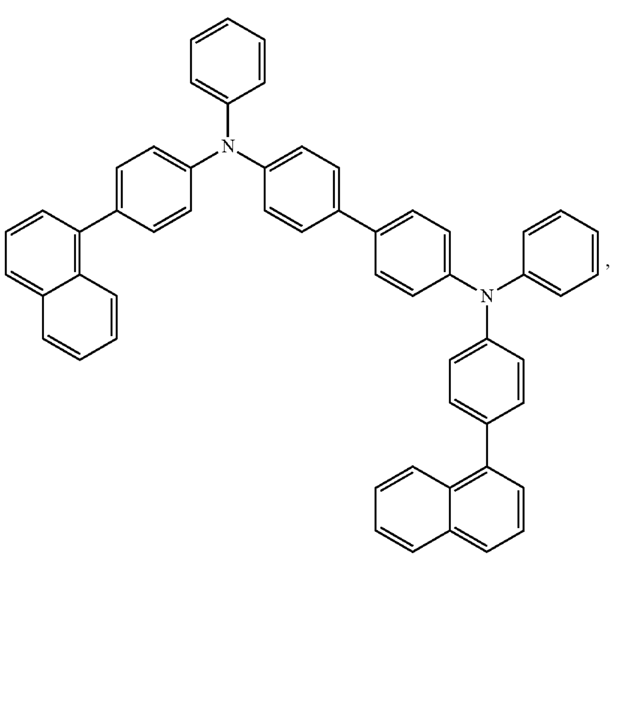

-continued
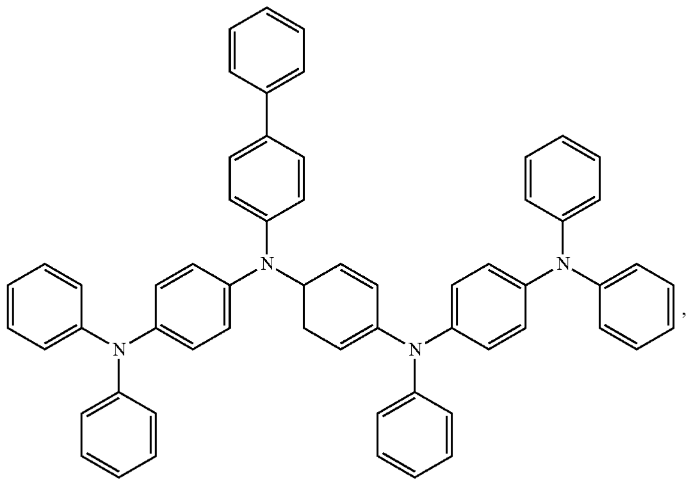
,
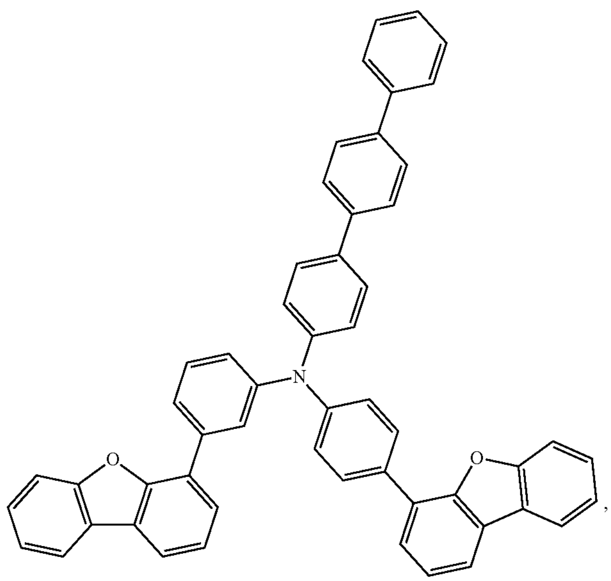
,
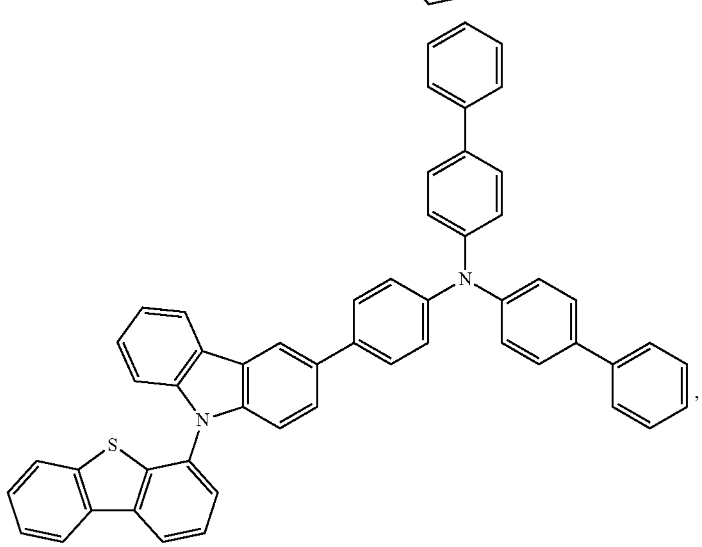
,

-continued
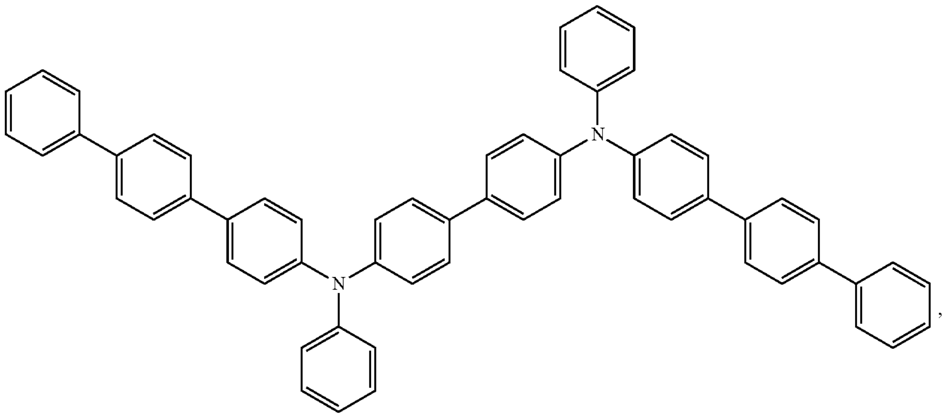
,
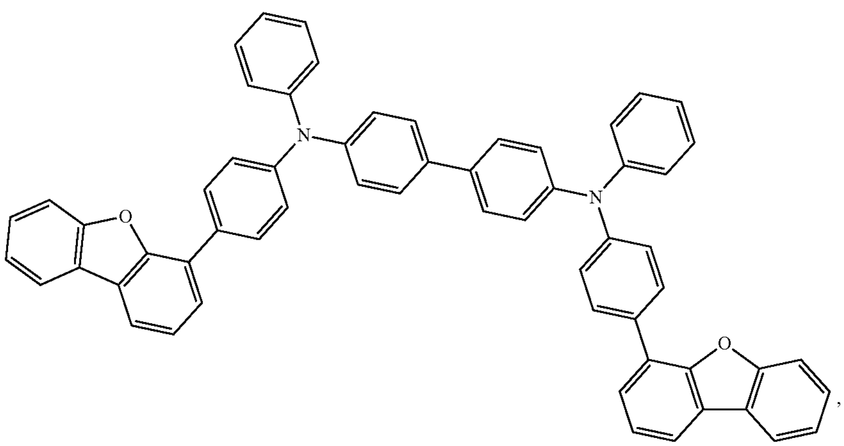
,
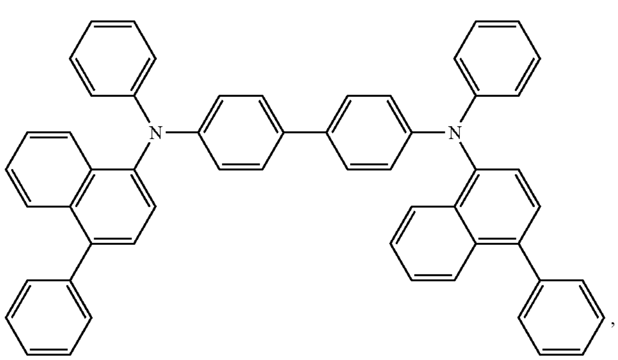
,

-continued
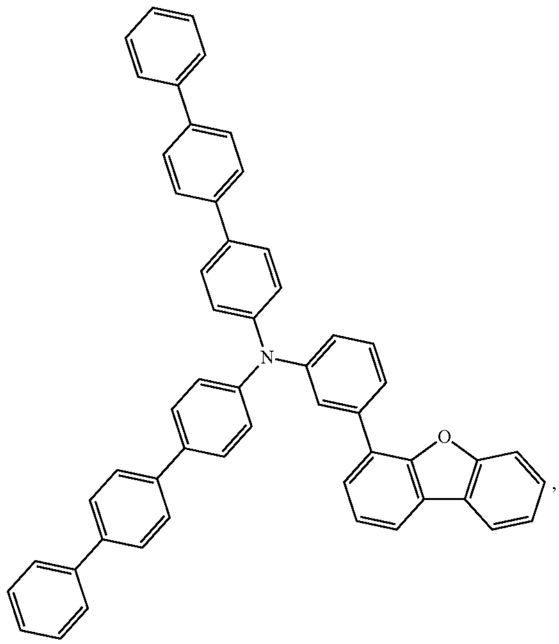
,
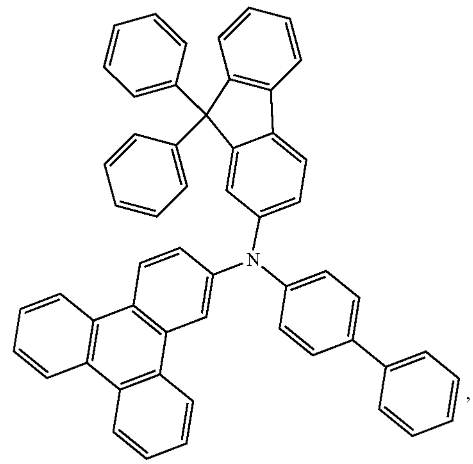
,
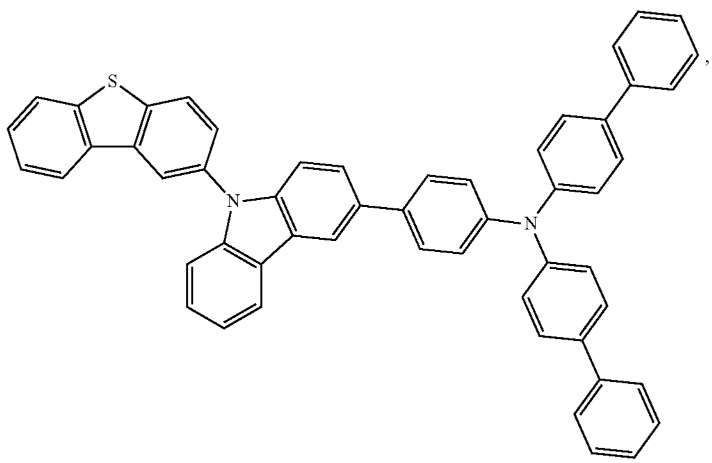
,
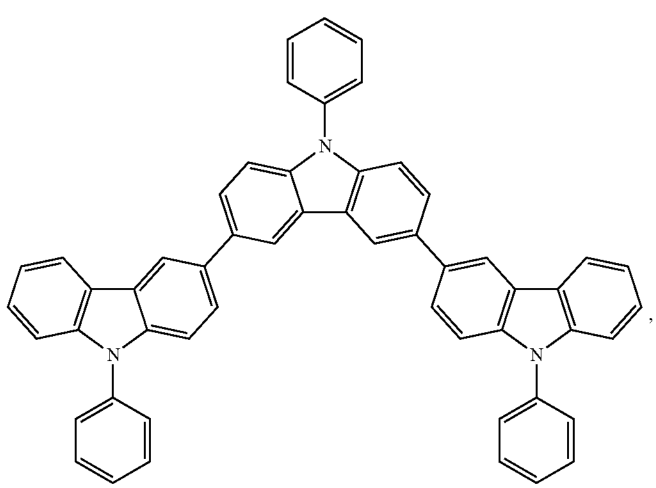
,
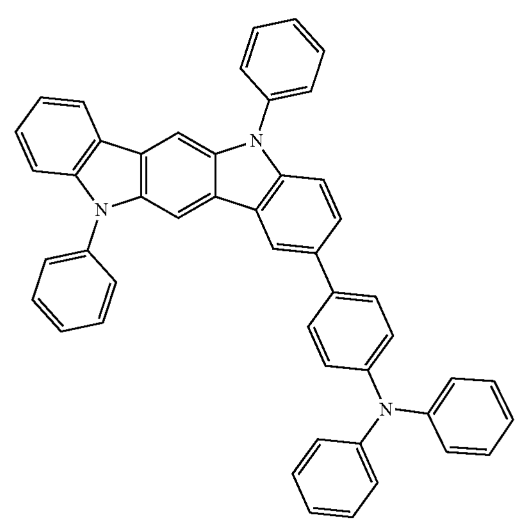
, -continued
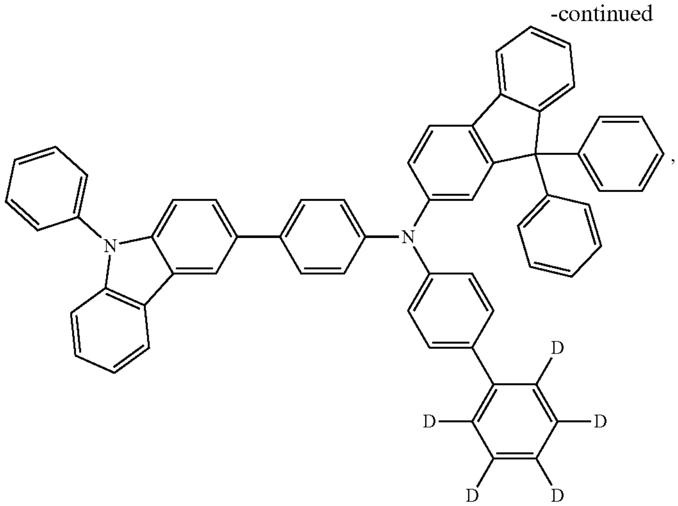
,
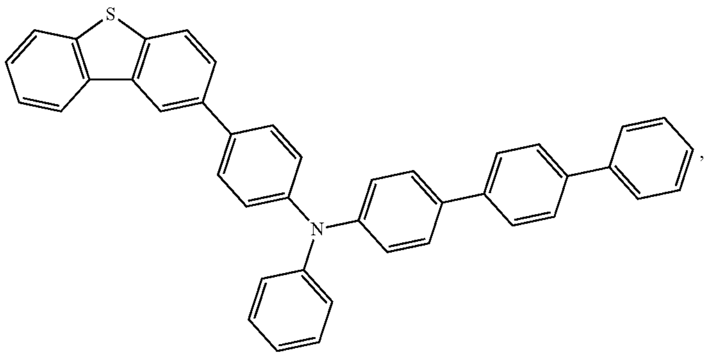
,
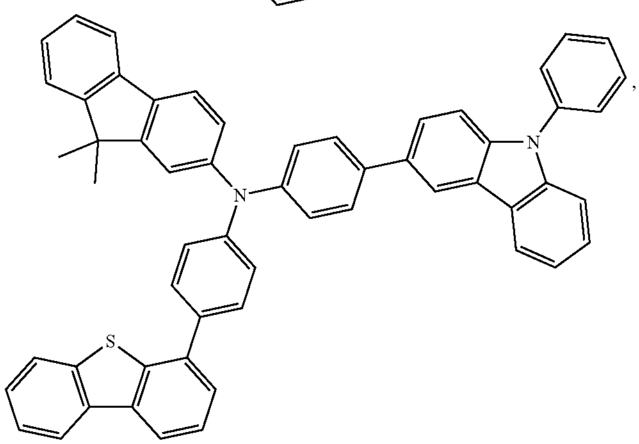
,
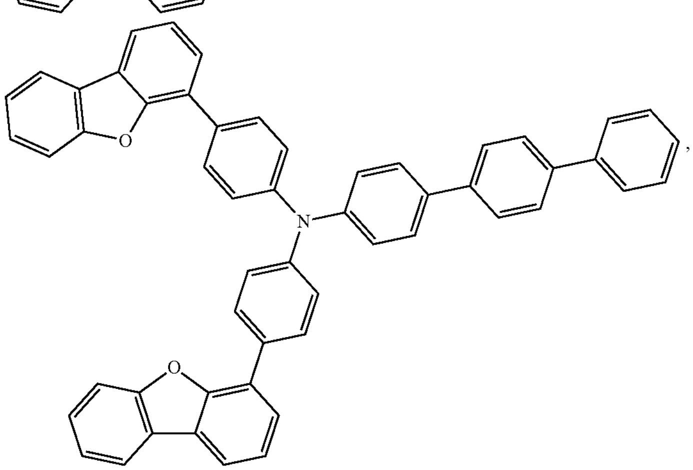
, -continued
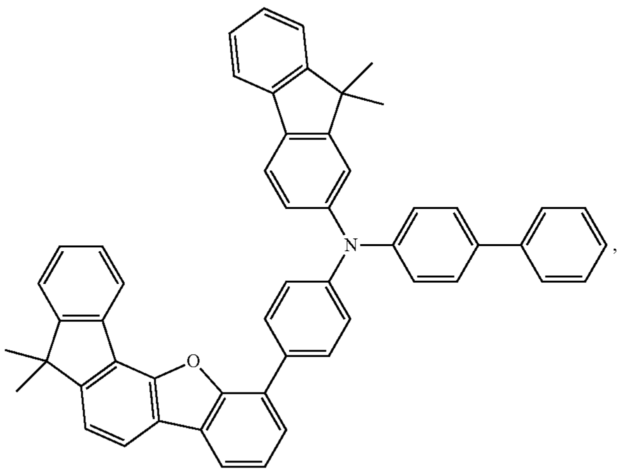
,
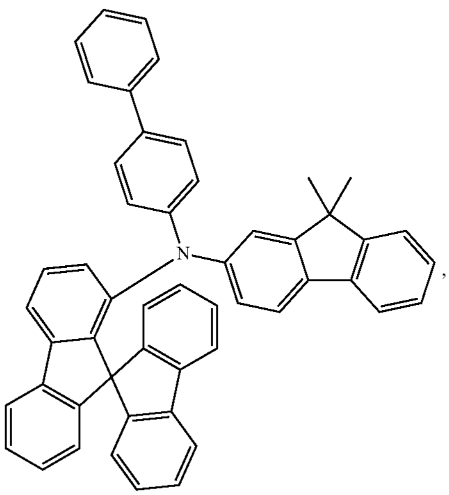
,
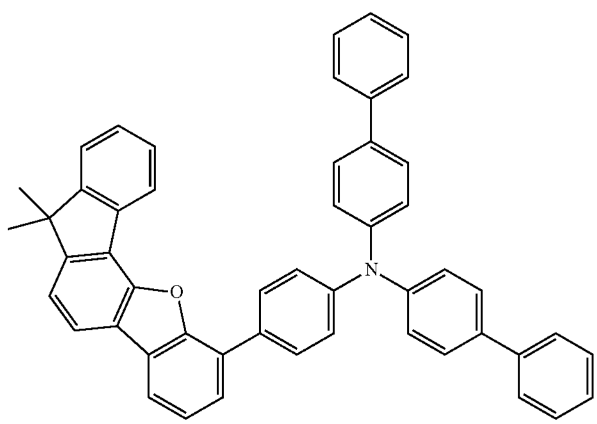
,
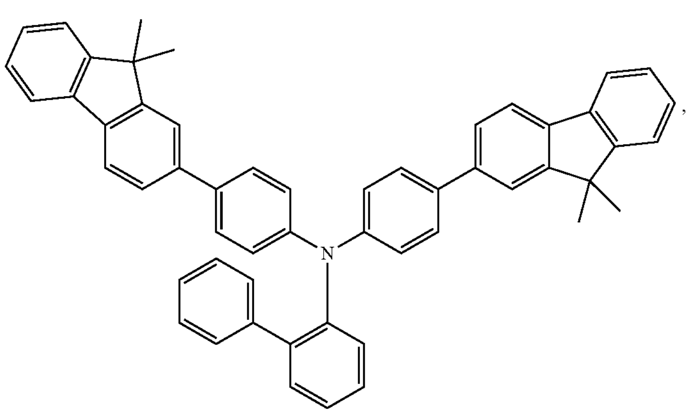
, -continued
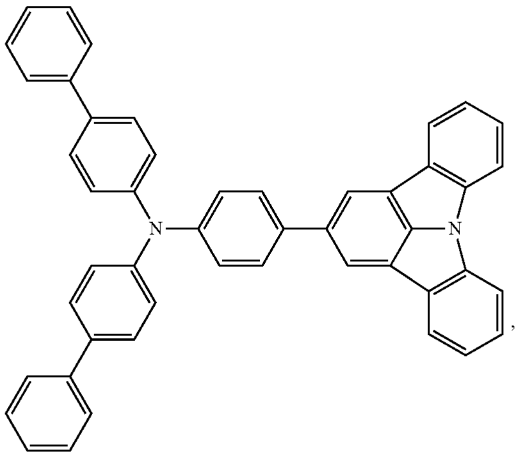
,
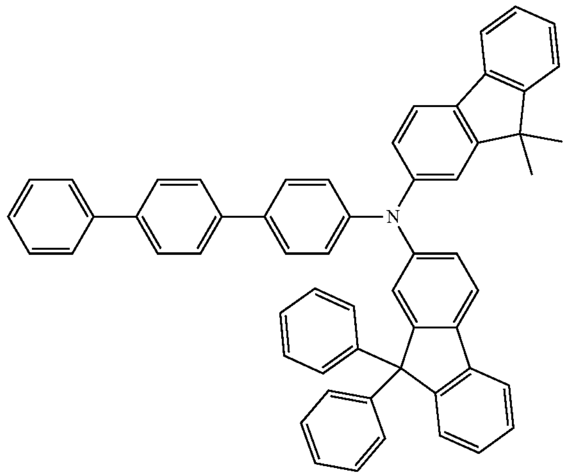
,
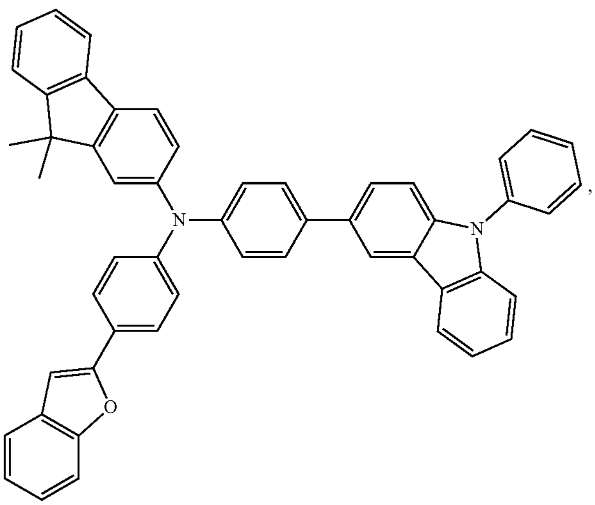
,
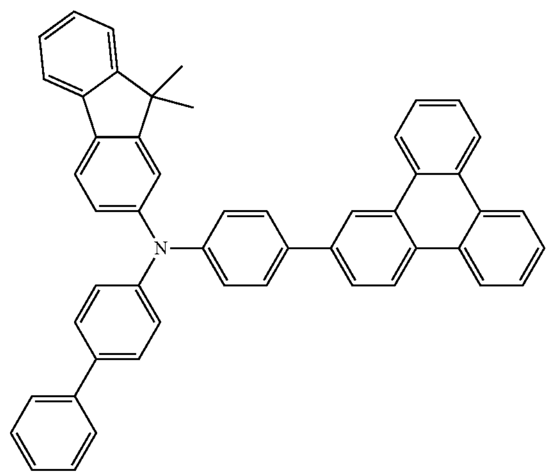
,
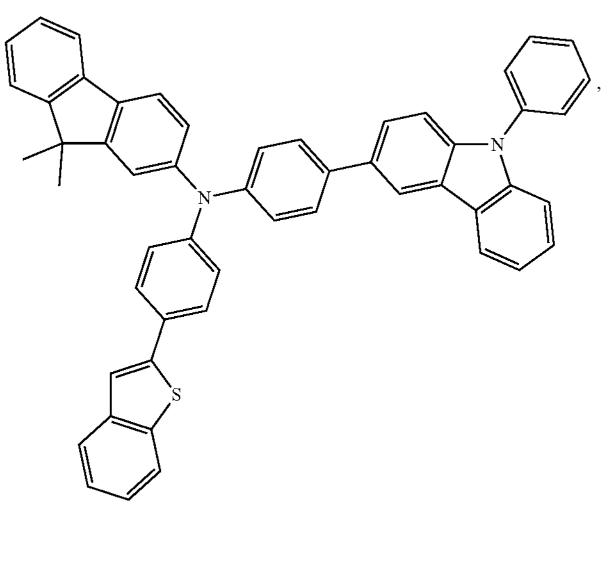
, -continued
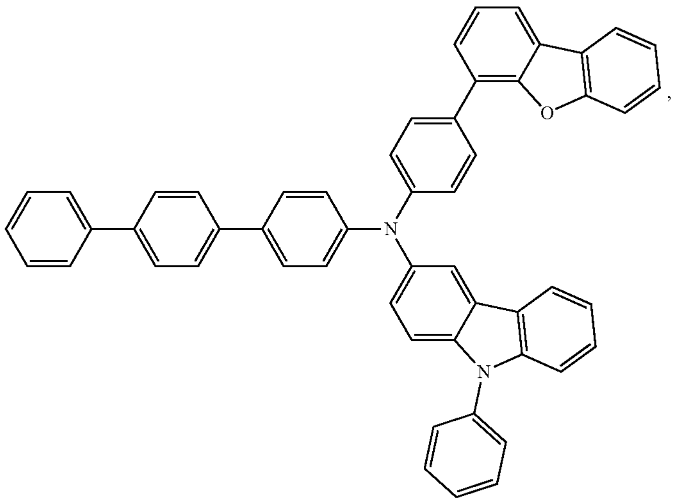
,
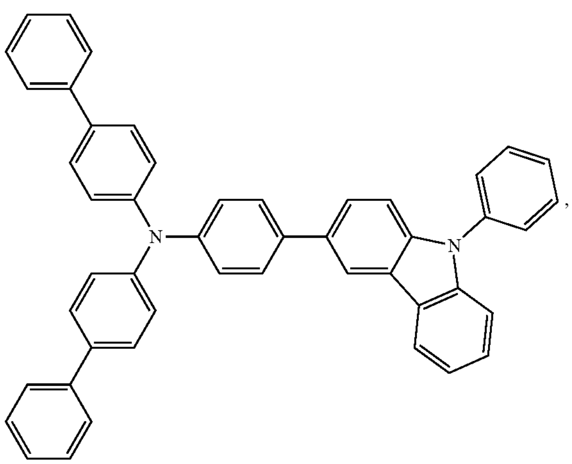
,
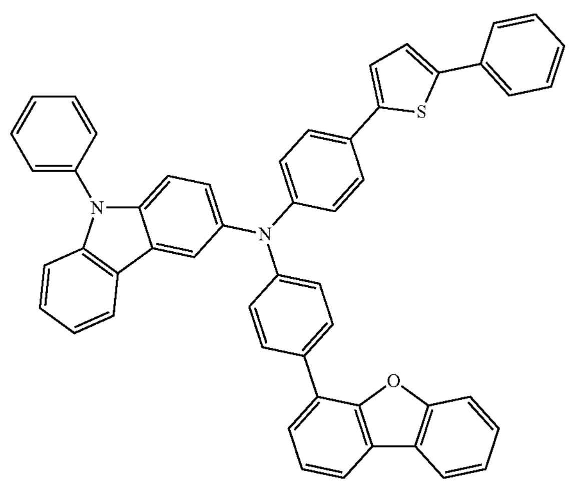
,
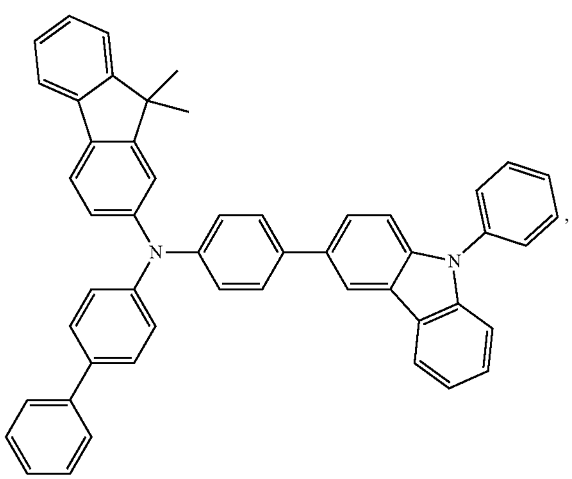
,
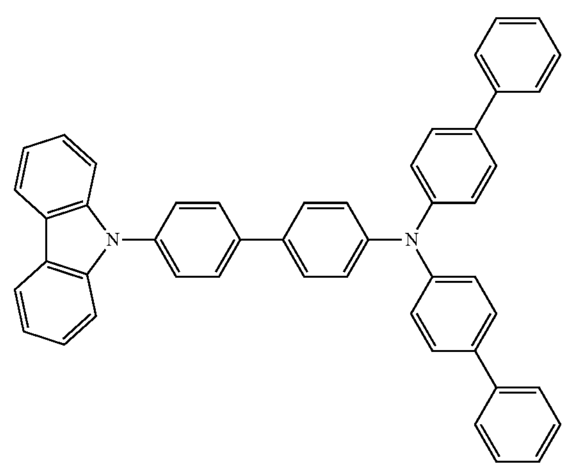
, -continued
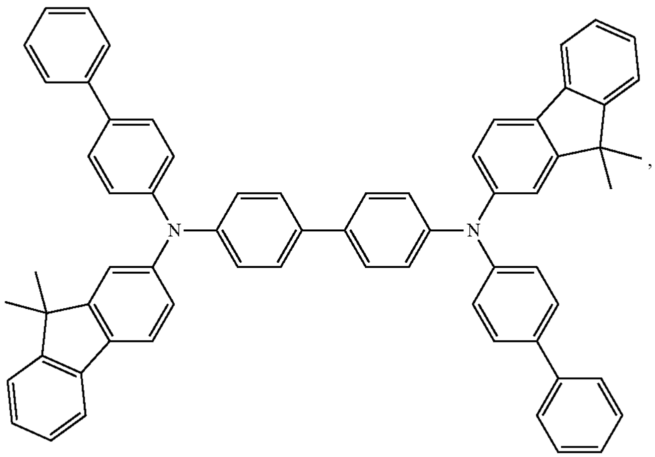
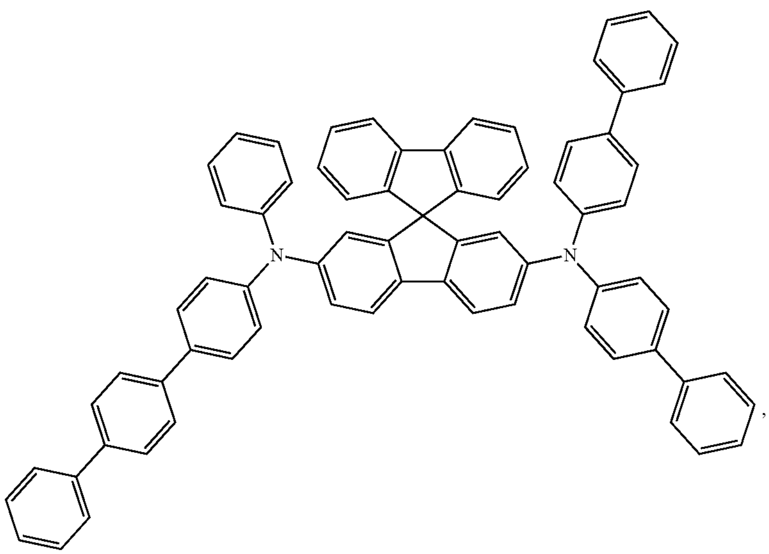
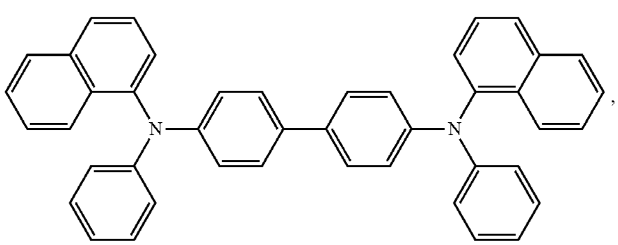
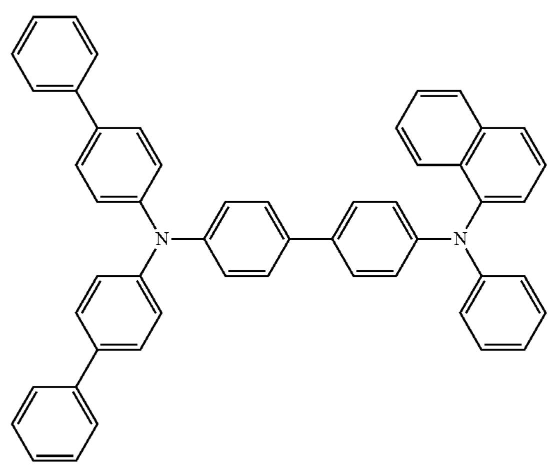

-continued
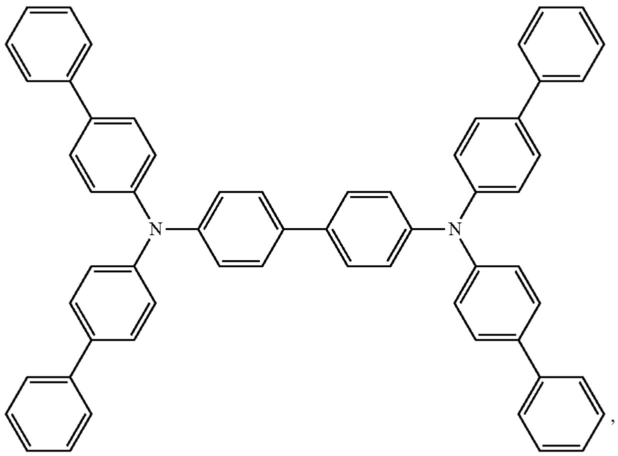
,
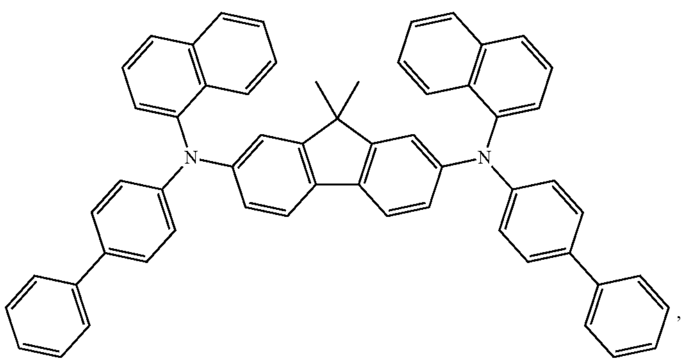
,
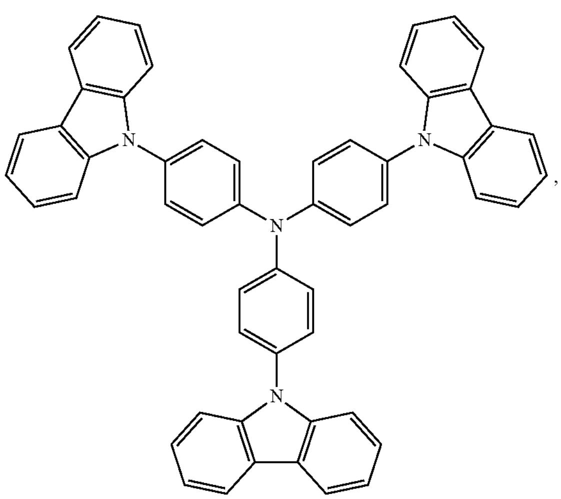
,
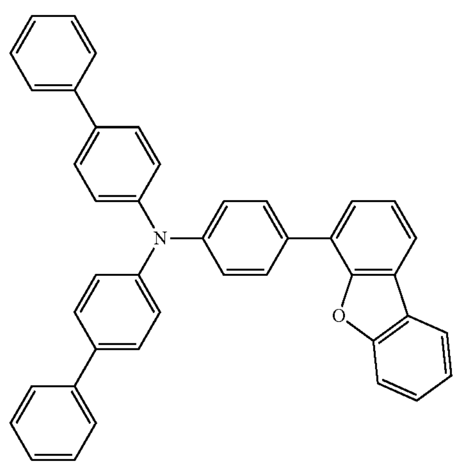
,

-continued

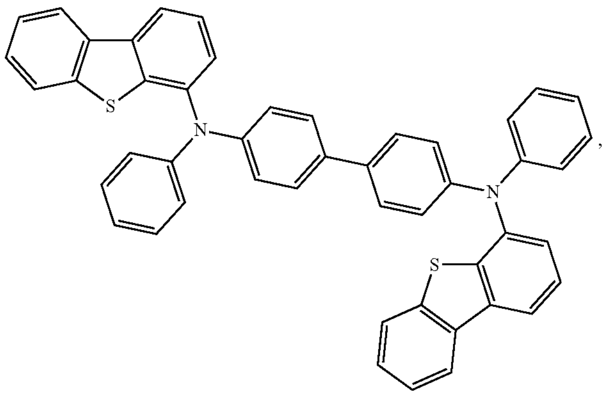

,

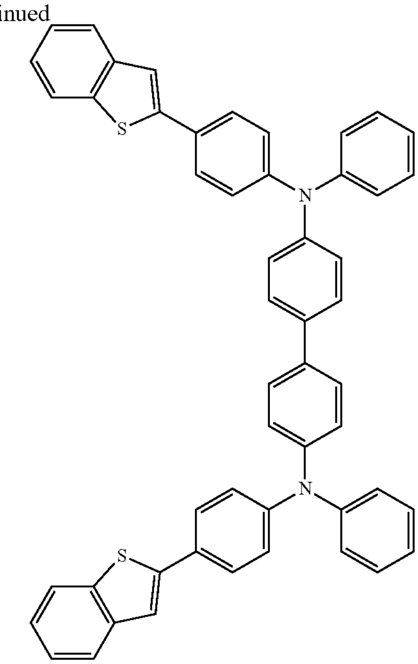

, and

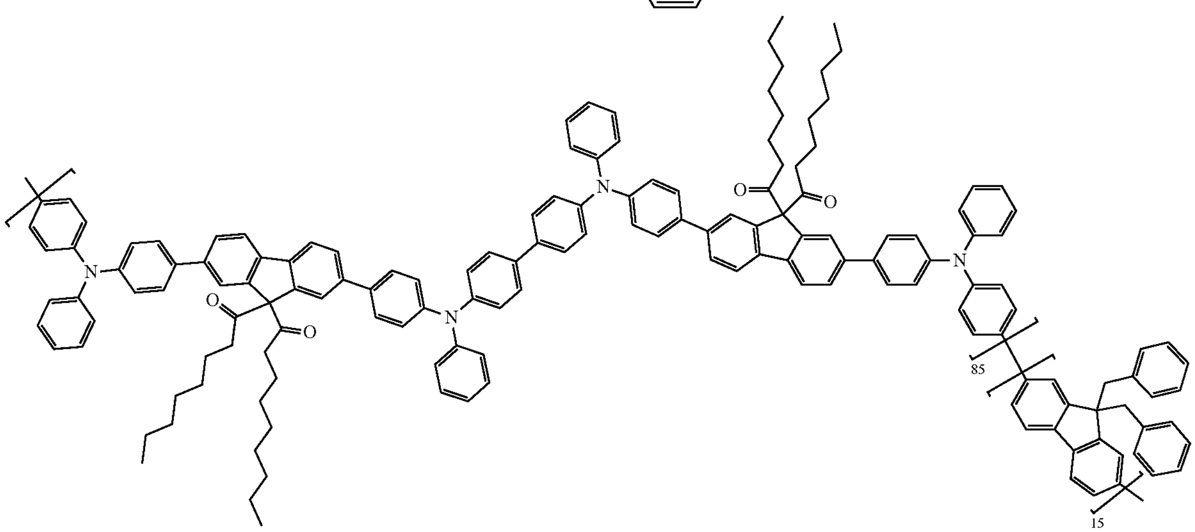

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

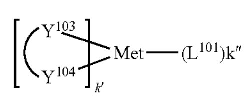

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

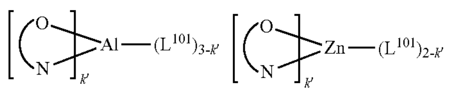

wherein (O—N) is a bidentate ligand, having metal coordinated to atoms O and N.

In another aspect, Met is selected from Ir and Pt. In a further aspect, $(Y^{103}\text{-}Y^{104})$ is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

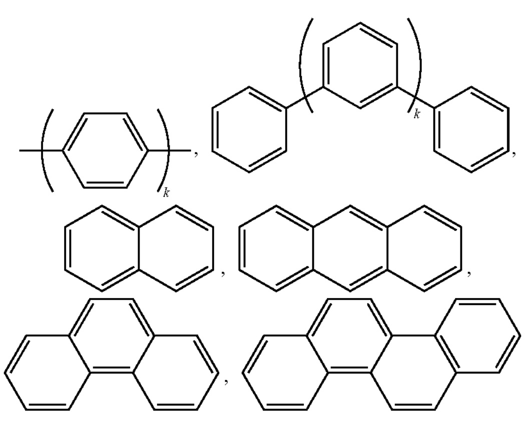

-continued

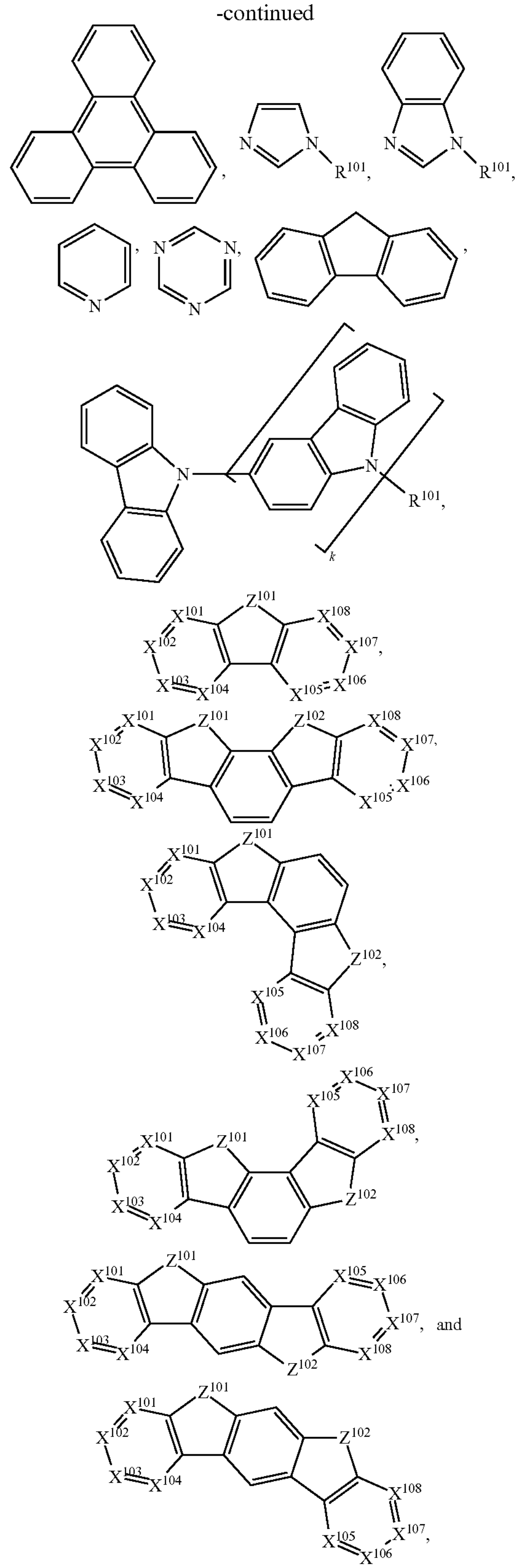

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

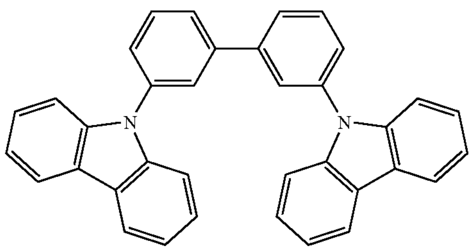
,
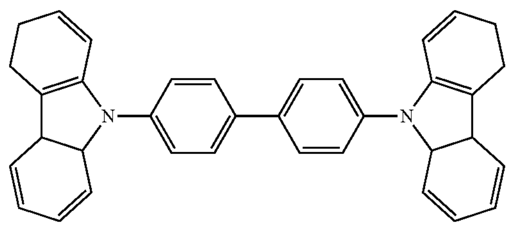
,
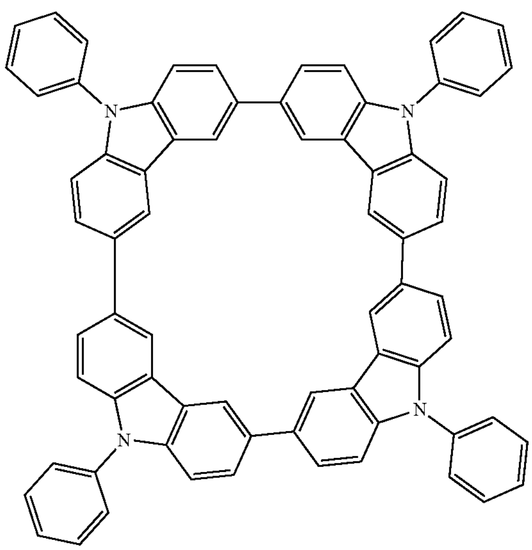
,
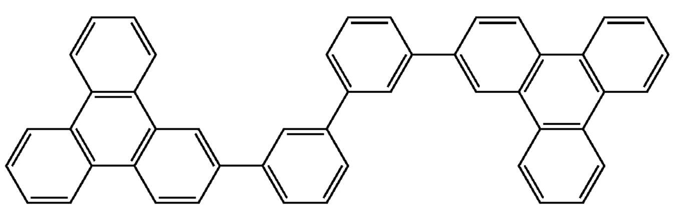
,
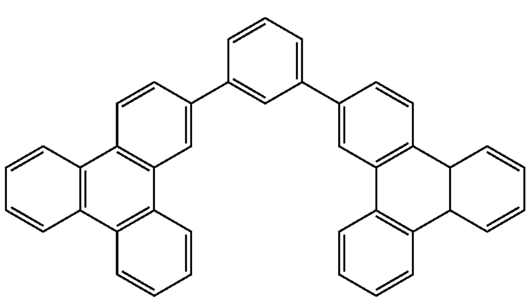
,
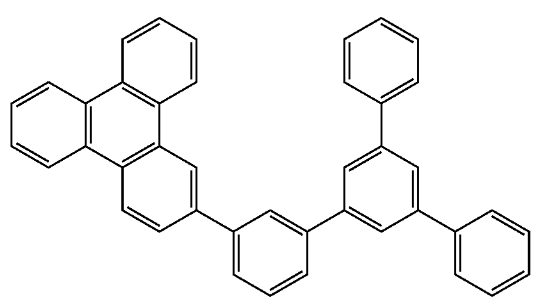
, -continued
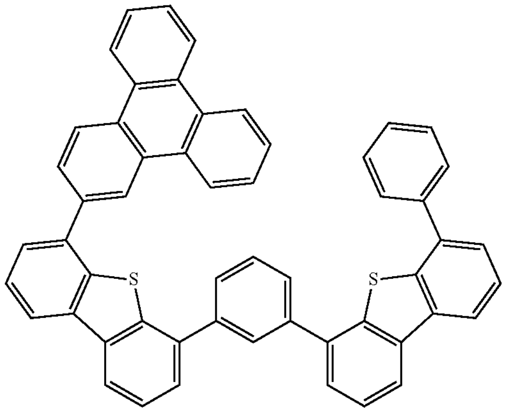,
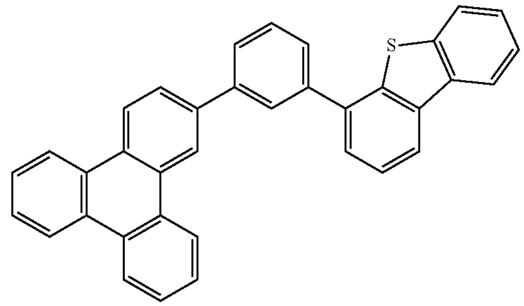,
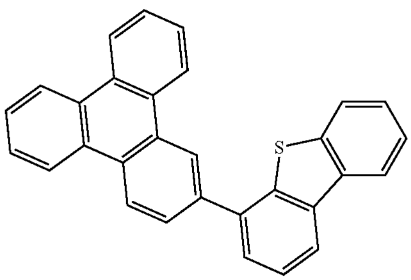,
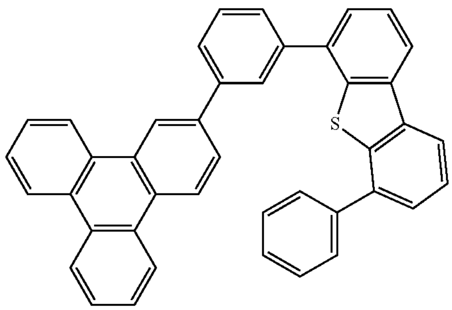,
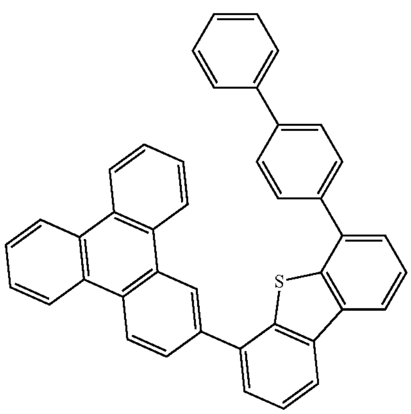,
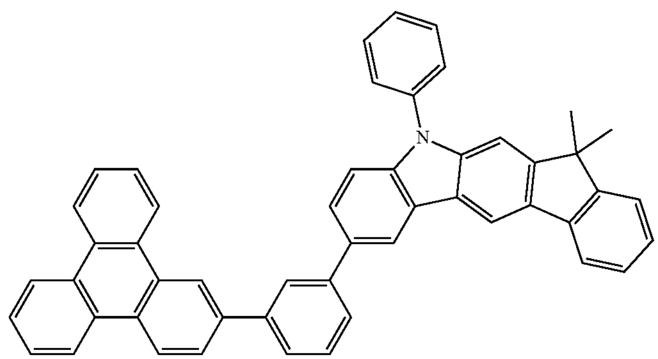,
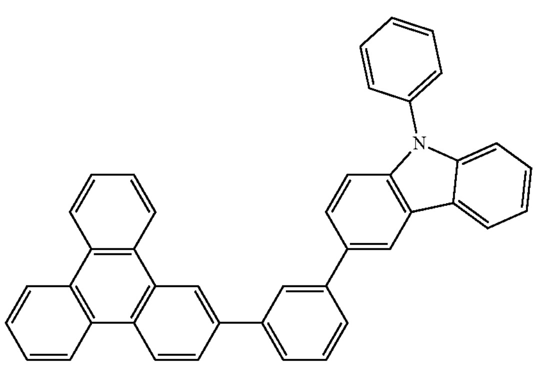,
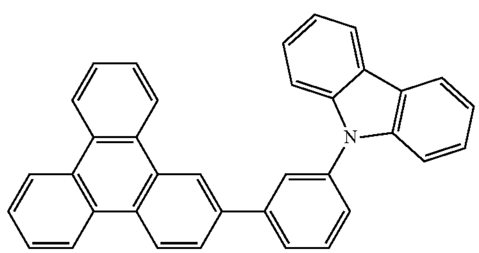, -continued
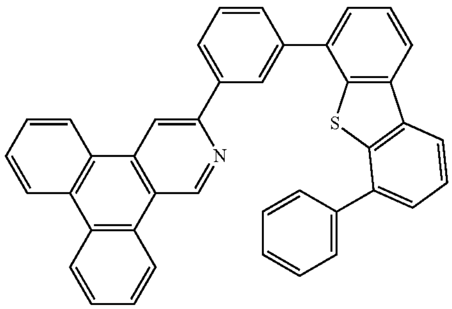
,
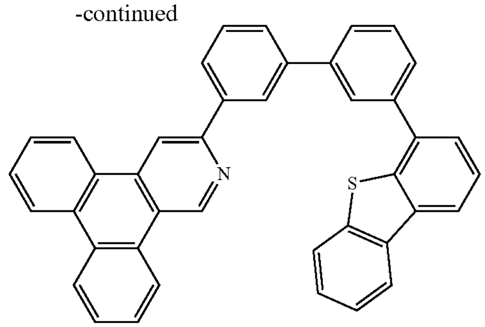
,
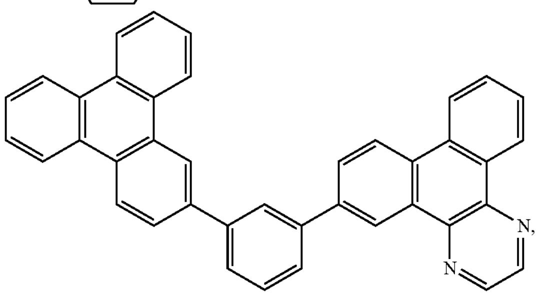
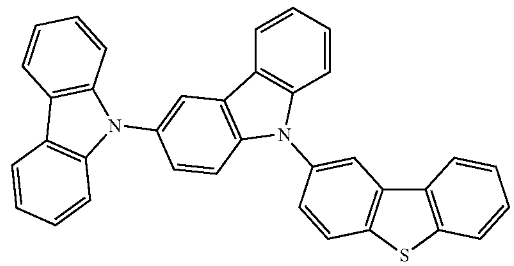
,
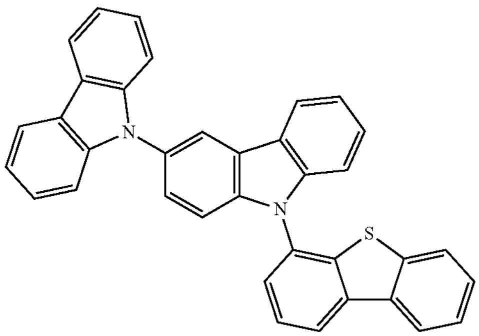
,
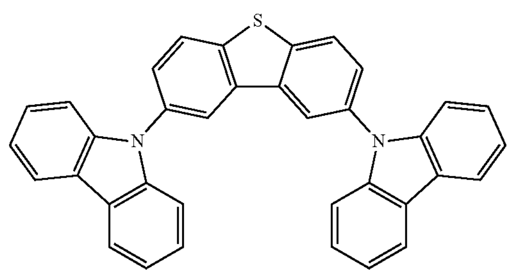
,
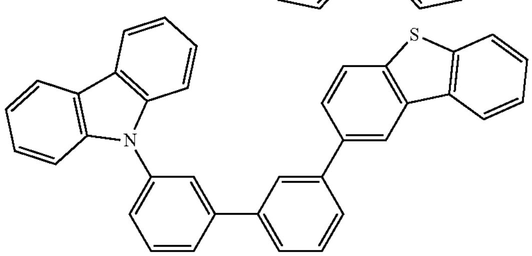
,
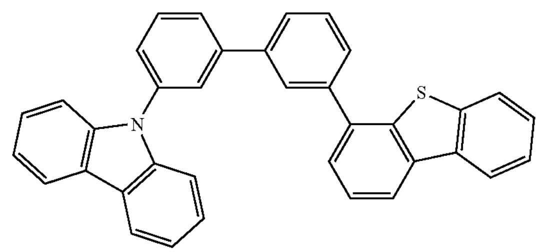
,
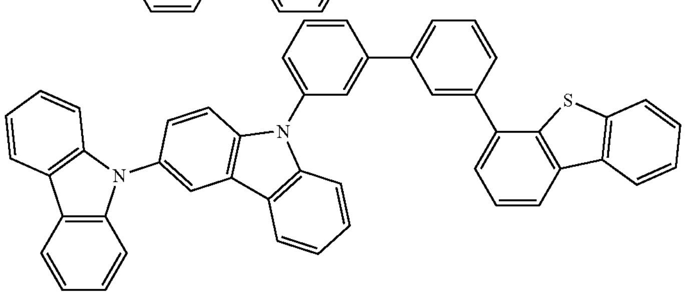
,
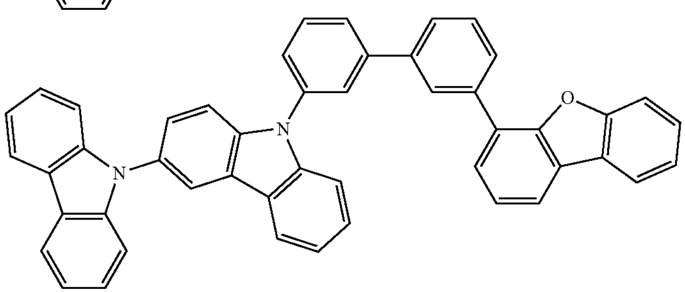
, -continued
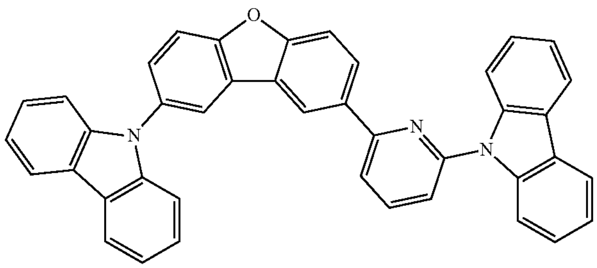
,
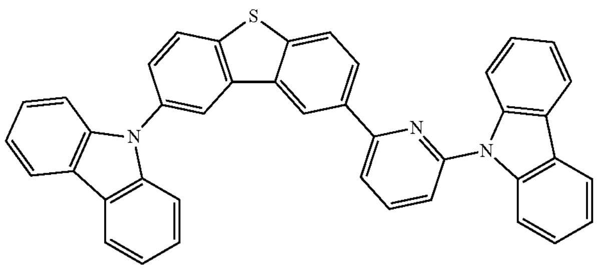
,
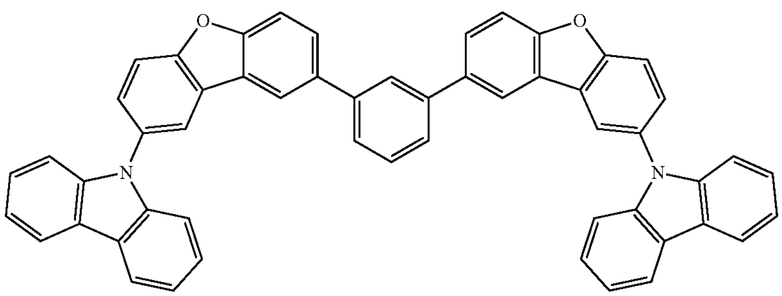
,
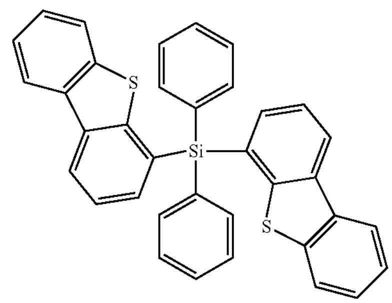
,
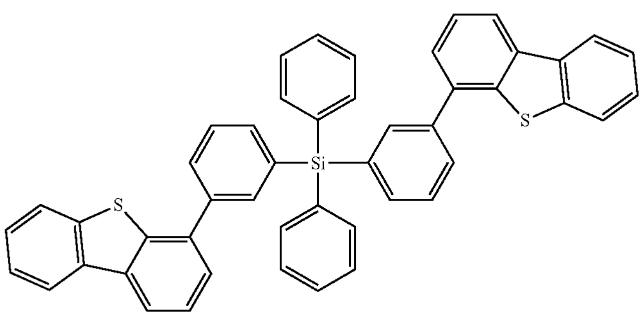
,
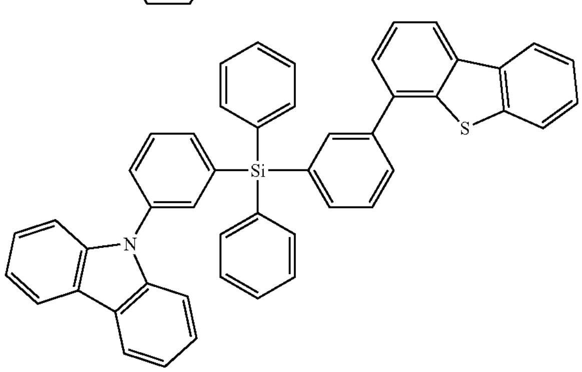
, -continued
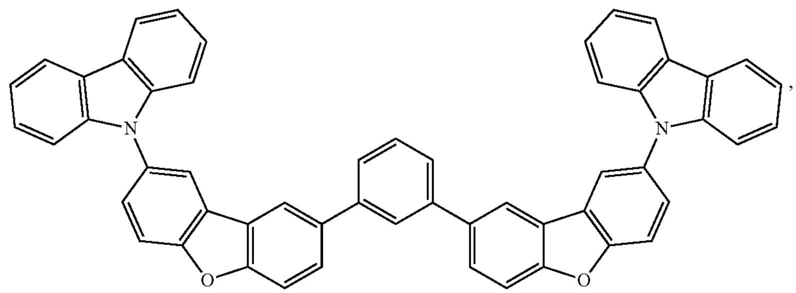
,
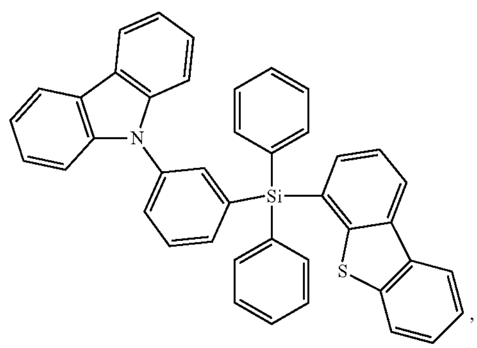
,
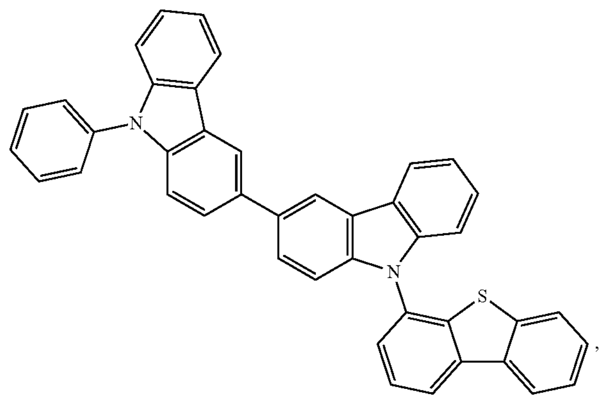
,
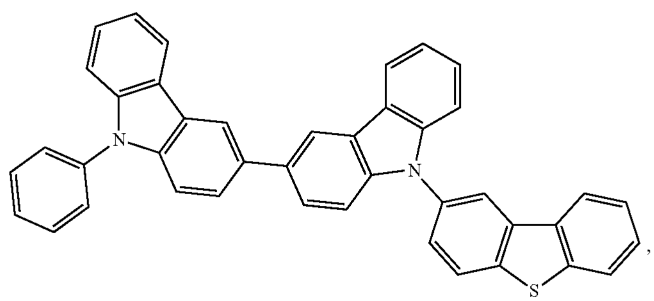
,
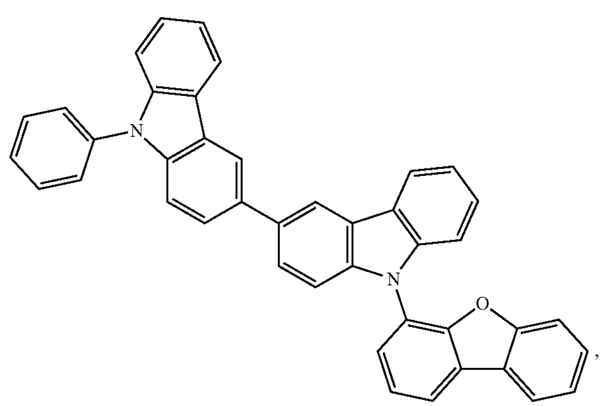
, -continued
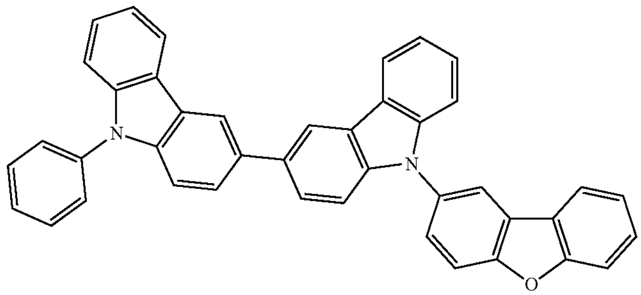
,
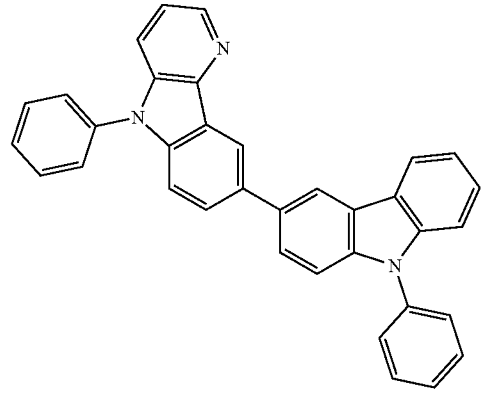
,
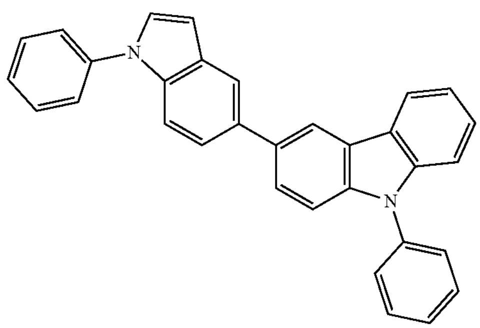
,
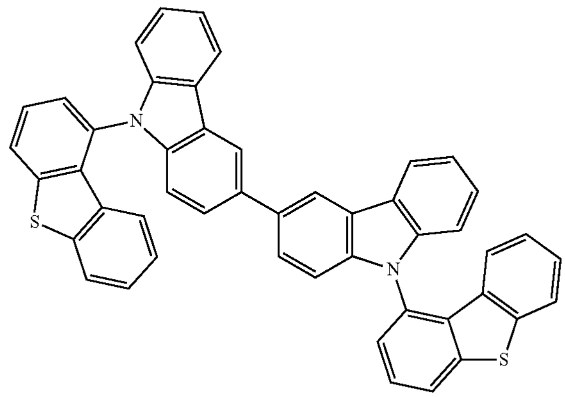
,
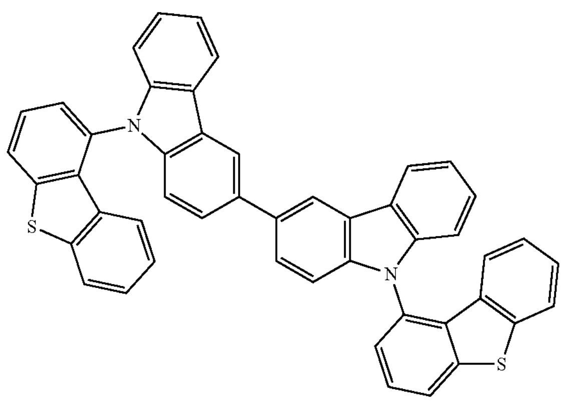
,
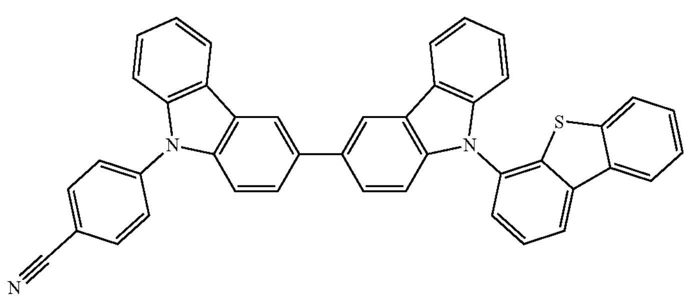
, -continued
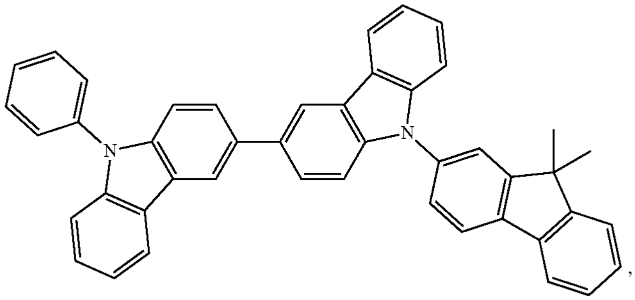
,
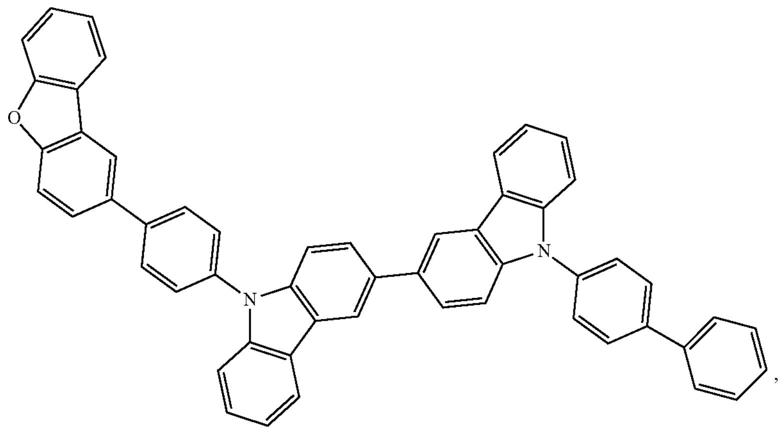
,
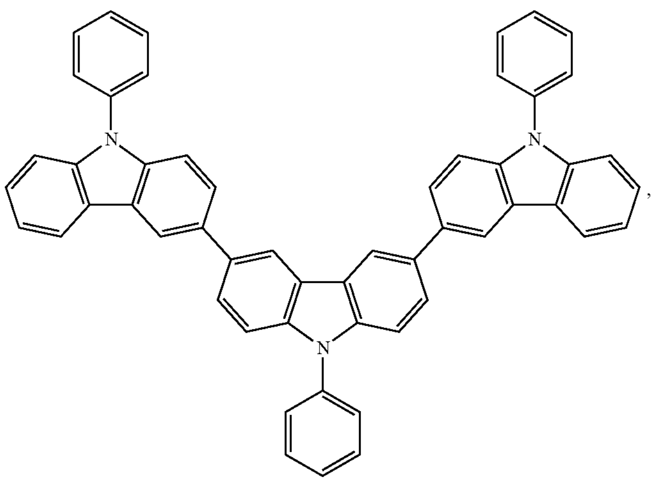
,
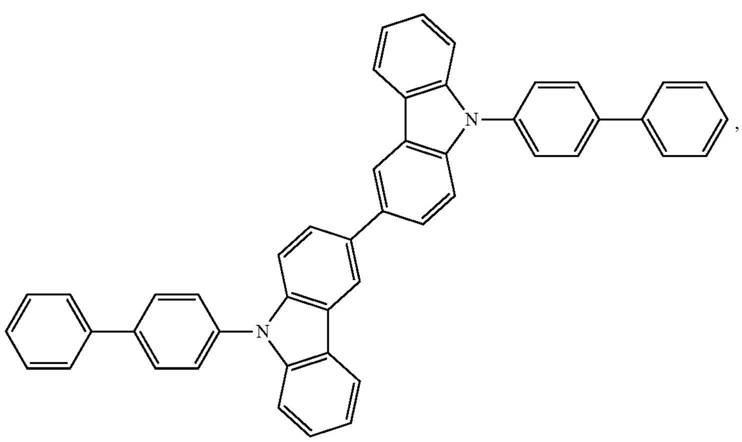
, -continued
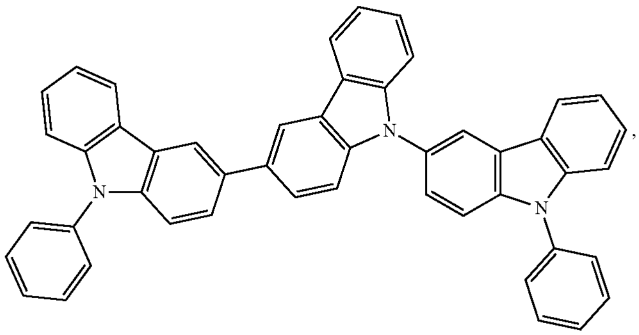
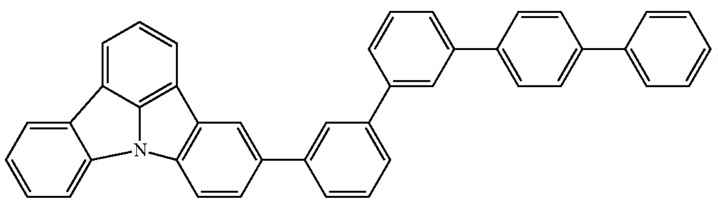
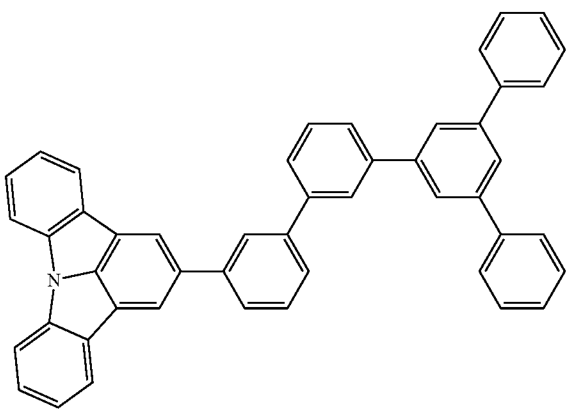
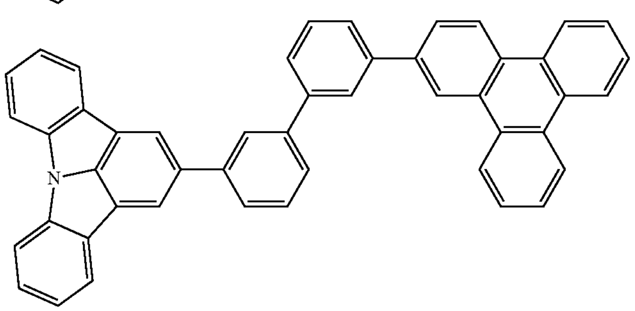
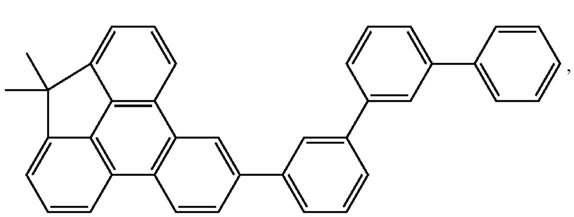
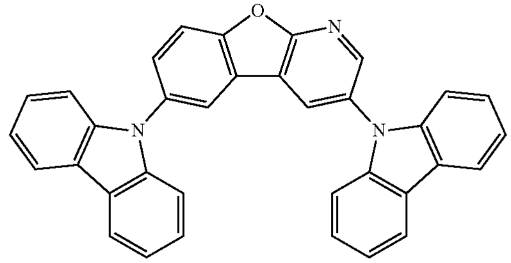

-continued
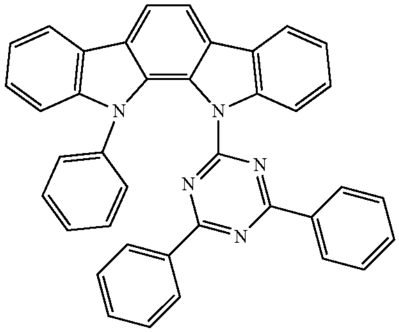
,
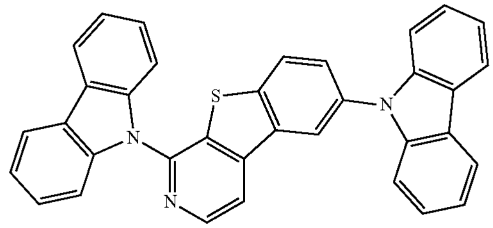
,
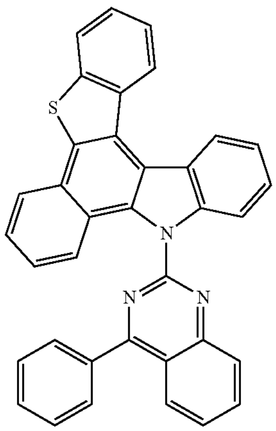
,
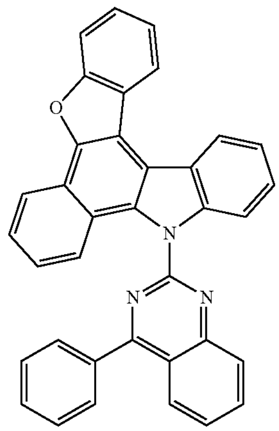
,
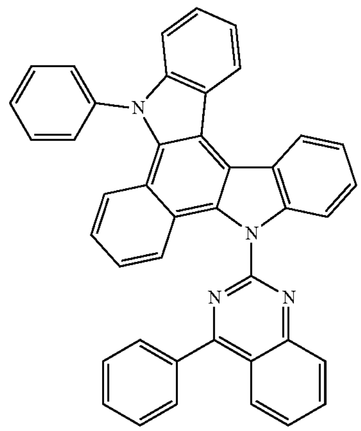
,
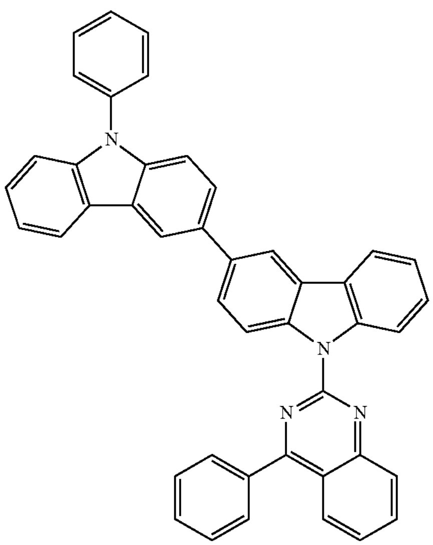
,
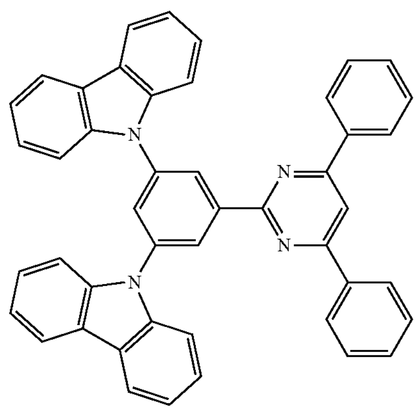
,
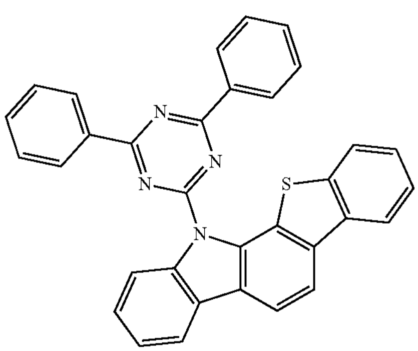
,
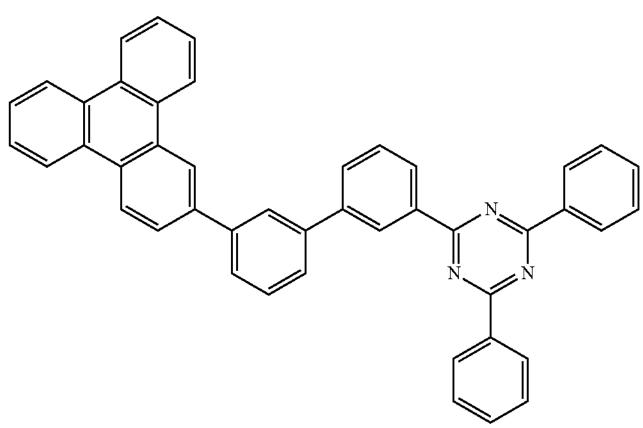
, -continued
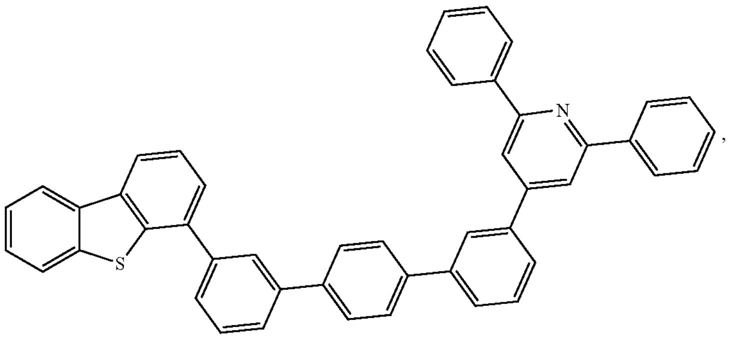
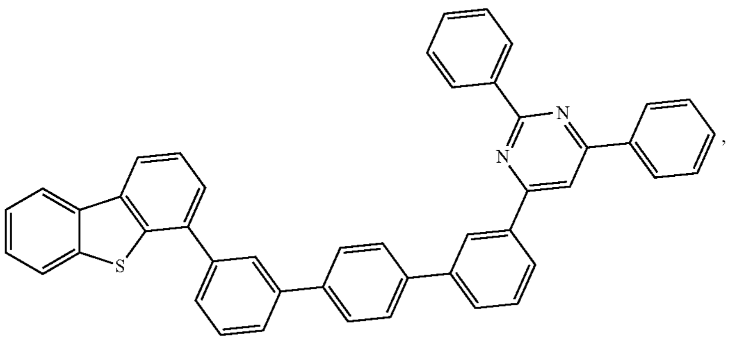
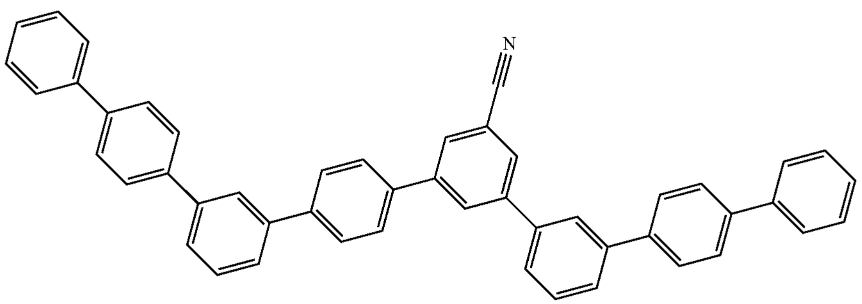
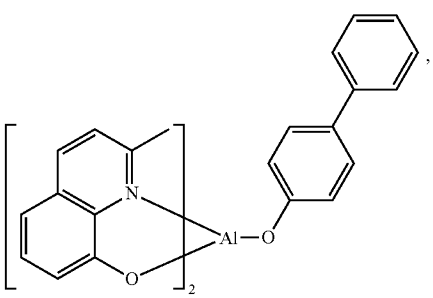
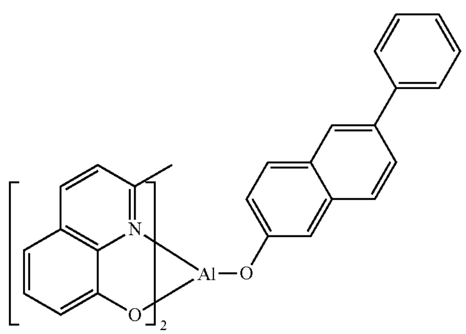
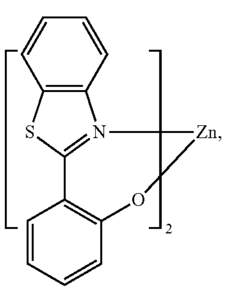
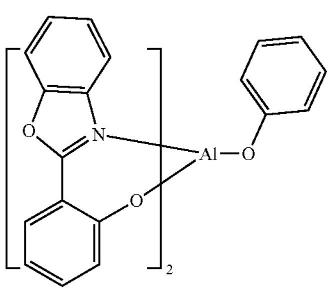
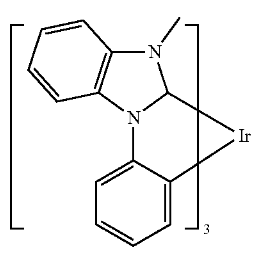

-continued

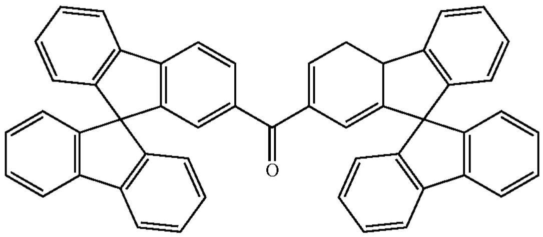

,

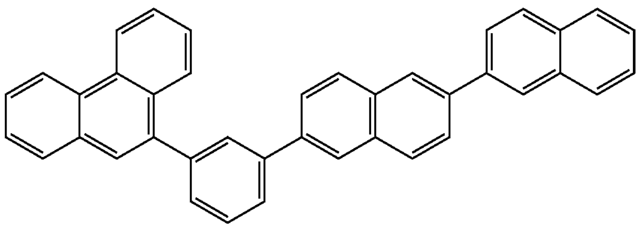

,

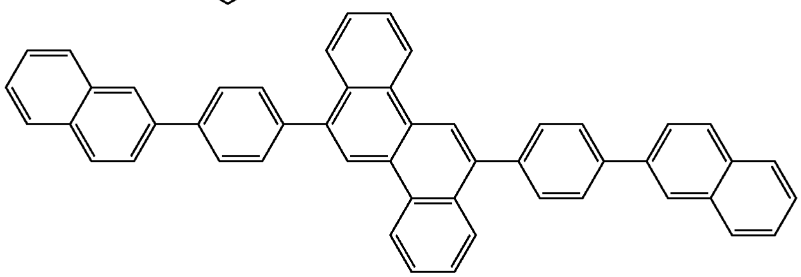

, and

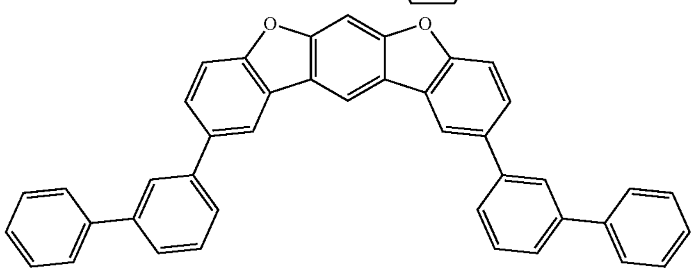

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
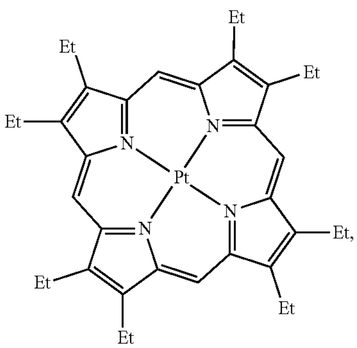
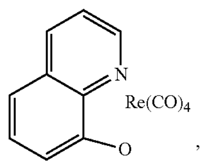
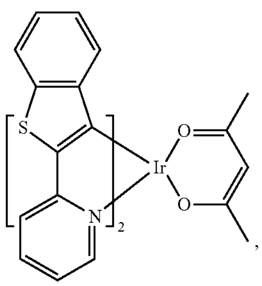
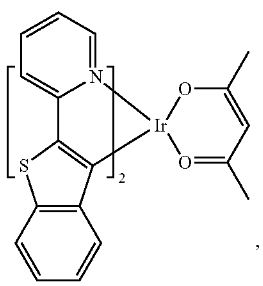
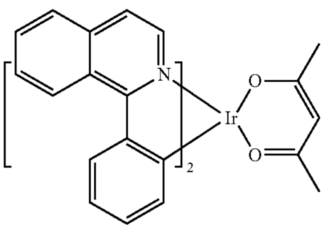
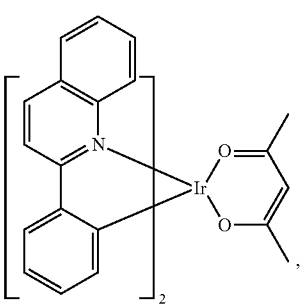
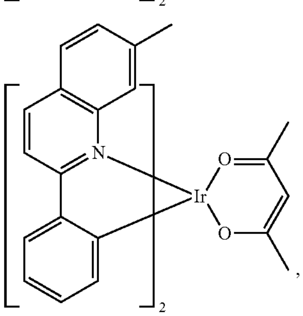
-continued
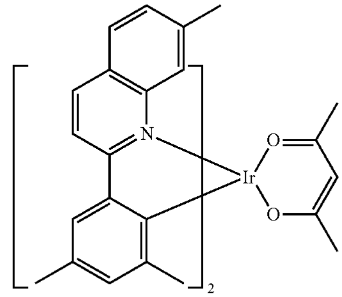
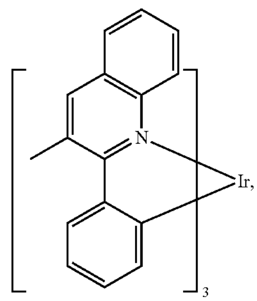
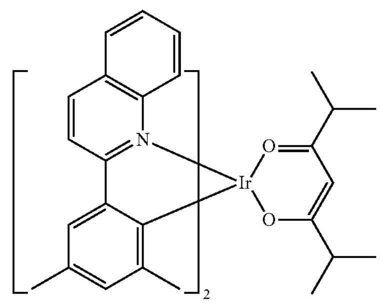
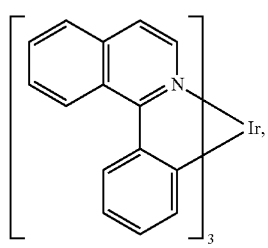
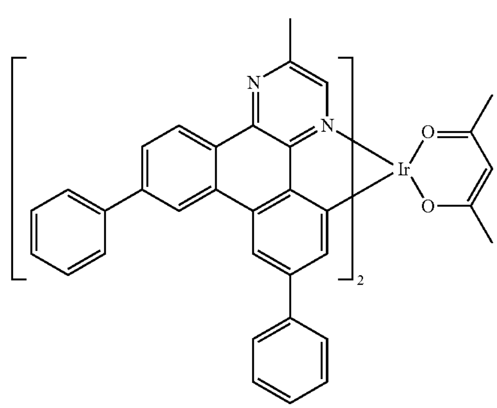

-continued
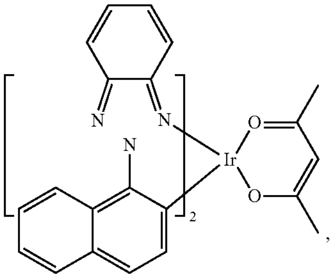
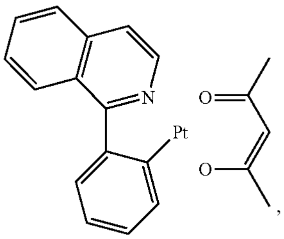
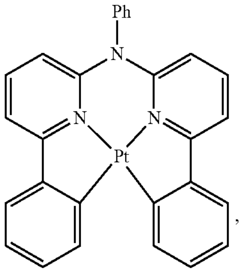
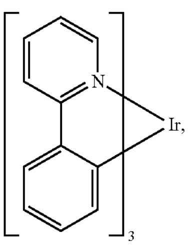
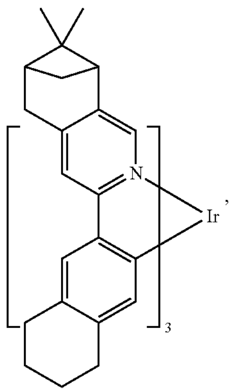
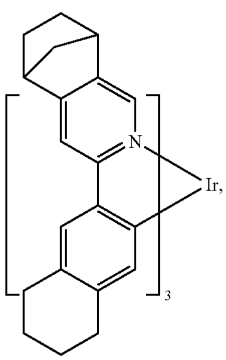
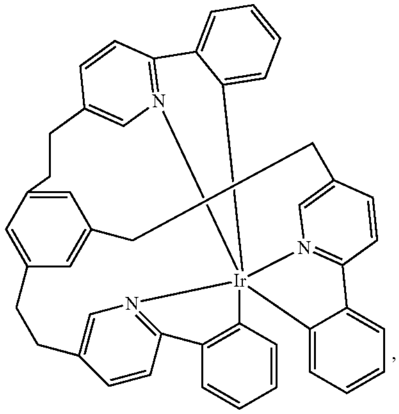
-continued
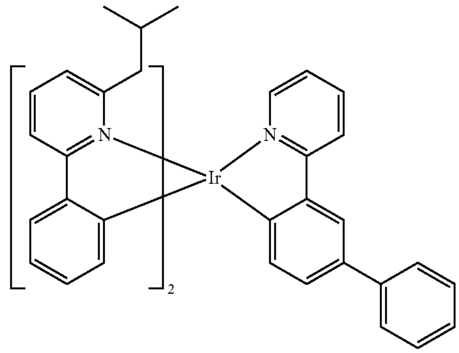
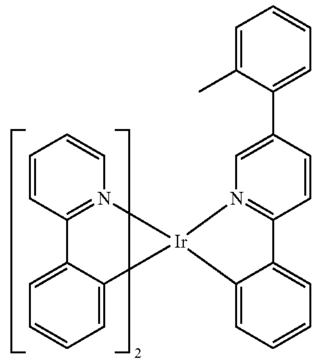
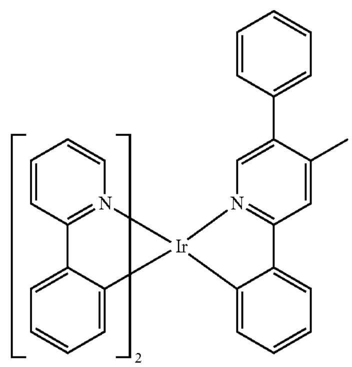
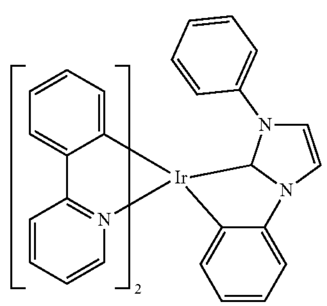
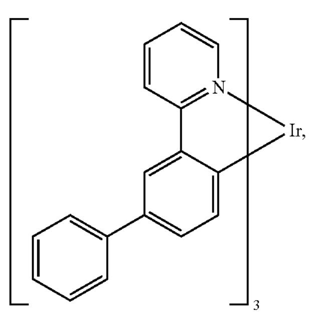
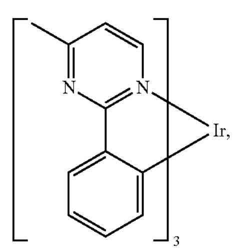

-continued
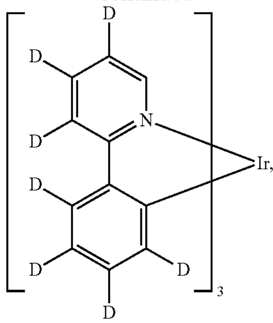
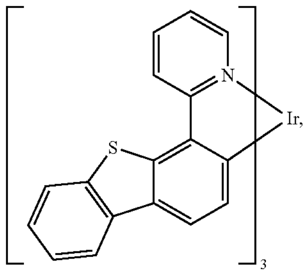
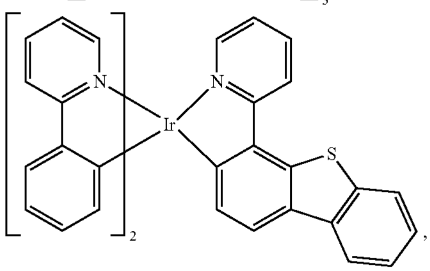
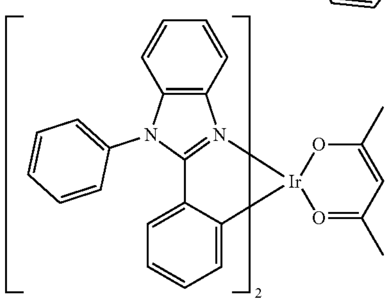
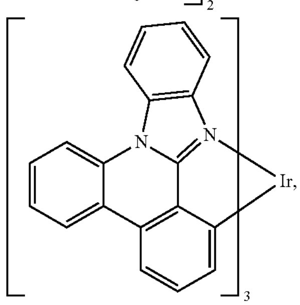
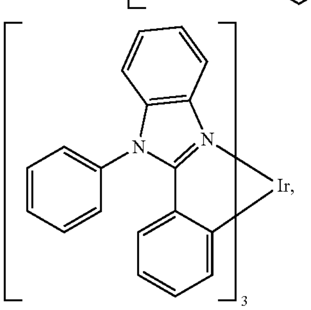
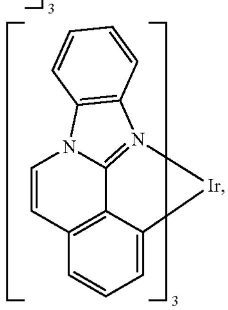
-continued
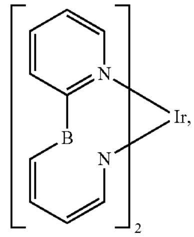
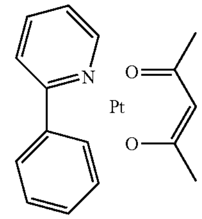
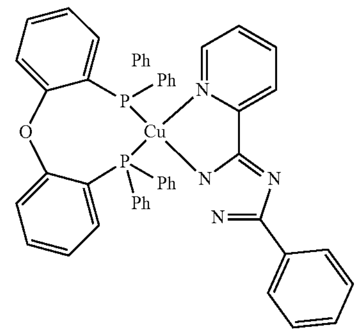
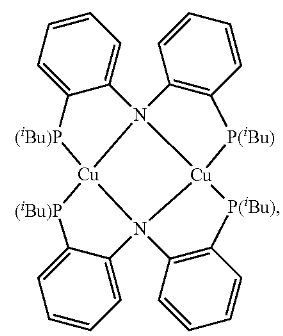
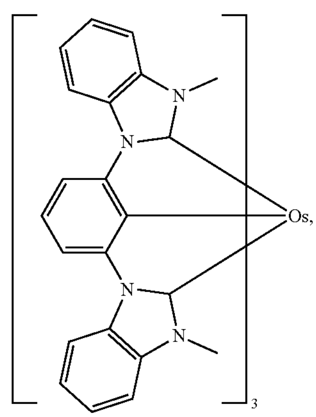
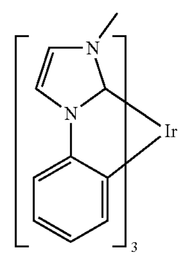
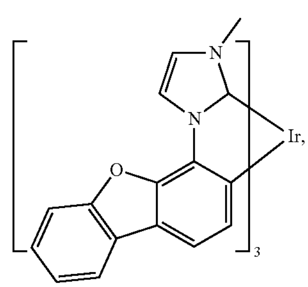

-continued
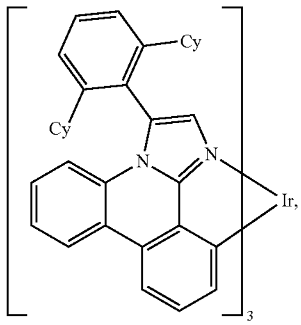
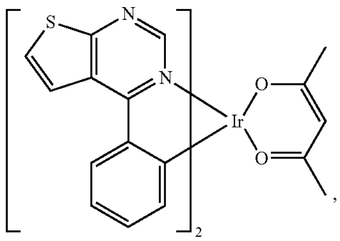
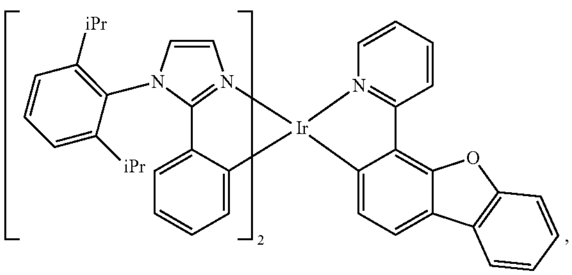
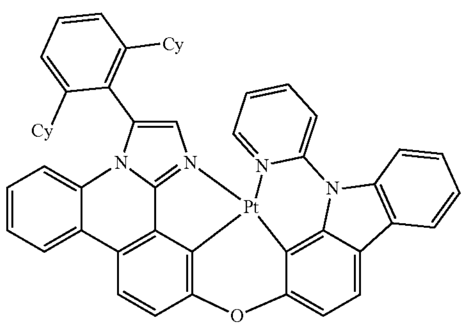
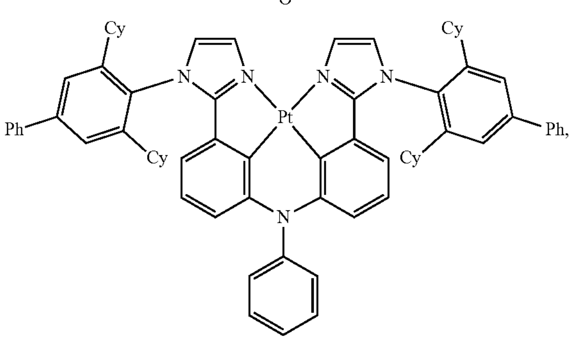
-continued
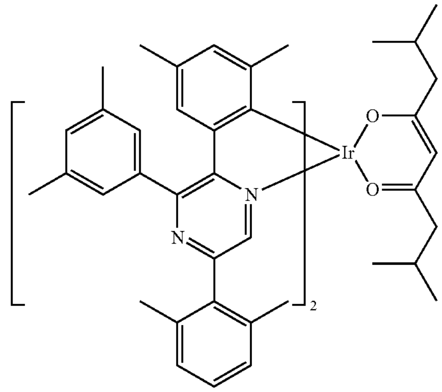
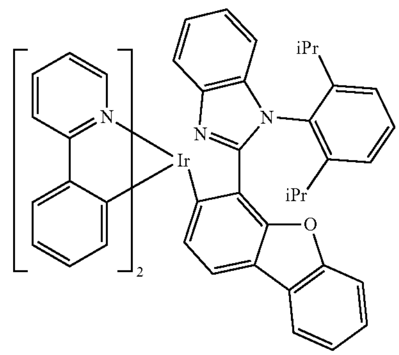
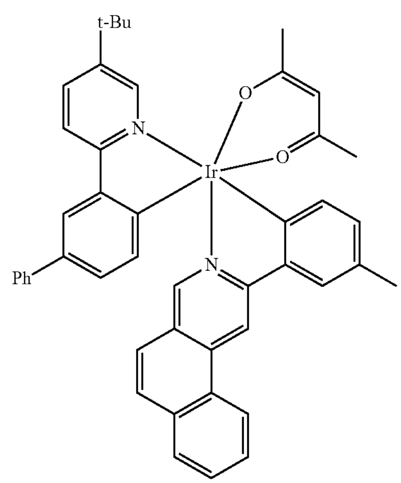
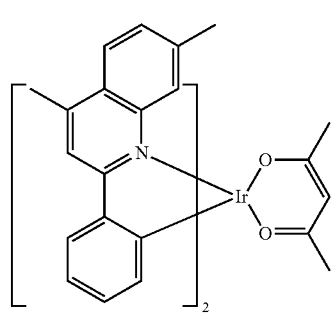

-continued
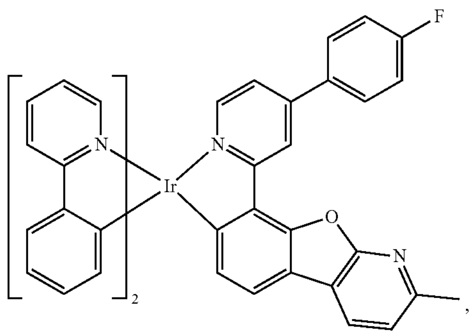
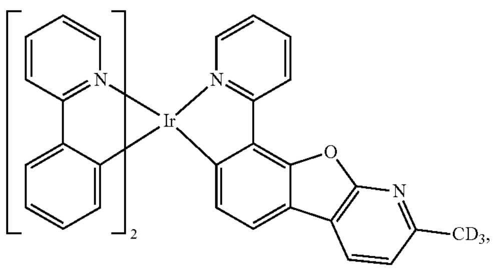
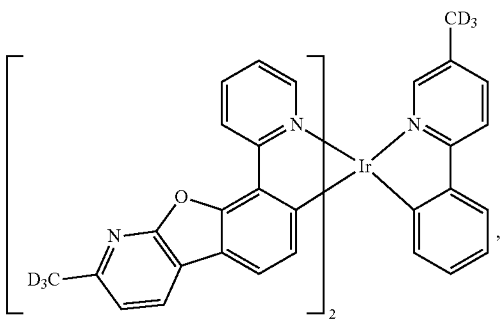
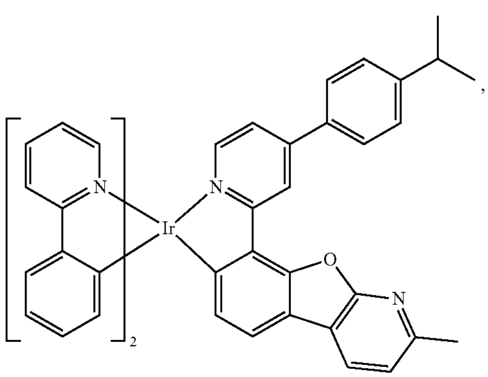
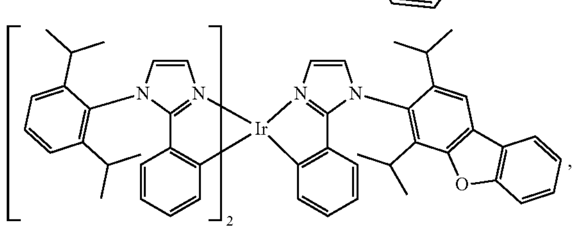
-continued
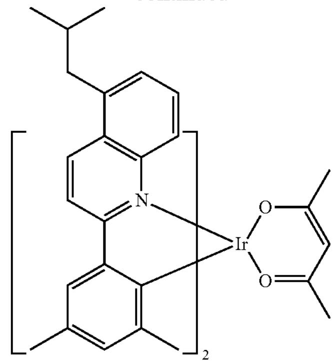
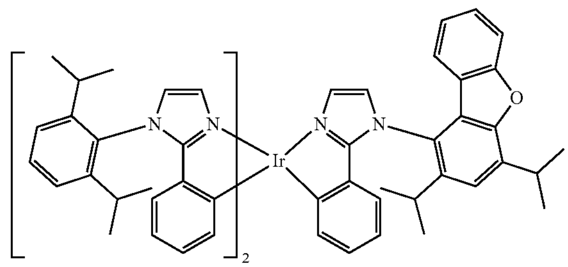
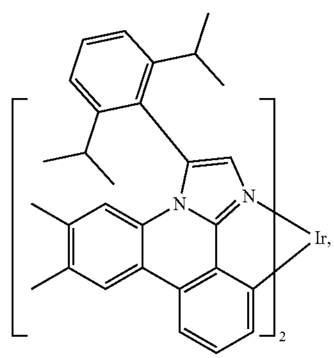
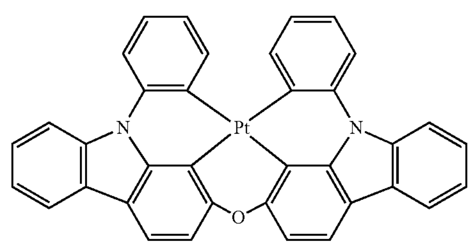
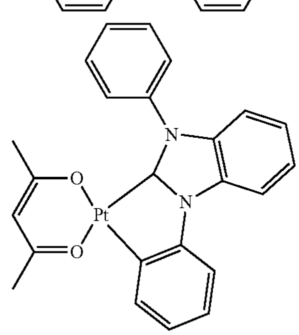

-continued
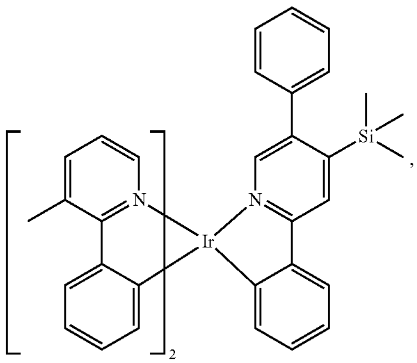
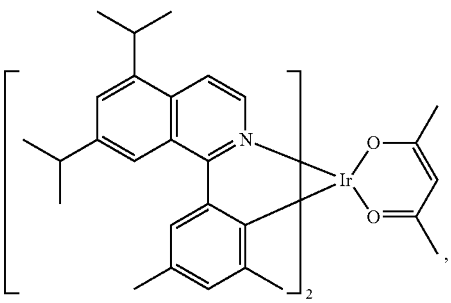
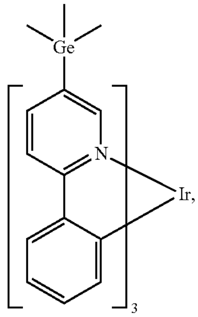
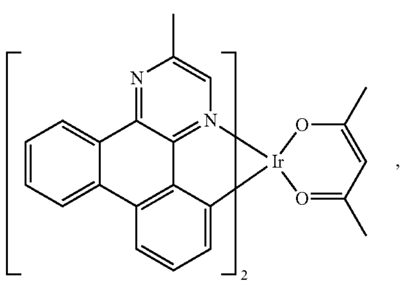
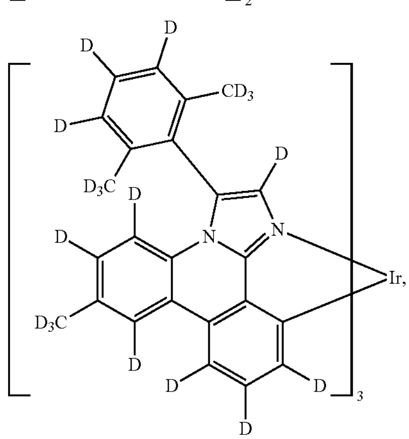
-continued
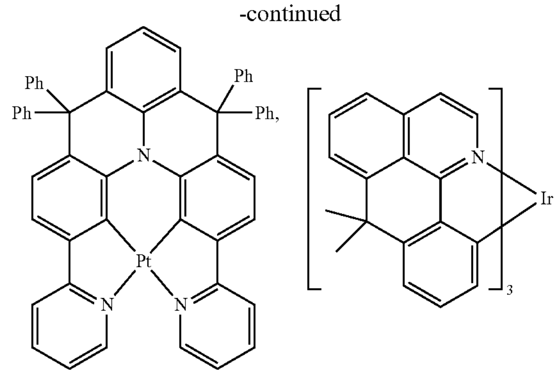
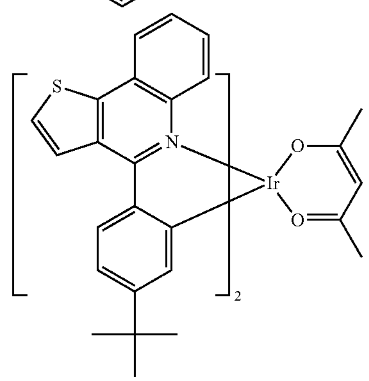
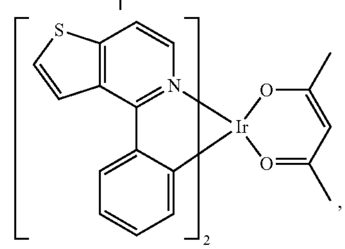
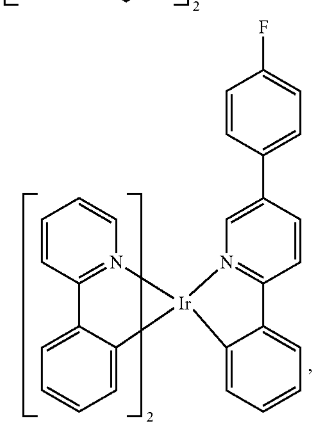
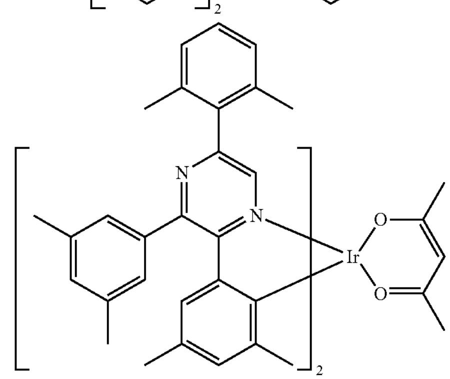

-continued
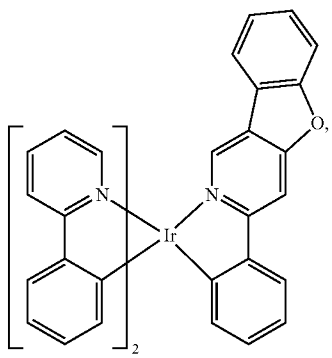
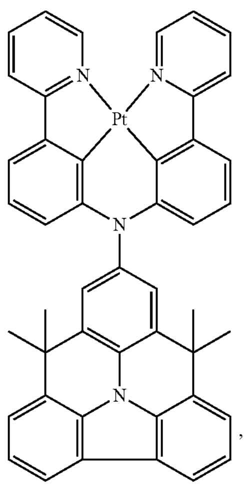
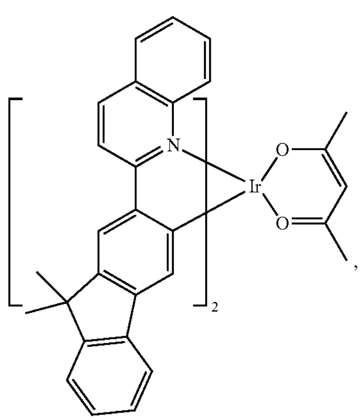
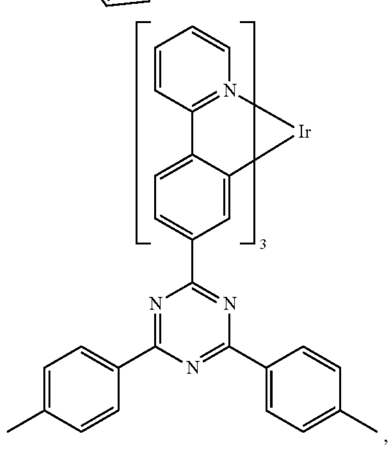
-continued
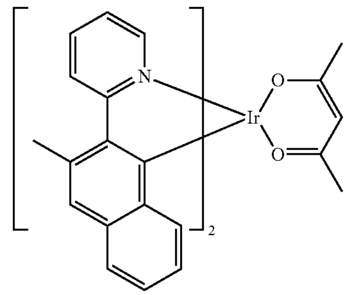
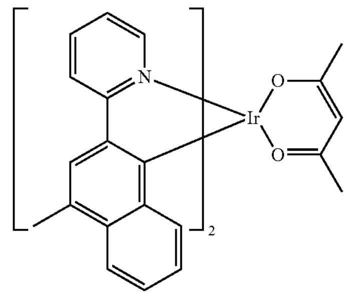
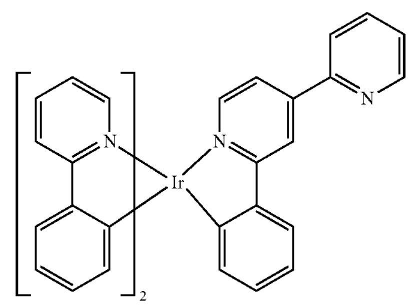
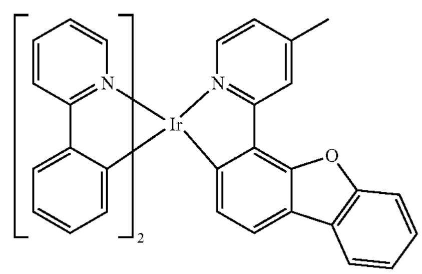
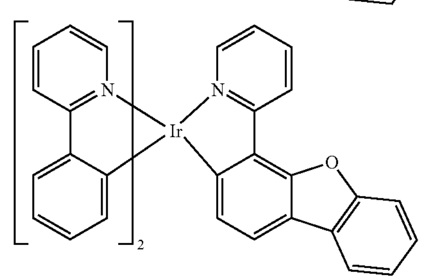
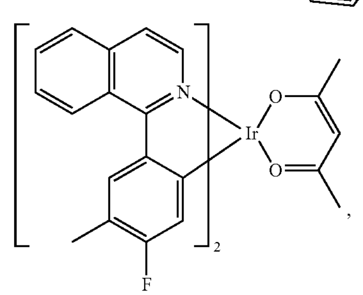

-continued
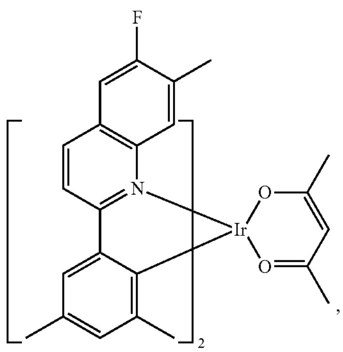
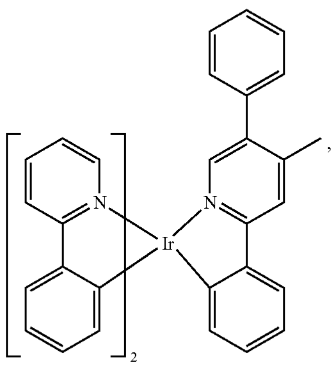
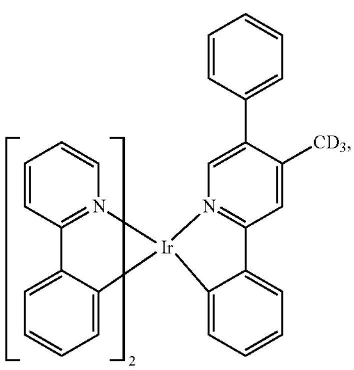
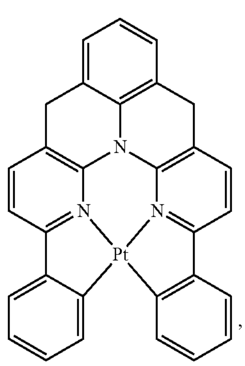
-continued
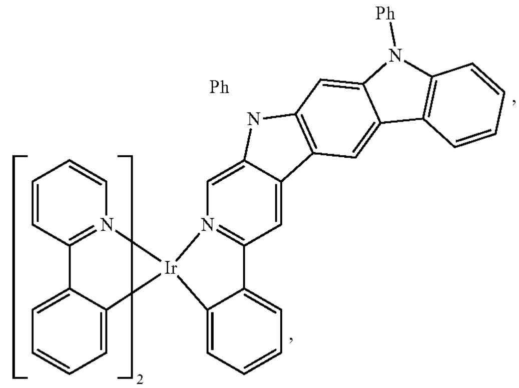
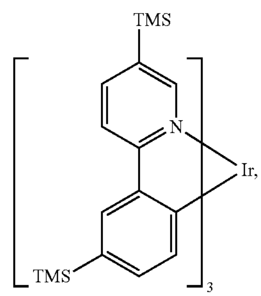
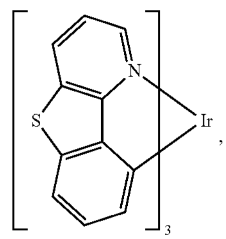
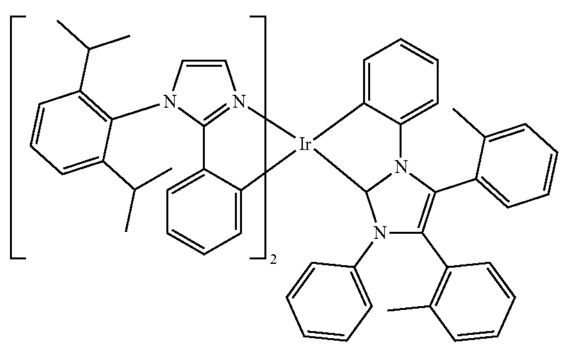
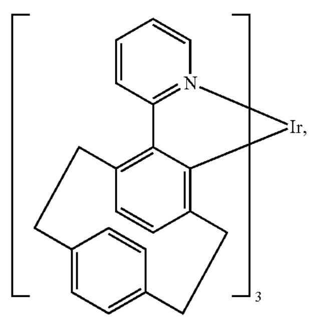
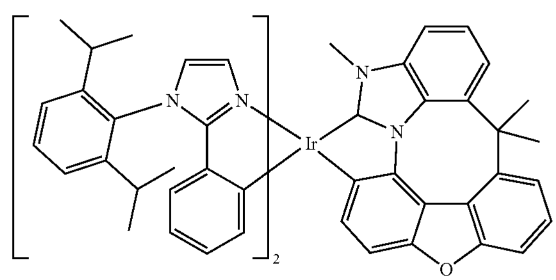

-continued
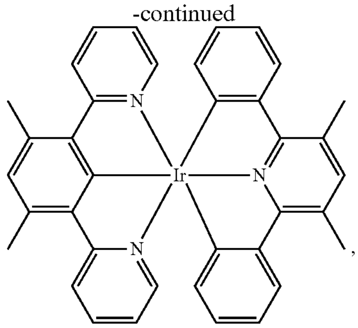
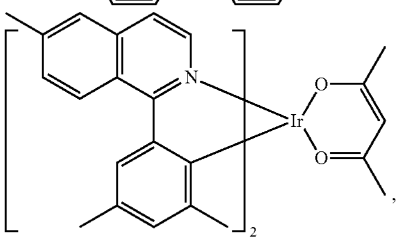
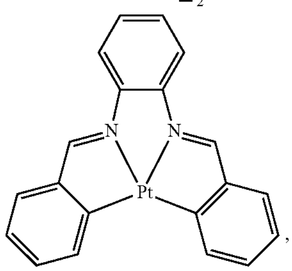
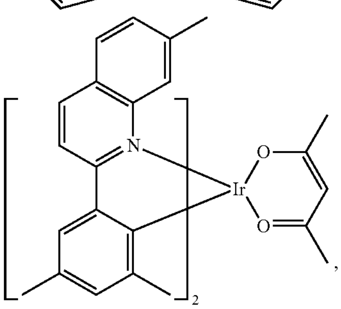
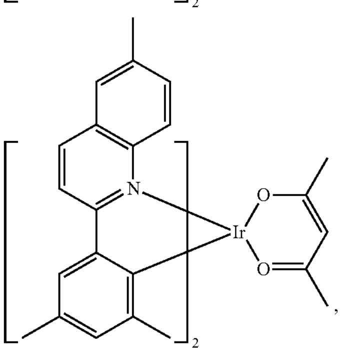
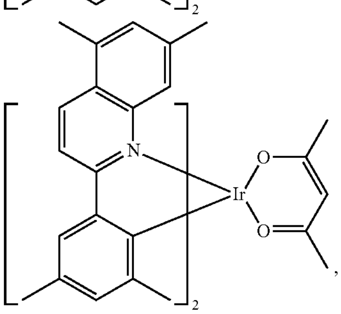
-continued
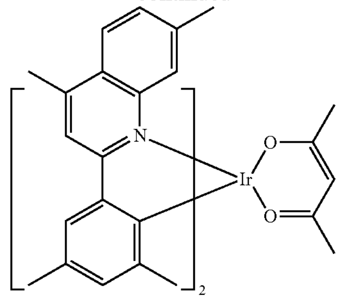
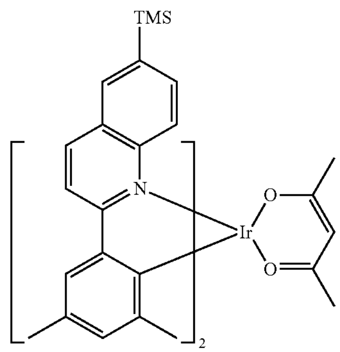
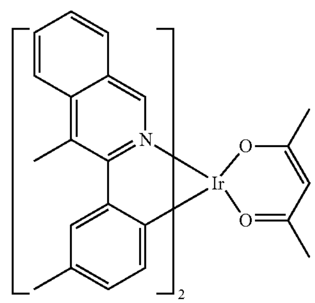
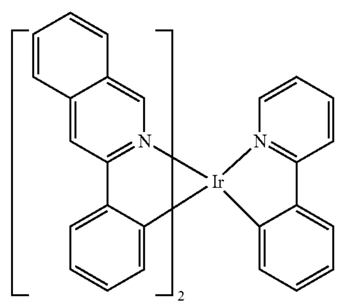
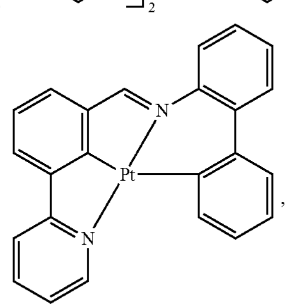

-continued
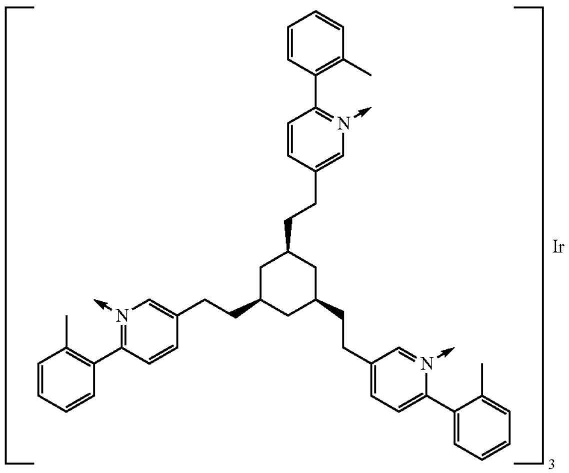
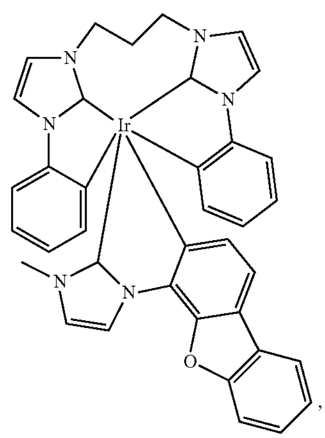
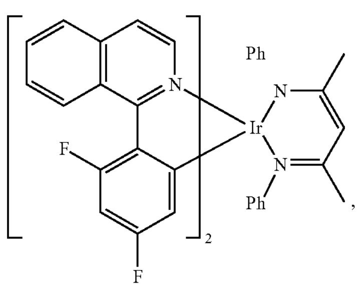
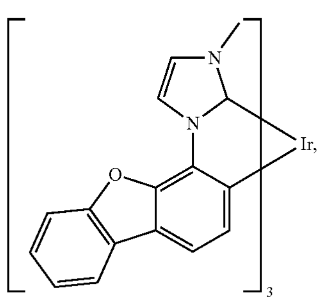
-continued
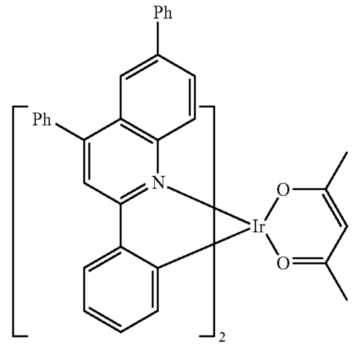
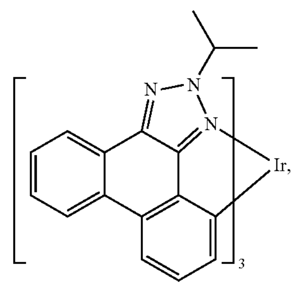
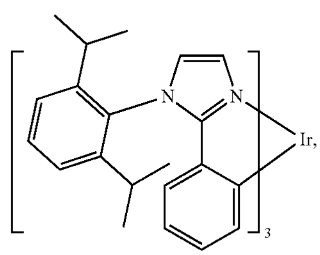
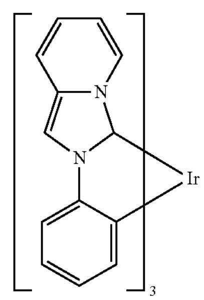
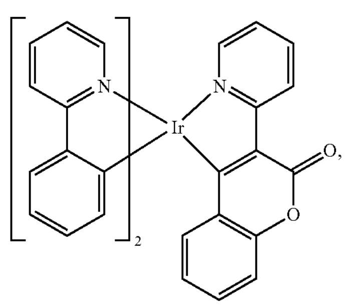
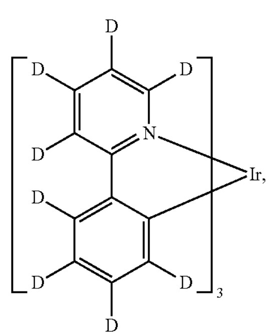
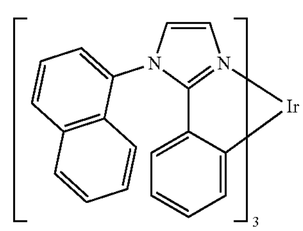

-continued

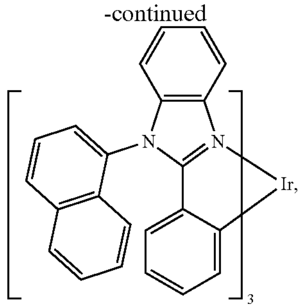

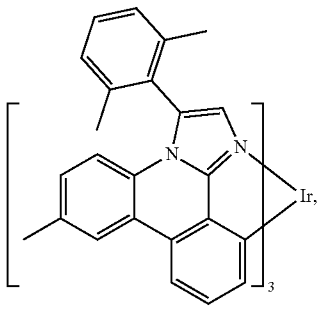

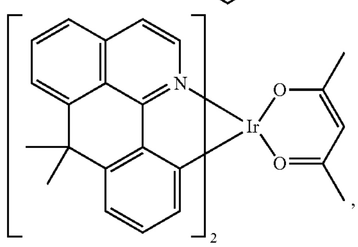

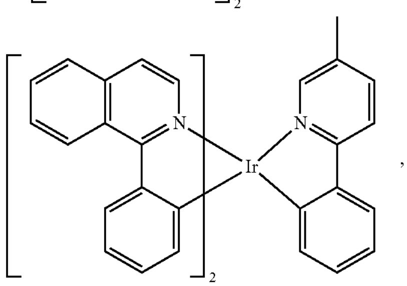

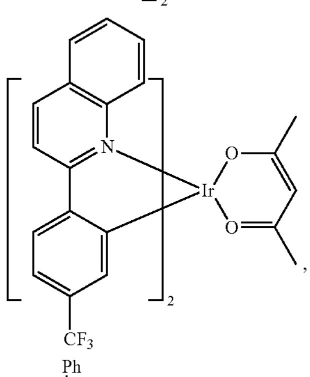

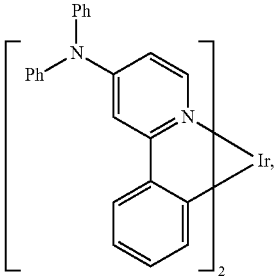

and

-continued

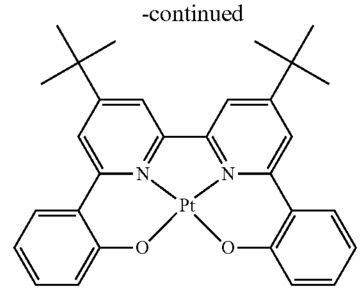

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

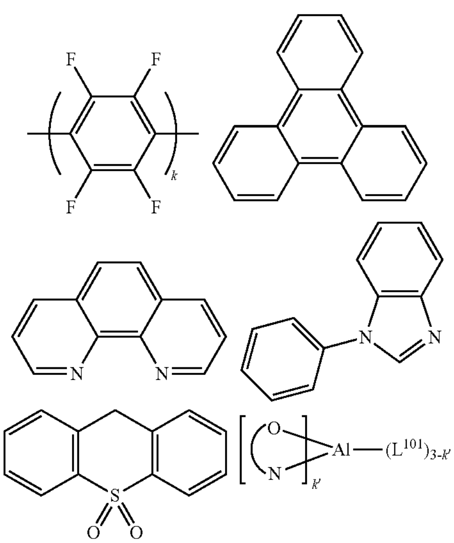

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

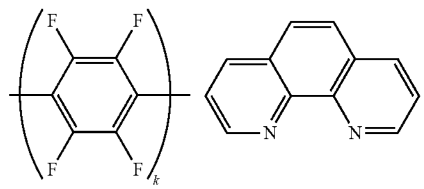

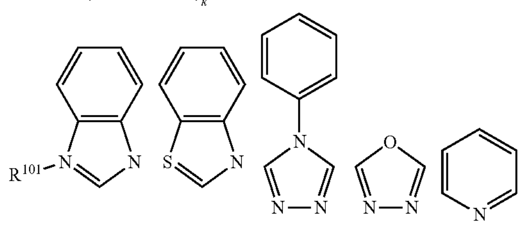

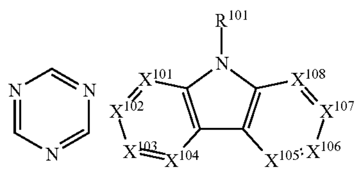

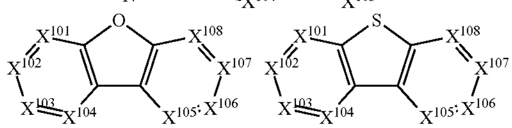

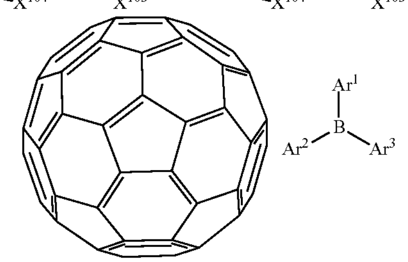

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

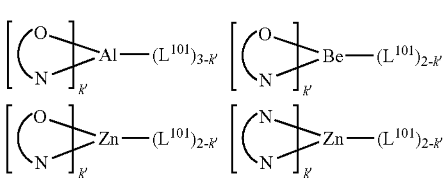

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

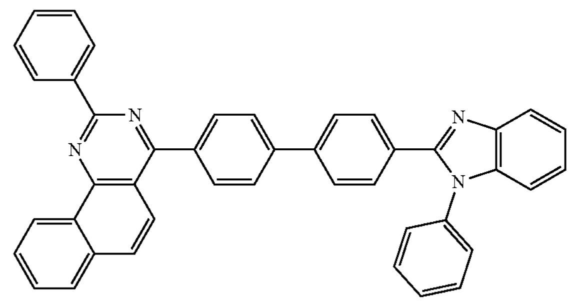
,

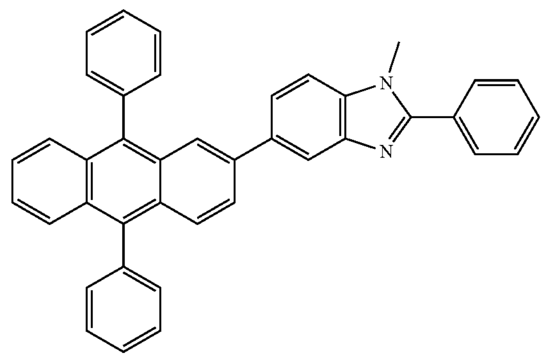
,

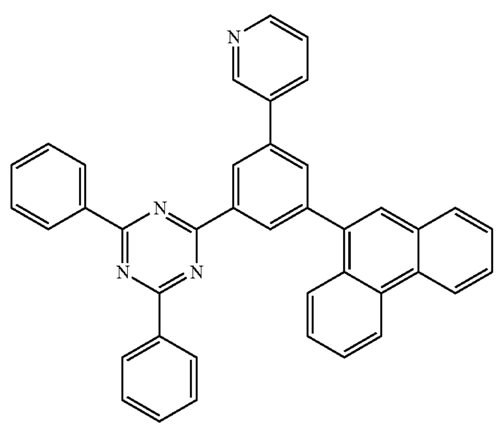
,

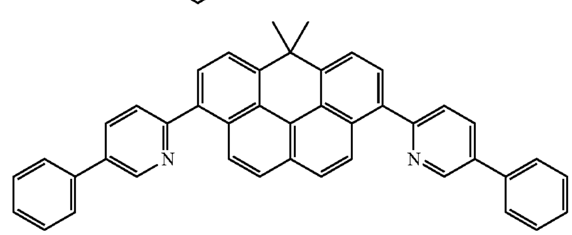
,

-continued
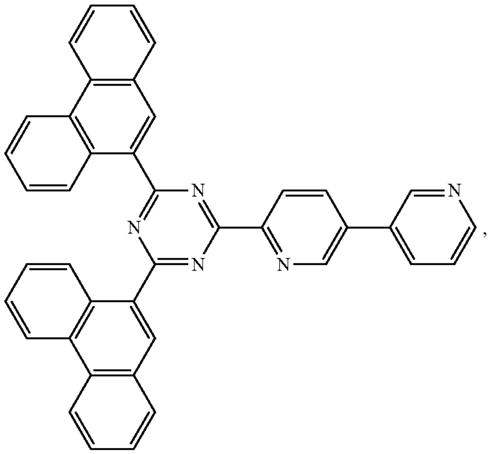
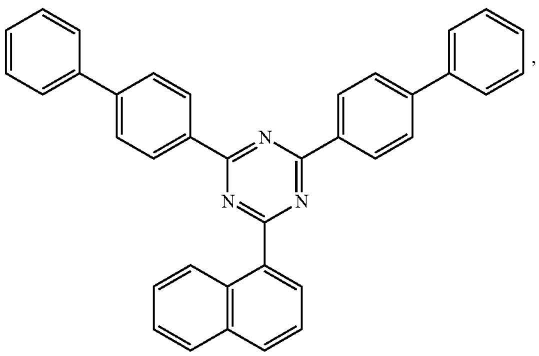
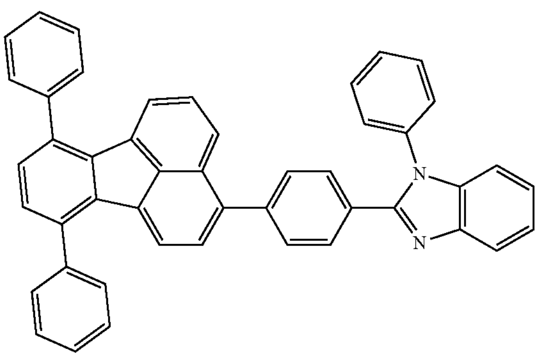
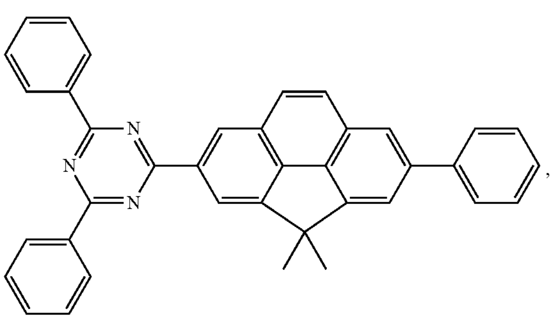
-continued
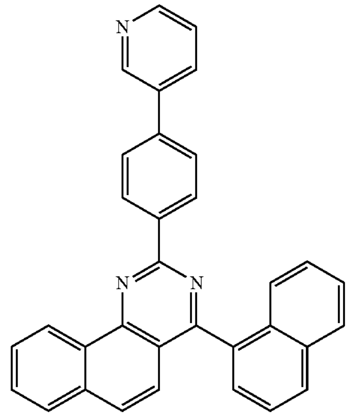
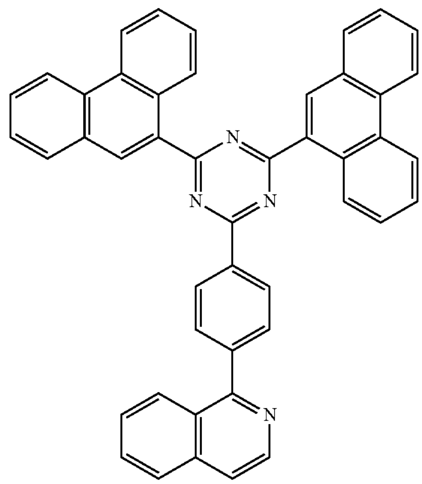
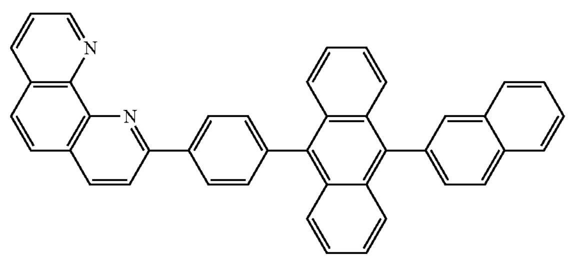
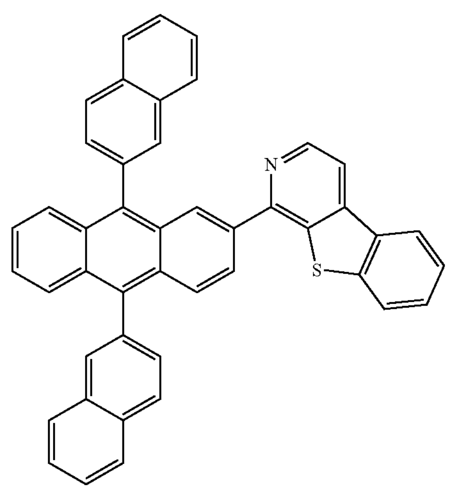

-continued
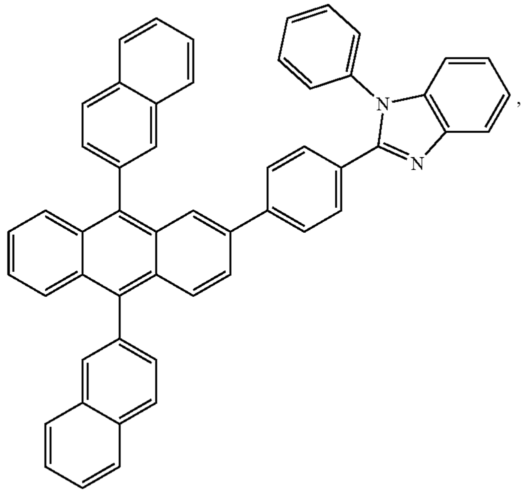
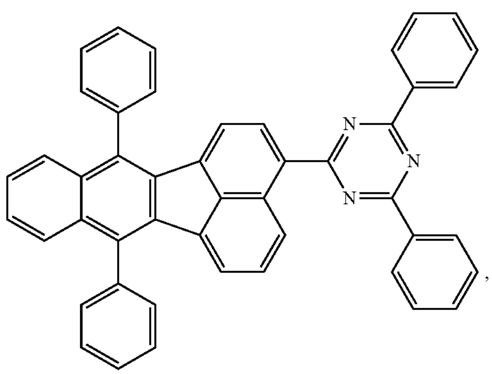
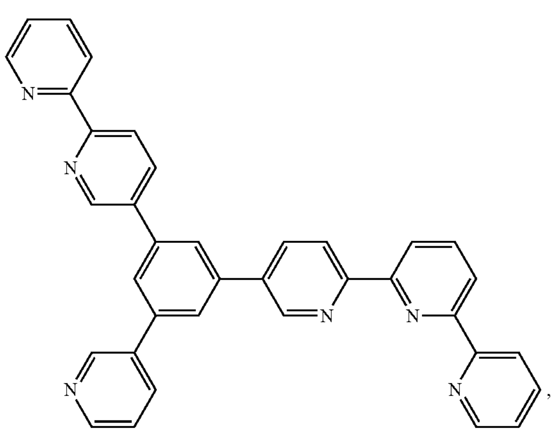
-continued
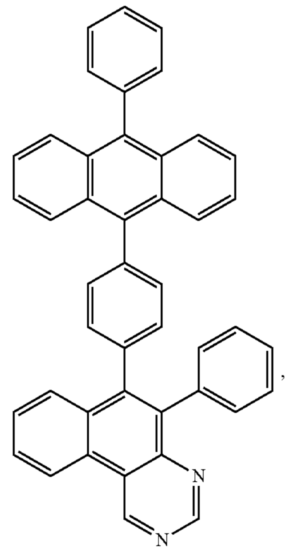
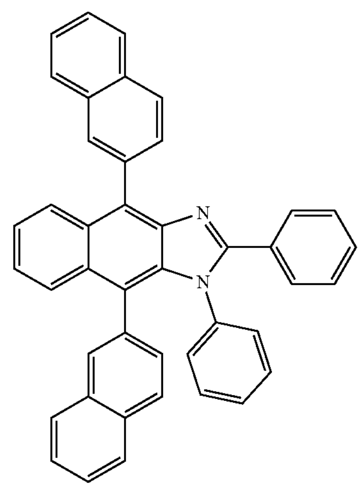
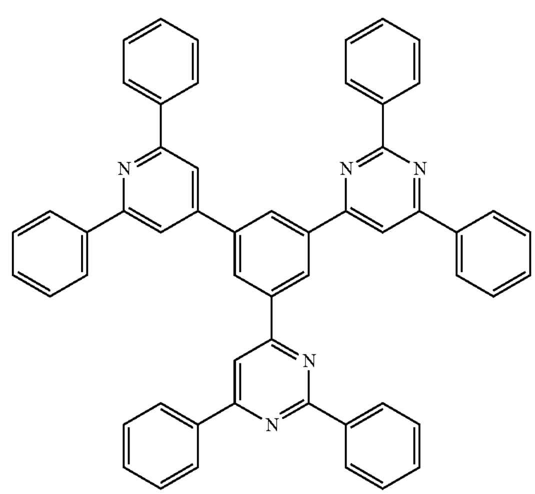

-continued
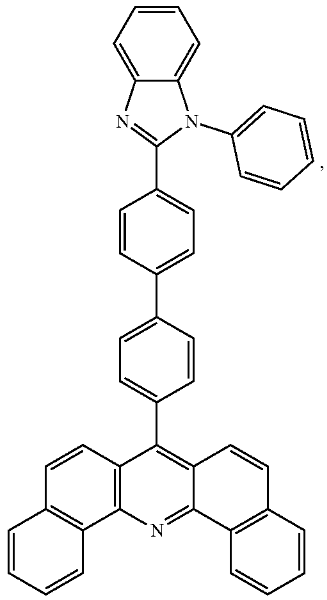
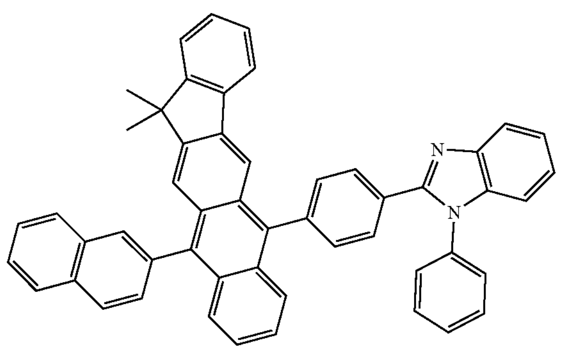
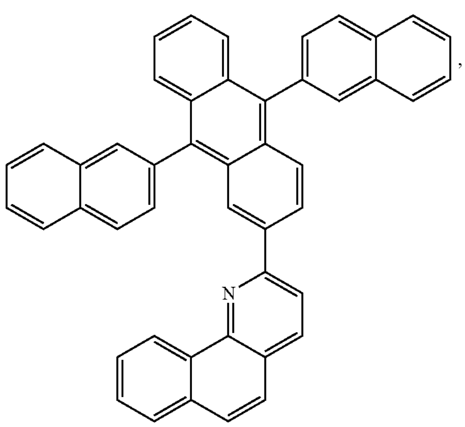
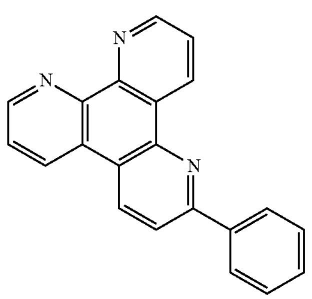
-continued
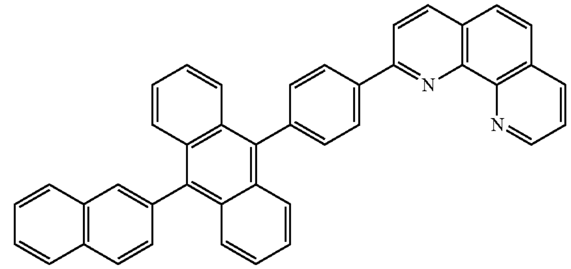
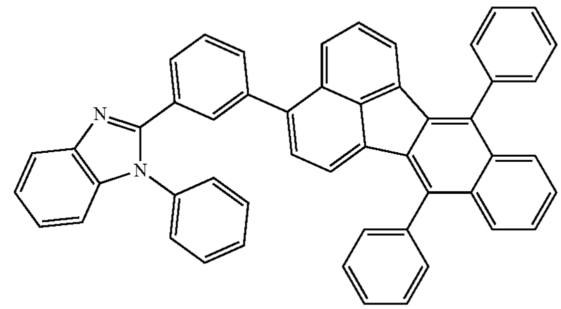
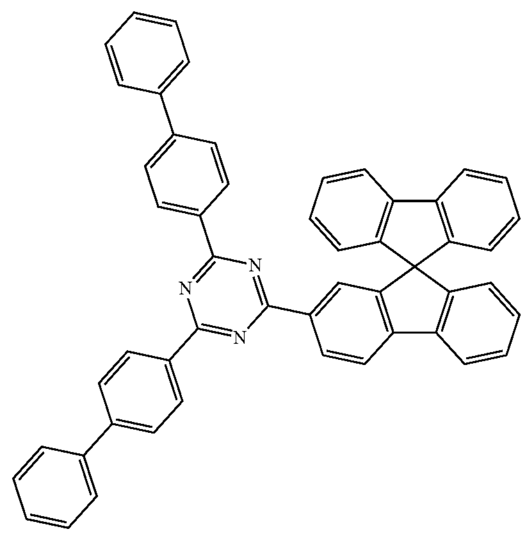
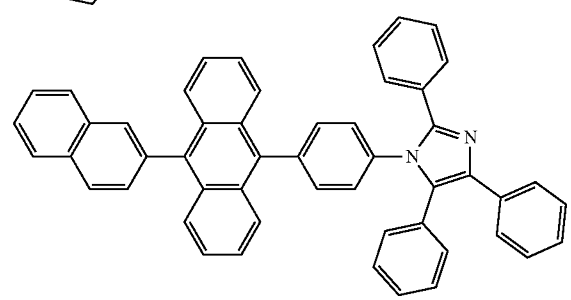
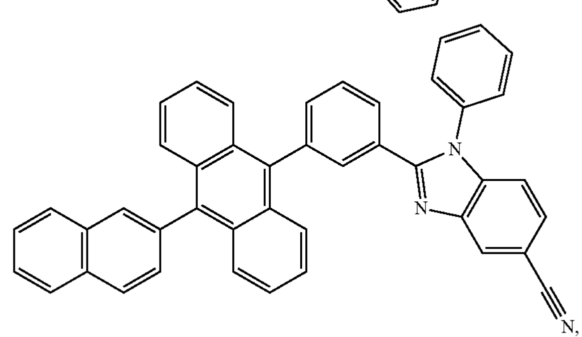

-continued

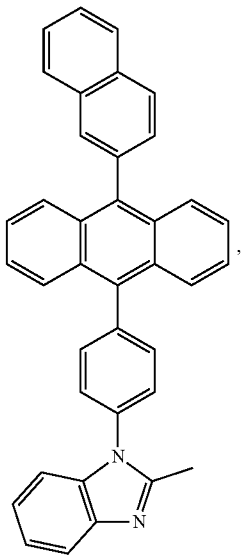

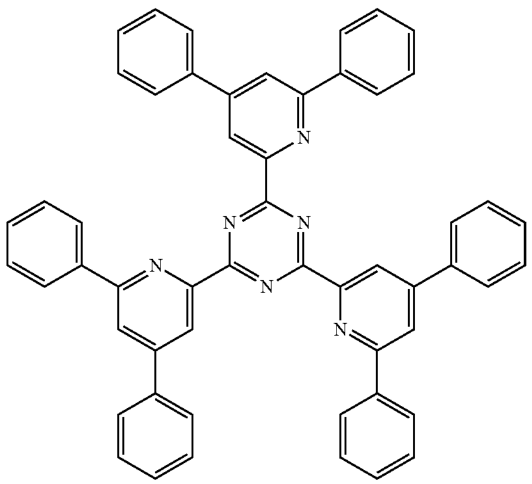

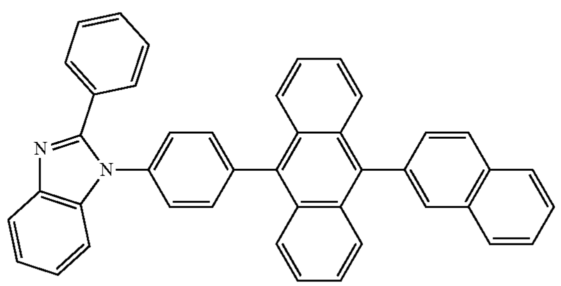

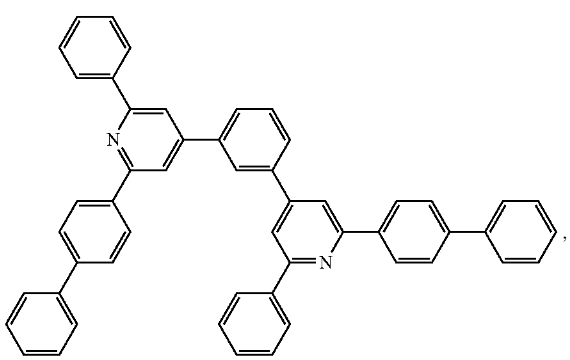

-continued

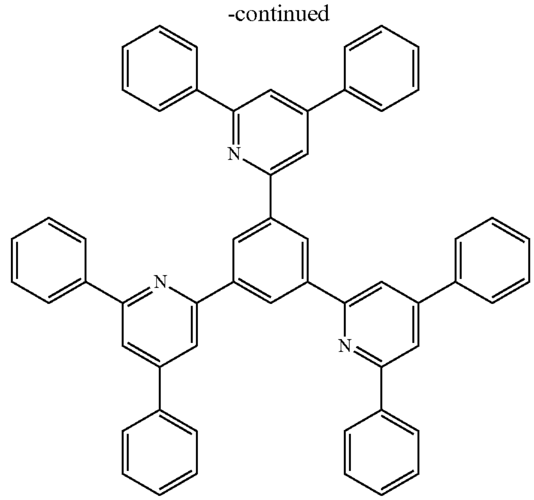

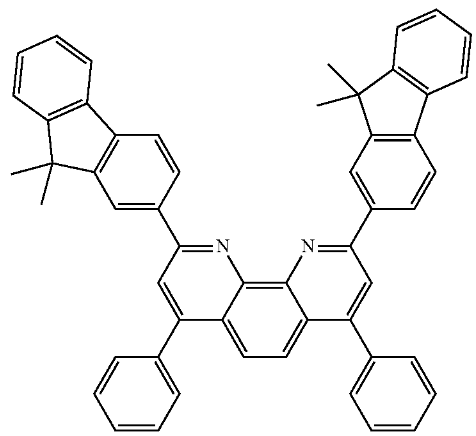

and

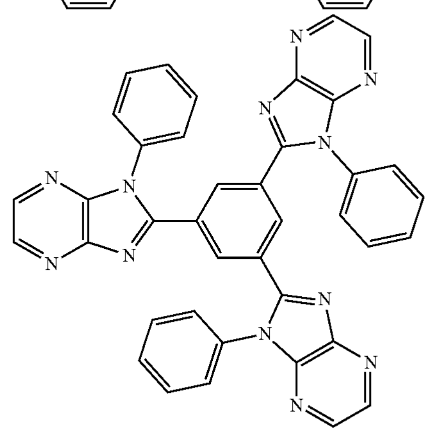

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Synthesis of Compound 20

Synthesis of 2-fluoro-4-(2,4,6-triisopropylphenyl)pyridine

A mixture of (2,4,6-triisopropylphenyl)boronic acid (8.46 g, 34.1 mmol), SPhos-Pd-G2 (0.818 g, 1.136 mmol), SPhos (0.467 g, 1.136 mmol), and potassium phosphate (18.09 g, 85 mmol) was vacuum and back-filled with nitrogen. 4-bromo-2-fluoropyridine (2.92 ml, 28.4 mmol), toluene (80 ml), and water (16 ml) were added to the reaction mixture and refluxed for 18 hrs then partitioned between ethyl acetate (EA) and brine and collected the organic portion. The aqueous layer was extracted with dichloromethane (DCM) and the combined organic extracts were dried with $MgSO_4$ and coated on celite. The product was chromatographed on silica (EA/Hep=1/6) and obtained white solid product (84% yield).

Synthesis of 2-bromo-9-(4-(2,4,6-triisopropylphenyl)pyridin-2-yl)-9H-carbazole A mixture of 2-bromo-9H-carbazole (3 g, 12.19 mmol), 2-fluoro-4-(2,4,6-triisopropylphenyl)pyridine (4.02 g, 13.41 mmol), and potassium carbonate (5.05 g, 36.6 mmol) in DMSO (60 ml) was heated at 150° C. for 48 hrs. The reaction mixture was cooled down and water (80 mL) was added. The solid product was collected by filtration and washed with water. The solid was triturated in EA/MeOH (1/10) and filtered. The off-white solid was dried in the vacuum oven (89% yield).

Synthesis of 3'-chloro-2,4,6-triisopropyl-5'-methoxy-1,1'-biphenyl

A mixture of (3-chloro-5-methoxyphenyl)boronic acid (5 g, 26.8 mmol), $Pd(PPh_3)_4$ (1.240 g, 1.073 mmol), and sodium carbonate (5.69 g, 53.6 mmol) was vacuum and back-filled with nitrogen. 2-bromo-1,3,5-triisopropylbenzene (6.80 ml, 26.8 mmol), Dioxane (75 ml), and water (15 ml) were added to the reaction mixture and refluxed for 18 hrs. The mixture was cooled down, most of dioxane was evaporated and extracted with DCM/brine. The product was chromatographed on silica (DCM/Hep=1/3) and the solvent was evaporated to afford a off-white solid product (66% yield).

Synthesis of 5-chloro-2',4',6'-triisopropyl-[1,1'-biphenyl]-3-ol tribromoborane (29.8 ml, 29.8 mmol) was added to a solution of 3'-chloro-2,4,6-triisopropyl-5'-methoxy-1,1'-biphenyl (3.43 g, 9.94 mmol) under nitrogen in dry DCM (30 ml) at 0° C. and stirred at room temperature (R.T.) for 5 hrs. The reaction was quenched with water slowly. After removing DCM, the white solid was stirred in water/MeOH (10/1) for 3 hrs and filtered (96% yield).

Synthesis of 2-((5-chloro-2',4',6'-triisopropyl-[1,1'-biphenyl]-3-yl)oxy)-9-(4-(2,4,6-triisopropylphenyl)pyridin-2-yl)-9H-carbazole A mixture of 5-chloro-2',4',6'-triisopropyl-[1,1'-biphenyl]-3-ol (1.322 g, 4.00 mmol), 2-bromo-9-(4-(2,4,6-triisopropylphenyl)pyridin-2-yl)-9H-carbazole (2 g, 3.81 mmol), copper(I) iodide (0.145 g, 0.761 mmol), picolinic acid (0.187 g, 1.522 mmol), and potassium phosphate (1.616 g, 7.61 mmol) was vacuum and back-filled with nitrogen. DMSO (20 ml) was added to the reaction mixture and heated at 140° C. for 18 hrs. The mixture was cooled down and water (30 mL) was added. The resulting solid was collected by filtration and washed with water and dissolved in DCM. The product was chromatographed on silica (DCM/Hep=3/1) and the solvent was evaporated to obtain the product (77% yield).

Synthesis of N1-phenyl-N2-(2',4',6'-triisopropyl-5-((9-(4-(2,4,6-triisopropylphenyl)pyridin-2-yl)-9H-carbazol-2-yl)oxy)-[1,1'-biphenyl]-3-yl)benzene-1,2-diamine A mixture of N1-phenylbenzene-1,2-diamine (0.591 g, 3.21 mmol), 2-((5-chloro-2',4',6'-triisopropyl-[1,1'-biphenyl]-3-yl)oxy)-9-(4-(2,4,6-triisopropylphenyl)pyridin-2-yl)-9H-carbazole (2.26 g, 2.91 mmol), (allyl)PdCl-dimer (0.032 g, 0.087 mmol), cBRIDP (0.123 g, 0.350 mmol), and sodium 2-methylpropan-2-olate (0.700 g, 7.29 mmol) was vacuumed and back-filled with nitrogen several times. Toluene (15 ml) was added to the reaction mixture and refluxed for 3 hrs. The reaction mixture was coated on celite and chromatographed on silica (DCM/Hep=2/1) to afford product (75% yield).

Synthesis of 3-phenyl-1-(2',4',6'-triisopropyl-5-((9-(4-(2,4,6-triisopropylphenyl)pyridin-2-yl)-9H-carbazol-2-yl)oxy)-[1,1'-biphenyl]-3-yl)-1H-benzo[d]imidazol-3-ium chloride N1-phenyl-N2-(2',4',6'-triisopropyl-5-((9-(4-(2,4,6-triisopropylphenyl)pyridin-2-yl)-9H-carbazol-2-yl)oxy)-[1,1'-biphenyl]-3-yl)benzene-1,2-diamine (2 g, 2.166 mmol) was dissolved in triethoxymethane (18.01 ml, 108 mmol) and hydrogen chloride (0.213 ml, 2.60 mmol) was added. The reaction mixture was heated at 80° C. for 18 hrs. About half the amount of triehoxymethane was removed by distillation under vacuum until solid appeared. The solid was washed with diethyl ether and filtered (89% yield).

Synthesis of Compound 20

A mixture of 3-phenyl-1-(2',4',6'-triisopropyl-5-((9-(4-(2,4,6-triisopropylphenyl)pyridin-2-yl)-9H-carbazol-2-yl)oxy)-[1,1'-biphenyl]-3-yl)-1H-benzo[d]imidazol-3-ium chloride (1.83 g, 1.887 mmol) and silver oxide (0.219 g, 0.944 mmol) was stirred in 1,2-dichloroethane (25 ml) at R.T. for 18 hrs. After removing 1,2-dichloroethane, $Pt(COD)Cl_2$ (0.706 g, 1.887 mmol) was added and the reaction mixture was vacuumed and back-filled with nitrogen. 1,2-dichlorobenzene (25 ml) was added and heated at 190° C. for 48 hrs. The solvent was removed and coated on celite and chromatographed on silica (DCM/Hep=1/1). The product was triturated in MeOH (81% yield).

Synthesis of Compound 7300

Synthesis 2-(3-(1H-imidazol-1-yl)phenoxy)-9-(4-(2,4,6-triisopropylphenyl)pyridin-2-yl)-9H-carbazole A mixture of 3-(1H-imidazol-1-yl)phenol (0.274 g, 1.708 mmol), 2-bromo-9-(4-(2,4,6-triisopropylphenyl)pyridin-2-yl)-9H-carbazole (0.88 g, 1.674 mmol), copper(I) iodide (0.064 g, 0.335 mmol), picolinic acid (0.082 g, 0.670 mmol), and potassium phosphate (0.711 g, 3.35 mmol) was vacuumed and back-filled with nitrogen several times. DMSO (10 ml) was added to the reaction mixture and heated at 140° C. for 18 hrs. The mixture was cooled down and water (15 mL) was added. The resulting solid was collected by filtration and dissolved in DCM and dried with $MgSO_4$. The product was chromatographed on silica (DCM/EA=3/1) to afford product (63% yield).

Synthesis of 3-(methyl-d3)-1-(3-((9-(4-(2,4,6-triisopropylphenyl)pyridin-2-yl)-9H-carbazol-2-yl)oxy)phenyl)-1H-imidazol-3-ium iodide 2-(3-(1H-imidazol-1-yl)phenoxy)-9-(4-(2,4,6-triisopropylphenyl)pyridin-2-yl)-9H-carbazole (622 mg, 1.028 mmol) was dissolved in EA (10 ml) and iodomethane-d3 (0.320 ml, 5.14 mmol) was added. The reaction mixture was stirred at R.T. for 3 days. The resulting off-white solid was collected by filtration and washed with EA and diethyl ether and dried under vacuum. (77% yield).

Synthesis of Compound 7300

A mixture of 3-(methyl-d3)-1-(3-((9-(4-(2,4,6-triisopropylphenyl)pyridin-2-yl)-9H-carbazol-2-yl)oxy)phenyl)-1H-imidazol-3-ium iodide (0.59 g, 0.787 mmol) and silver oxide (0.091 g, 0.393 mmol) was stirred in 1,2-dichloroethane (12 ml) at R.T. for 18 hrs. After removing 1,2-dichloroethane, $Pt(COD)Cl_2$ (0.294 g, 0.787 mmol) was added and the reaction mixture was vacuumed and back-filled with nitrogen. 1,2-dichlorobenzene (12 ml) was added and heated at 190° C. for 24 hrs. The solvent was removed and coated on celite and chromatrographed on silica (DCM/Hep=2/1). The product was triturated in MeOH and dried in the vacuum oven (57% yield).

Synthesis of Compound 87920

Synthesis of 2-bromo-9-(4-(tert-butyl)pyridin-2-yl)-9H-carbazole

A mixture of 2-bromo-4-(tert-butyl)pyridine (5.65 g, 26.4 mmol), 2-bromo-9H-carbazole (5 g, 20.32 mmol), copper(I) iodide (1.548 g, 8.13 mmol), 1-methyl-1H-imidazole (1.612 ml, 20.32 mmol), and lithium 2-methylpropan-2-olate (3.25 g, 40.6 mmol) was vacuumed and back-filled with nitrogen several times. Toluene (60 ml) was added to the reaction mixture and heated at reflux for 4 hrs. The mixture was cooled down and partitioned between EA and water with ~30 mL 30% $NH_4OH$(aq). The organic layer was separated and the aqueous layer was extracted with DCM. Chromatographed on silica (DCM) (89% yield).

Synthesis of 9-(4-(tert-butyl)pyridin-2-yl)-2-((5-chloro-2',6'-diisopropyl-[1,1'-biphenyl]-3-yl)oxy)-9H-carbazole A mixture of 2-bromo-9-(4-(tert-butyl)pyridin-2-yl)-9H-carbazole (1.5 g, 3.95 mmol), copper(I) iodide (0.151 g, 0.791 mmol), picolinic acid (0.195 g, 1.582 mmol), and potassium carbonate (1.679 g, 7.91 mmol) was vacuum and back-filled with nitrogen. 5-chloro-2',6'-diisopropyl-[1,1'-biphenyl]-3-ol (1.199 g, 4.15 mmol) and DMSO (15 ml) was added to the reaction mixture and heated at 140° C. for 18 hrs. The mixture was cooled down and water (20 mL) was added. The resulting solid was collected by filtration and washed with water and dissolved in DCM. The product was coated on celite and chromatographed on silica (DCM/Hep=4/1) (82% yield).

Synthesis 3'-chloro-2,6-diisopropyl-5'-methoxy-1,1'-biphenyl

A mixture of (3-chloro-5-methoxyphenyl)boronic acid (6 g, 32.2 mmol), $Pd(PPh_3)_4$ (1.488 g, 1.288 mmol), and sodium carbonate (6.82 g, 64.4 mmol) was vacuum and back-filled with nitrogen. 2-bromo-1,3-diisopropylbenzene (6.63 ml, 32.2 mmol), dioxane (75 ml), and water (15 ml) were added to the reaction mixture and refluxed for 16 hrs. The mixture was cooled down and dioxane was removed and extracted with DCM/brine. The product was chromatographed on silica (DCM/Hep=2/3) to obtain a colorless liquid which solidified under vacuum (67% yield).

Synthesis of 5-chloro-2',6'-diisopropyl-[1,1'-biphenyl]-3-ol tribromoborane (42.9 ml, 42.9 mmol) was added to a solution of 3'-chloro-2,6-diisopropyl-5'-methoxy-1,1'-biphenyl (6.5 g, 21.46 mmol) under nitrogen in dry dichloromethane (40 ml) at 0° C. and stirred at R.T. for 5 hrs. The reaction mixture was quenched in an ice bath until some solid appeared. After removing DCM, the resulting white solid was stirred in water for 1 hr and filtered. The product was dried in the vacuum oven overnight (100% yield).

Synthesis N1-(5-((9-(4-(tert-butyl)pyridin-2-yl)-9H-carbazol-2-yl)oxy)-2',6'-diisopropyl-[1,1'-biphenyl]-3-yl)-N2-phenylbenzene-1,2-diamine A mixture of N1-phenylbenzene-1,2-diamine (0.327 g, 1.774 mmol), 9-(4-(tert-butyl)pyridin-2-yl)-2-((5-chloro-2',6'-diisopropyl-[1,1'-biphenyl]-3-yl)oxy)-9H-carbazole (0.947 g, 1.613 mmol), (allyl)PdCl-dimer (0.018 g, 0.048 mmol), cBRIDP (0.068 g, 0.194 mmol), and sodium 2-methylpropan-2-olate (0.387 g, 4.03 mmol) was vacuumed and back-filled with nitrogen several times. Toluene (10 ml) was added to the reaction mixture and refluxed for 3 hrs. The reaction mixture was coated on celite and chromatographed on silica (DCM/Hep=5/1 to 8/1) (75% yield).

Synthesis 1-(5-((9-(4-(tert-butyl)pyridin-2-yl)-9H-carbazol-2-yl)oxy)-2',6'-diisopropyl-[1,1'-biphenyl]-3-yl)-3-phenyl-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-phenylbenzene-1,2-diamine (0.89 g, 1.211 mmol) was dissolved in triethoxymethane (10.07 ml, 60.5 mmol) and hydrogen chloride (0.119 ml, 1.453 mmol) was added. The reaction mixture was heated at 80° C. for 16 hrs. The mixture was cooled down and the solid was washed with diethyl ether and filtered and dried in the vacuum oven (85% yield).

Synthesis of Compound 87920

A mixture of 1-(5-((9-(4-(tert-butyl)pyridin-2-yl)-9H-carbazol-2-yl)oxy)-2',6'-diisopropyl-[1,1'-biphenyl]-3-yl)-3-phenyl-1H-benzo[d]imidazol-3-ium chloride (0.8 g, 1.024 mmol) and silver oxide (0.119 g, 0.512 mmol) was stirred in 1,2-dichloroethane (10 ml) at R.T. for 16 hrs. After removing 1,2-dichloroethane, Pt(COD)$Cl_2$ (0.383 g, 1.024 mmol) was added and the reaction mixture was vacuumed and back-filled with nitrogen. 1,2-dichlorobenzene (10 ml) was added and heated at 190° C. for 5 days. The solvent was removed and coated on celite and chromatographed on silica (DCM/Hep=1/1). The product was triturated in MeOH and dried in the vacuum oven (62% yield).

Synthesis of Compound 95050

Synthesis of 9-(4-(tert-butyl)pyridin-2-yl)-2-methoxy-9H-carbazole

A mixture of 4-(tert-butyl)-2-chloropyridine (1.720 g, 10.14 mmol), 2-methoxy-9H-carbazole (2 g, 10.14 mmol), (allyl)PdCl-dimer (0.074 g, 0.203 mmol), and cBRIDP (0.286 g, 0.811 mmol) was vacuumed and back-filled with nitrogen several times. Toluene (30 ml) was added and the reaction mixture was refluxed for 4 hrs, partitioned between EA/water and extracted. The aqueous layer was extracted with DCM, then coated on celite and chromatographed on silica (DCM/EA=30/1) (81% yield).

Synthesis of 9-(4-(tert-butyl)pyridin-2-yl)-9H-carbazol-2-ol 9-(4-(tert-butyl)pyridin-2-yl)-2-methoxy-9H-carbazole (2.72 g, 8.23 mmol) was heated in hydrogen bromide (46.6 ml, 412 mmol) at 140° C. (oil temp) for 1 hr. The mixture was cooled down and partitioned between DCM and water and extracted with DCM. The DCM layer was washed with $NaHCO_3$(sat). Evaporation of organic solvent to obtain light yellow solid (86% yield).

Synthesis of 9-(4-(tert-butyl)pyridin-2-yl)-9H-carbazol-2-ol

A mixture of 1H-benzo[d]imidazole (3 g, 25.4 mmol), 1-bromo-3-iodobenzene (3.89 ml, 30.5 mmol), copper(I) iodide (0.484 g, 2.54 mmol), 1,10-phenanthroline (0.458 g, 2.54 mmol), and potassium carbonate (4.21 g, 30.5 mmol) was heated in DMF (70 ml) at 150° C. for 16 hrs. The mixture was cooled down and poured in cold water and extracted with DCM (insoluble salts were removed by filtration). Chromatographed on silica (EA/DCM=2/1) to obtain pale yellow tacky oil which solidified under vacuum overnight (59% yield).

Synthesis of 2-(3-(1H-benzo[d]imidazol-1-yl)phenoxy)-9-(4-(tert-butyl)pyridin-2-yl)-9H-carbazole A mixture of 1-(3-bromophenyl)-1H-benzo[d]imidazole (1.295 g, 4.74 mmol), 9-(4-(tert-butyl)pyridin-2-yl)-9H-carbazol-2-ol (1.5 g, 4.74 mmol), copper(I) iodide (0.181 g, 0.948 mmol), picolinic acid (0.233 g, 1.896 mmol), and potassium phosphate (2.013 g, 9.48 mmol) was vacuumed and back-filled with nitrogen several times. DMSO (15 ml) was added to the reaction mixture and heated at 140° C. for 16 hrs. The mixture was cooled down and water (20 mL) was added. The resulting solid was collected by filtration and dissolved in DCM and dried with $MgSO_4$. Chromatographed on silica (EA/DCM=1/1) (71% yield).

Synthesis of 1-(3-((9-(4-(tert-butyl)pyridin-2-yl)-9H-carbazol-2-yl)oxy)phenyl)-3-(methyl-d3)-1H-benzo[d]imidazol-3-ium iodide (SC2017-4-024)

A mixture of 2-(3-(1H-benzo[d]imidazol-1-yl)phenoxy)-9-(4-(tert-butyl)pyridin-2-yl)-9H-carbazole (0.75 g, 1.475 mmol) and iodomethane-d3 (0.459 ml, 7.37 mmol) was refluxed in Acetonitrile (15 ml) for 3 days. The solvent was removed and triturated in EA (100% yield).

Synthesis of Compound 95050

A mixture of 1-(3-((9-(4-(tert-butyl)pyridin-2-yl)-9H-carbazol-2-yl)oxy)phenyl)-3-(methyl-d3)-1H-benzo[d]imidazol-3-ium iodide (1 g, 1.530 mmol) and silver oxide (0.177 g, 0.765 mmol) was stirred in 1,2-dichloroethane (15 ml) at R.T. for 16 hrs. After removing 1,2-dichloroethane, Pt(COD)$Cl_2$ (0.572 g, 1.530 mmol) was added and the reaction mixture was vacuumed and back-filled with nitrogen. 1,2-dichlorobenzene (15 ml) was added and heated at 190° C. for 3 days. The solvent was removed and coated on celite and chromatrographed on silica (DCM/Hep=2/1). The product was triturated in MeOH and dried in the vacuum oven (7% yield).

Synthesis of Compound 226820

Synthesis of 2-bromo-9-(pyridin-2-yl)-9H-carbazole

A mixture of 2-bromo-9H-carbazole (8 g, 32.5 mmol), 2-fluoropyridine (5.59 ml, 65.0 mmol), and potassium carbonate (13.48 g, 98 mmol) in DMSO (80 ml) was heated at 140° C. for 16 hrs. The mixture was cooled down, then the reaction mixture was extracted with EA and water and the organic portion was washed with brine and concentrated. The product solidified under vacuum (100% yield).

Synthesis of 2-(3-chlorophenoxy)-9-(pyridin-2-yl)-9H-carbazole

A mixture of 2-bromo-9-(pyridin-2-yl)-9H-carbazole (2.05 g, 6.34 mmol), copper(I) iodide (0.242 g, 1.269 mmol), picolinic acid (0.312 g, 2.54 mmol), and potassium carbonate (2.69 g, 12.69 mmol) was vacuum and back-filled with nitrogen. 3-chlorophenol (0.703 ml, 6.66 mmol) and DMSO (30 ml) was added to the reaction mixture and heated at 140° C. for 16 hrs. The mixture was cooled down and partitioned between EA and water and extracted with EA. The organic extracts were washed with brine and concentrated, then chromatographed on silica (DCM) (75% yield).

Synthesis of N1-phenyl-N2-(3-((9-(pyridin-2-yl)-9H-carbazol-2-yl)oxy)phenyl)benzene-1,2-diamine A mixture of N1-phenylbenzene-1,2-diamine (0.820 g, 4.45 mmol), 2-(3-chlorophenoxy)-9-(pyridin-2-yl)-9H-carbazole (1.5 g, 4.04 mmol), (allyl)PdCl-dimer (0.044 g, 0.121 mmol), cBRIDP (0.171 g, 0.485 mmol), and sodium 2-methylpropan-2-olate (0.972 g, 10.11 mmol) was vacuumed and back-filled with nitrogen several times. Toluene (15 ml) was added to the reaction mixture and refluxed for 3 hrs. The product was coated on celite and chromatographed on silica (EA/Hep=1/2) (66% yield).

Synthesis of 3-phenyl-1-(3-((9-(pyridin-2-yl)-9H-carbazol-2-yl)oxy)phenyl)-1H-benzo[d]imidazol-3-ium chloride N1-phenyl-N2-(3-((9-(pyridin-2-yl)-9H-carbazol-2-yl)oxy)phenyl)benzene-1,2-diamine (1.4 g, 2.70 mmol) was dissolved in triethoxymethane (22.45 ml, 135 mmol) and hydrogen chloride (0.266 ml, 3.24 mmol) was added. The reaction mixture was heated at 80° C. for 30 min. The mixture was cooled down and diethyl ether (~50 mL, solid appeared) was added to the reaction mixture and stirred for 5 hrs. The product was collected by filtration and was washed with diethyl ether and dried in the vacuum oven (75% yield).

Synthesis of 226820

A mixture of 3-phenyl-1-(3-((9-(pyridin-2-yl)-9H-carbazol-2-yl)oxy)phenyl)-1H-benzo[d]imidazol-3-ium chloride (1.14 g, 2.017 mmol) and silver oxide (0.234 g, 1.009 mmol) was stirred in 1,2-dichloroethane (25 ml) at R.T. for 16 hrs. After removing 1,2-dichloroethane, $Pt(COD)Cl_2$ (0.755 g, 2.017 mmol) was added and the reaction mixture was vacuumed and back-filled with nitrogen. 1,2-dichlorobenzene (25 ml) was added and heated at 190° C. for 48 hrs. The solvent was removed and coated on celite and chromatrographed on silica (DCM/Hep=2/1). The product was triturated in MeOH and dried in the vacuum oven (50% yield).

Synthesis of Compound 8217421

Synthesis of 1-(3-(3-(4-(2,6-diisopropylphenyl)-1H-pyrazol-1-yl)phenoxy)phenyl)-1H-benzo[d]imidazole A mixture of 1-(3-bromophenyl)-1H-benzo[d]imidazole (0.8 g, 2.93 mmol), 3-(4-(2,6-diisopropylphenyl)-1H-pyrazol-1-yl)phenol (0.939 g, 2.93 mmol), copper(I) iodide (0.112 g, 0.586 mmol), picolinic acid (0.144 g, 1.172 mmol), and potassium phosphate (1.243 g, 5.86 mmol) was vacuumed and back-filled with nitrogen several times. DMSO (12 ml) was added to the reaction mixture and heated at 140° C. for 16 hrs. The mixture was cooled down and water (20 mL) was added. The resulting solid was collected by filtration and dissolved in DCM and dried with $MgSO_4$. The product was coated on celite and chromatographed on silica (EA/DCM=1/4) (66% yield).

Synthesis of 1-(3-(3-(4-(2,6-diisopropylphenyl)-1H-pyrazol-1-yl)phenoxy)phenyl)-3-(methyl-d3)-1H-benzo[d]imidazol-3-ium iodide 1-(3-(3-(4-(2,6-diisopropylphenyl)-1H-pyrazol-1-yl)phenoxy)phenyl)-1H-benzo[d]imidazole (0.987 g, 1.925 mmol) was dissolved in Ethyl acetate (15 ml) and iodomethane-d3 (0.359 ml, 5.78 mmol) was added and the reaction mixture was heated at 60° C. for 16 hrs. White precipitation appeared and it was collected by filtration and dried in the vacuum oven (75% yield).

Synthesis of Compound 82174210

A mixture of 1-(3-(3-(4-(2,6-diisopropylphenyl)-1H-pyrazol-1-yl)phenoxy)phenyl)-3-(methyl-d3)-1H-benzo[d]imidazol-3-ium iodide (820 mg, 1.247 mmol) and silver oxide (144 mg, 0.623 mmol) was stirred in 1,2-dichloroethane (8 ml) at R.T. for 16 hrs. After removing 1,2-dichloroethane, $Pt(COD)Cl_2$ (467 mg, 1.247 mmol) was added and the reaction mixture was vacuumed and back-filled with nitrogen. 1,2-dichlorobenzene (8 ml) was added and heated at 80° C. for 16 hrs and 190° C. for 7 days. The solvent was removed and coated on celite and chromatrographed on silica (DCM/Hep=2/1). The product was triturated in MeOH and dried in the vacuum oven (63% yield).

Synthesis of Compound 89355323

Synthesis 1-(3-bromophenyl)-2-((2,6-diisopropylphenyl)amino)ethan-1-one

A mixture of 2-bromo-1-(3-bromophenyl)ethan-1-one (3 g, 10.79 mmol) and 2,6-diisopropylaniline (4.02 g, 22.67 mmol) was stirred in Ethanol (15 ml) at R.T. for 2 days. EtOH was removed and triturated in diethyl ether. The white solid (salt) was removed by filtration. The filtrate was concentrated and chromatographed on silica (THF/Hep=1/20). Obtained yellow oil. (74% yield).

Synthesis of 4-(3-bromophenyl)-1-(2,6-diisopropylphenyl)-1H-imidazole

A mixture of 1-(3-bromophenyl)-2-((2,6-diisopropylphenyl)amino)ethan-1-one (2.3 g, 6.14 mmol), formaldehyde, 37% in water (0.503 ml, 6.76 mmol), and ammonium acetate (4.74 g, 61.4 mmol) was heated in Acetic Acid (20 ml) at reflux overnight. The mixture was cooled down and partitioned between EA and brine and extracted with EA. The organic extract was basified with $Na_2CO_3$(sat) until basic. Coated on celite and chromatographed on silica (EA/Hep=1/3) (20% yield).

Synthesis of 4-(3-((5-chloro-2',6'-diisopropyl-[1,1'-biphenyl]-3-yl)oxy)phenyl)-1-(2,6-diisopropylphenyl)-1H-imidazole A mixture of 4-(3-bromophenyl)-1-(2,6-diisopropylphenyl)-1H-imidazole (0.8 g, 2.087 mmol), copper(I) iodide (0.079 g, 0.417 mmol), picolinic acid (0.103 g, 0.835 mmol), and potassium carbonate (0.886 g, 4.17 mmol) was vacuum and back-filled with nitrogen. 5-chloro-2',6'-diisopropyl-[1,1'-biphenyl]-3-ol (0.633 g, 2.191 mmol) and DMSO (15 ml) was added to the reaction mixture and heated at 140° C. for 16 hrs. The mixture was cooled down and added water (20 mL). The resulting solid was collected by filtration and washed with water and dissolved in DCM. The product was coated on celite and chromatographed on silica (DCM/Hep=3/1 to 5/1) (71% yield).

Synthesis of 2,6-diisopropyl-N-(2-nitrophenyl)aniline

A mixture of (allyl)PdCl-dimer (0.125 g, 0.342 mmol) and cBRIDP (0.482 g, 1.366 mmol) was vacuumed and back-filled with nitrogen. Toluene (10 ml) was added and refluxed for 3 minutes. The pre-formed catalyst was transferred to a mixture of 1-bromo-2-nitrobenzene (2.3 g, 11.39 mmol), 2,6-diisopropylaniline (2.58 ml, 13.66 mmol), and sodium 2-methylpropan-2-olate (2.74 g, 28.5 mmol) in Toluene (10 ml) and the reaction was refluxed for 2 hrs. The mixture was cooled down and coated on celite and chromatographed on silica (120 g×2, EA/Hep=1/9) (40% yield).

Synthesis of N1-(2,6-diisopropylphenyl)benzene-1,2-diamine 2,6-diisopropyl-N-(2-nitrophenyl)aniline (1.37 g, 4.59 mmol) was dissolved in ethanol (40 ml) and palladium or charcoal on dry basis (0.489 g, 0.459 mmol) was added. The reaction mixture was vacuumed and back-filled with a hydrogen balloon several times and stirred at R.T. for 16 hrs. Filtered through celite and washed with EA and concentrated to give product (93% yield).

Synthesis of N1-(2,6-diisopropylphenyl)-N2-(5-(3-(1-(2,6-diisopropylphenyl)-1H-imidazol-4-yl)phenoxy)-2',6'-diisopropyl-[1,1'-biphenyl]-3-yl)benzene-1,2-diamine A mixture of N1-(2,6-diisopropylphenyl)benzene-1,2-diamine (0.363 g, 1.353 mmol), 4-(3-((5-chloro-2',6'-diisopropyl-[1,1'-biphenyl]-3-yl)oxy)phenyl)-1-(2,6-diisopropylphenyl)-1H-imidazole (0.8 g, 1.353 mmol), (allyl)PdCl-dimer (0.015 g, 0.041 mmol), cBRIDP (0.057 g, 0.162 mmol), and sodium 2-methylpropan-2-olate (0.325 g, 3.38 mmol) was vacuumed and back-filled with nitrogen several times. Toluene (10 ml) was added to the reaction mixture and refluxed for 2 hrs. Coated on celite and chromatographed on silica (DCM/Hep=5/1) (69% yield).

Synthesis of 3-(2,6-diisopropylphenyl)-1-(5-(3-(1-(2,6-diisopropylphenyl)-1H-imidazol-4-yl)phenoxy)-2',6'-diisopropyl-[1,1'-biphenyl]-3-yl)-1H-benzo[d]imidazol-3-ium chloride N1-(2,6-diisopropylphenyl)-N2-(5-(3-(1-(2,6-diisopropylphenyl)-1H-imidazol-4-yl)phenoxy)-2',6'-diisopropyl-[1,1'-biphenyl]-3-yl)benzene-1,2-diamine (0.76 g, 0.923 mmol) was dissolved in triethoxymethane (7.68 ml, 46.2 mmol) and hydrogen chloride (0.091 ml, 1.108 mmol) was added. The reaction mixture was heated at 80° C. for 16 hrs. Triethyl orthoformate was removed by distillation under vacuum until solid appeared. The solid was washed with diethyl ether and filtered and dried in the vacuum oven (76% yield).

Synthesis of Compound 89355323

A mixture of 3-(2,6-diisopropylphenyl)-1-(5-(3-(1-(2,6-diisopropylphenyl)-1H-imidazol-4-yl)phenoxy)-2',6'-diisopropyl-[1,1'-biphenyl]-3-yl)-1H-benzo[d]imidazol-3-ium chloride (0.6 g, 0.690 mmol) and silver oxide (0.080 g, 0.345 mmol) was stirred in 1,2-dichloroethane (10 ml) at R.T. for 16 hrs. After removing 1,2-dichloroethane, $Pt(COD)Cl_2$ (0.258 g, 0.690 mmol) was added and the reaction mixture was vacuumed and back-filled with nitrogen. 1,2-dichlorobenzene (10 ml) was added and heated at 190° C. for 2 days. The solvent was removed and 1,3-diisopropylbenzene (5 mL) was added and refluxed in a sand bath for 7 days. The solvent was removed and coated on celite and chromatrographed on silica (DCM/Hep=1/1). The product was triturated in MeOH and dried in the vacuum oven (52% yield).

TABLE 1

| | Structure | λmax in PMMA (nm) | PLQY in PMMA (%) | Excited state lifetime at 77K (μs) |
|---|---|---|---|---|
| Compound 20 ($L_{A20}$, $L_{B1}$) | 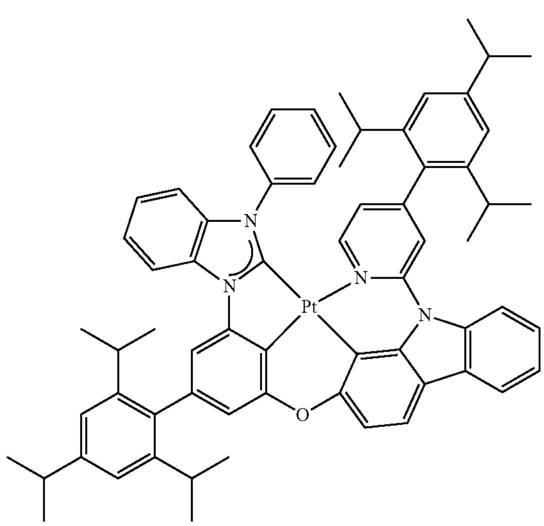 | 458 | 77 | 2.6 |

TABLE 1-continued
| | Structure | λmax in PMMA (nm) | PLQY in PMMA (%) | Excited state lifetime at 77K (μs) |
|---|---|---|---|---|
| Compound 7300 ($L_{A7300}$, $L_{B1}$) | 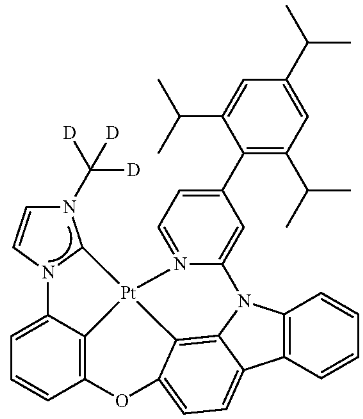 | 453 | 95 | 5.2 |
| Compound 87920 ($L_{A80}$, $L_{B13}$) | 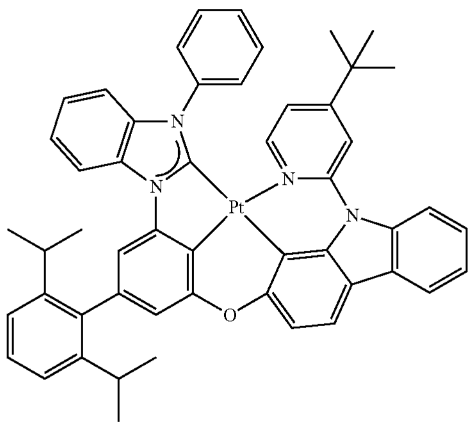 | 455 | 82 | 2.8 |
| Compound 95050 ($L_{A7210}$, $L_{B13}$) | 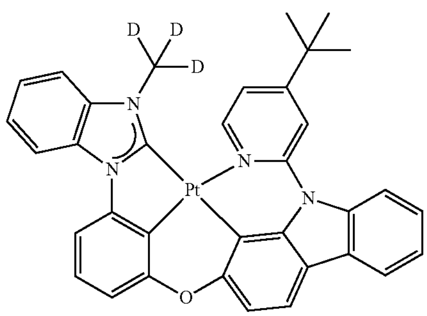 | 449 | 81 | 5.8 |
| Compound 226820 ($L_{A7220}$, $L_{B31}$) | 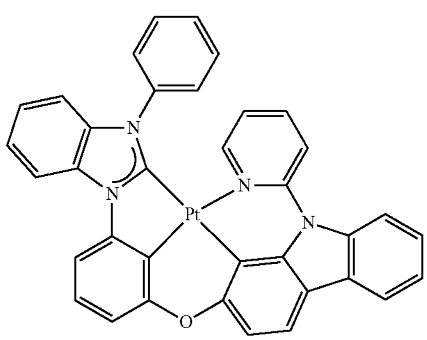 | 455 | 48 | 3.4 |

TABLE 1-continued

| | Structure | λmax in PMMA (nm) | PLQY in PMMA (%) | Excited state lifetime at 77K (μs) |
|---|---|---|---|---|
| Compound 82174210 ($L_{A7210}$, $L_{B11226}$) | 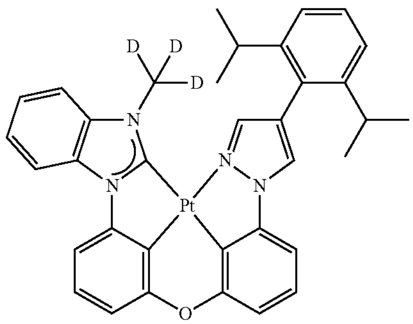 | 459 | 98 | 2.8 |
| Compound 89355325 ($L_{A83}$, $L_{B12208}$) | 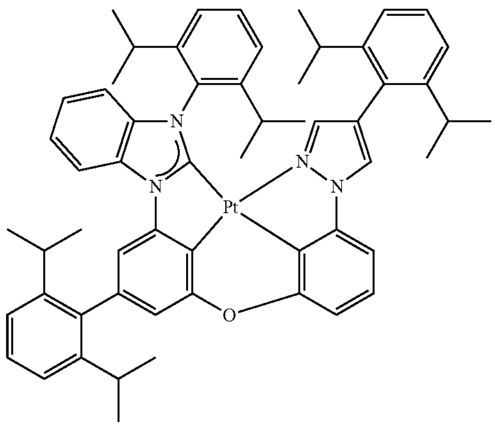 | 470 | 100 | 3.3 |
| Comparative Example | 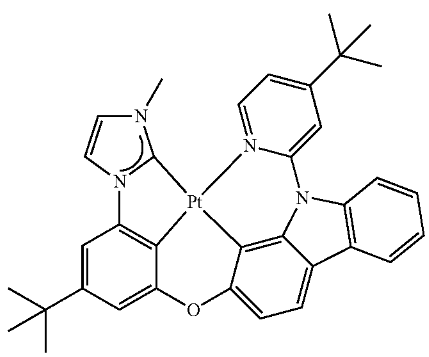 | 447 | 91 | 5.5 |

Table 1 shows the emission peak, PLQY, and excited state lifetime for the inventive compounds Compound 20, Compound 7300, Compound 87920, Compound 95050, Compound 226820, Compound 82174210, Compound 89355323, and Comparative Example. All inventive compounds showed higher PLQYs and shorter excited state lifetime (except for Compound 226820), indicating that they are very efficient emitters, which usually lead to higher device efficiencies. Their emissions in PMMA are in a range of 449-470 nm. Compound 95050 showed a very deep blue emission of 449 nm which is an excellent candidate for generating saturate blue for display application. Experiments have shown that $R^A$ and $R^C$ play an important role for physical property tuning. For example, when both $Ar^1$ and $Ar^2$=H (Compound 52843111), the complex decomposes before sublimation whereas Compound 20 and 87920 sublime cleanly to allow us to evaluate its device performance. These results suggest the physical properties of this family are very sensitive to the ligand structure. The Comparative Example also shows efficient and blue emission property; however, the device based on it is much less efficient.

OLED Device Fabrication:

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50W at 100 mTorr and with ultra violet (UV) ozone for 5 minutes. The devices in Tables 1 were fabricated in high vacuum ($<10^{-6}$ Torr) by thermal evaporation. The anode electrode was 750 Å of ITO. The device example had organic layers consisting of, sequentially, from the ITO surface, 100 Å thick Compound A (HIL), 250 Å layer of Compound B (HTL), 50 Å of Compound C (EBL), 300 Å of Compound D doped with 10% of Emitter (EML), 50 Å of Compound E (BL), 300 Å of Compound G doped with 35% of Compound F (ETL), 10

Å of Compound G (EIL) followed by 1,000 Å of Al (Cathode). All devices were encapsulated with a glass lid sealed with an epoxy resin in a nitrogen glove box (<1 ppm of $H_2O$ and $O_2$,) immediately after fabrication with a moisture getter incorporated inside the package. The doping percentages are in volume percent.

The structures of the compounds used in the experimental devices are shown below:

Compound A

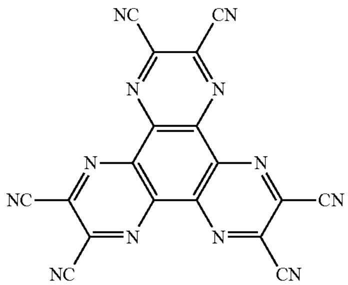

Compound B

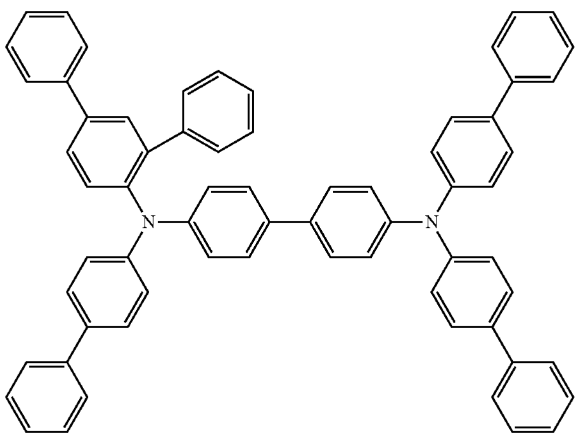

Compound C

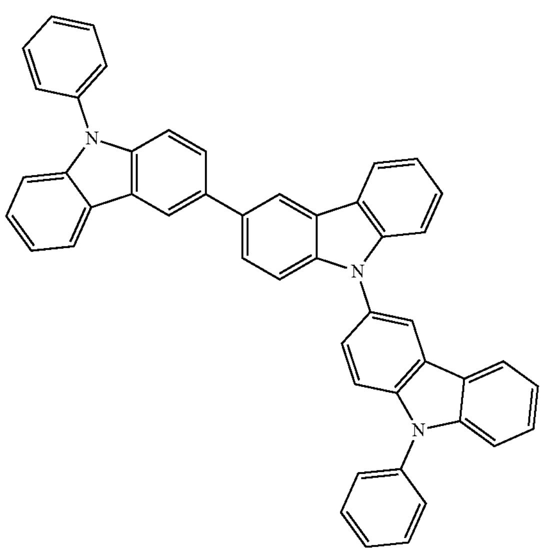

-continued

Compound D

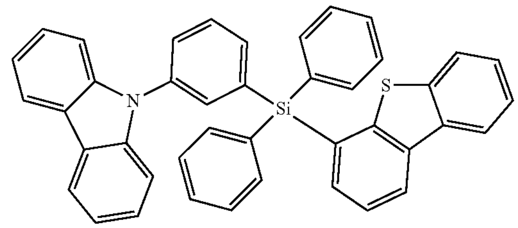

Compound E

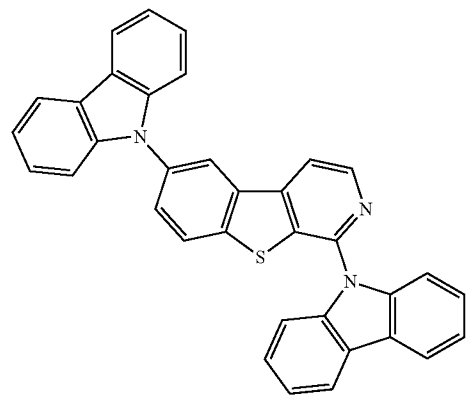

Compound F

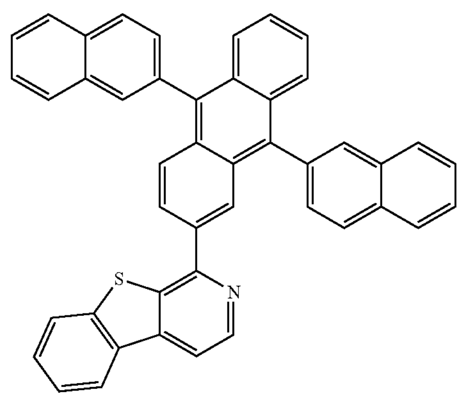

Compound G

TABLE 2

| Device Data | | | | | | | | | |
|---|---|---|---|---|---|---|---|---|---|
| | | | | | at 1,000 nit | | | | |
| | 1931 CIE | | λ max | FWHM | Voltage | LE | EQE | PE | |
| Device | x | y | [nm] | [nm] | [a.u.][a] | [a.u.] | [a.u.] | [a.u.] | |
| Compound 20 | 0.129 | 0.199 | 468 | 37 | 0.93 | 1.81 | 1.93 | 1.94 | |
| Compound 7300 | 0.149 | 0.279 | 475 | 62 | 0.90 | 2.69 | 2.19 | 3.02 | |
| Compound 87920 | 0.133 | 0.193 | 466 | 41 | 0.93 | 1.26 | 1.36 | 1.35 | |
| Compound 95050 | 0.136 | 0.148 | 460 | 40 | 0.88 | 1.20 | 1.53 | 1.36 | |
| Compound 82174210 | 0.318 | 0.319 | 467 | 45 | 0.88 | 3.19 | 2.55 | 3.69 | |
| Compound 89355323 | 0.131 | 0.273 | 473 | 41 | 0.85 | 2.50 | 2.19 | 2.96 | |
| Comparative Example | 0.155 | 0.196 | 457 | 50 | 1.00 | 1.00 | 1.00 | 1.00 | |

[a]a.u. = arbitrary units; all data is normalized relative to Comparative Example.

Table 2 shows device data for the inventive compounds Compound 20, Compound 7300, Compound 87920, Compound 95050, Compound 82174210, Compound 89355323, and Comparative Example. All inventive compounds exhibited lower voltage and higher efficiencies at 1000 nit as compared to those of Comparative Example. Compound 95050 produced a CIE-y of 0.148 which is comparable to that of commercial fluorescent blue. Although the Comparative Example exhibited good deep blue color, its CIE-y is still not as good as that of Compound 9505. The device based on Comparative Example is much less efficient with a higher voltage.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having the formula:

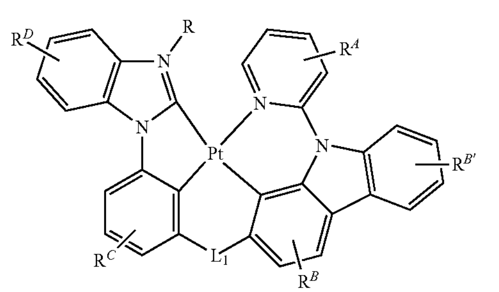

wherein $L^1$ is O;

wherein $R^B$, $R^{B'}$, $R^C$, and $R^D$, each represents mono to a maximum allowable substitutions, or no substitution;

wherein each $R^B$ and $R^{B'}$ is independently hydrogen, deuterium, nitrile, or a substituent selected from the group consisting of alkyl, cycloalkyl, aryl, heteroaryl, fluorinated variants thereof, and deuterated variants thereof, which may be further substituted by one or more alkyl, cycloalkyl, aryl, heteroaryl, nitrile, fluorinated variants thereof, or deuterated variants thereof;

wherein each $R^D$ is independently selected from the group consisting of hydrogen, deuterium, alkyl, cycloalkyl, aryl, fluorinated variants thereof, and deuterated variants thereof, which may be further substituted by one or more alkyl, cycloalkyl, aryl, fluorinated variants thereof, or deuterated variants thereof;

wherein R is alkyl, cycloalkyl, partially or fully fluorinated alkyl or cycloalkyl, partially or fully deuterated alkyl or cycloalkyl or a combination of both;

wherein each $R^A$ is independently selected from the group consisting of hydrogen, alkyl, cycloalkyl, partially or fully fluorinated alkyl or cycloalkyl, partially or fully deuterated alkyl or cycloalkyl or a combination of both, and at least one $R^A$ is not hydrogen; and wherein each $R^C$ is independently H or aryl which can be partially or fully deuterated, and which can be substituted by alkyl, aryl, partially or fully fluorinated alkyl or cycloalkyl, partially or fully deuterated alkyl or cycloalkyl or a combination of both.

2. The compound of claim 1, wherein each of and $R^{B'}$ is independently selected from the group consisting of hydrogen, deuterium, and a substituent selected from the group consisting of alkyl, cycloalkyl, aryl, heteroaryl, fluorinated variants thereof, and deuterated variants thereof, which may be further substituted by one or more alkyl, fluorinated alkyl, cycloalkyl, aryl, heteroaryl, fluorinated variants thereof, or deuterated variants thereof; and each $R^D$ is independently selected from the group consisting of hydrogen, deuterium, alkyl, aryl, fluorinated variants thereof, and deuterated variants thereof, which may be further substituted by one or more alkyl, aryl, fluorinated variants thereof, or deuterated variants thereof.

3. The compound of claim 1, wherein at least one $R^C$ is aryl.

4. An organic light emitting device (OLED) comprising:

an anode;

a cathode; and an organic layer, disposed between the anode and the cathode, comprising a compound having the formula:

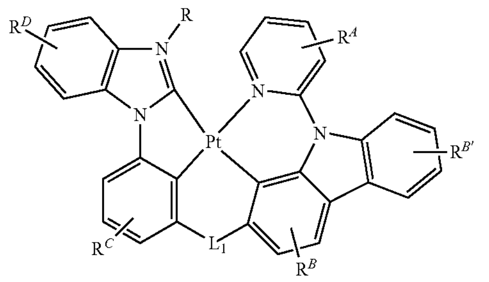

wherein $L^1$ is O;

wherein $R^B$, $R^{B'}$, $R^C$, and $R^D$, each represents mono to a maximum allowable substitutions, or no substitution;

wherein each $R^B$ and $R^{B'}$ is independently hydrogen, deuterium, nitrile, or a substituent selected from the group consisting of alkyl, cycloalkyl, aryl, heteroaryl, fluorinated variants thereof, and deuterated variants thereof, which may be further substituted by one or more alkyl, cycloalkyl, aryl, heteroaryl, nitrile, fluorinated variants thereof, or deuterated variants thereof;

wherein each $R^D$ is independently selected from the group consisting of hydrogen, deuterium, alkyl, cycloalkyl, aryl, fluorinated variants thereof, and deuterated variants thereof, which may be further substituted by one or more alkyl, cycloalkyl, aryl, fluorinated variants thereof, or deuterated variants thereof;

wherein R is alkyl, cycloalkyl, partially or fully fluorinated alkyl or cycloalkyl, partially or fully deuterated alkyl or cycloalkyl or a combination of both;

wherein each $R^A$ is independently selected from the group consisting of hydrogen, alkyl, cycloalkyl, partially or fully fluorinated alkyl or cycloalkyl, partially or fully deuterated alkyl or cycloalkyl or a combination of both, and at least one $R^A$ is not hydrogen; and wherein each $R^C$ is independently H or aryl which can be partially or fully deuterated, and which can be substituted by alkyl, aryl, partially or fully fluorinated alkyl or cycloalkyl, partially or fully deuterated alkyl or cycloalkyl or a combination of both.

5. The OLED of claim 4, wherein the organic layer is an emissive layer and the compound is an emissive dopant or a non-emissive dopant.

6. The OLED of claim 4, wherein the organic layer further comprises a host, wherein the host comprises at least one chemical group selected from the group consisting of metal complex, triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

7. The OLED of claim 4, wherein the organic layer further comprises a host, wherein the host is selected from the group consisting of:

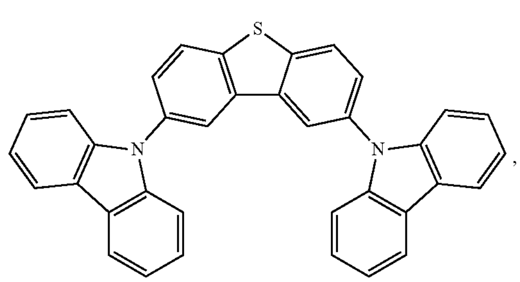

-continued

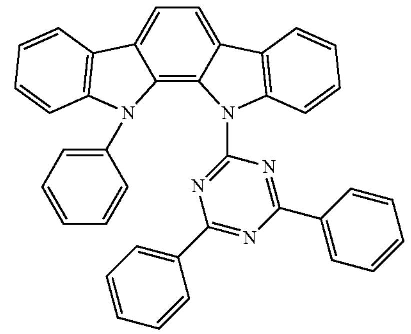

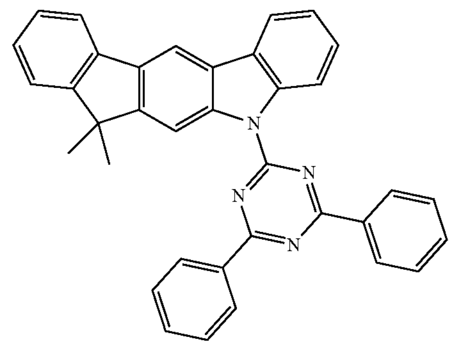

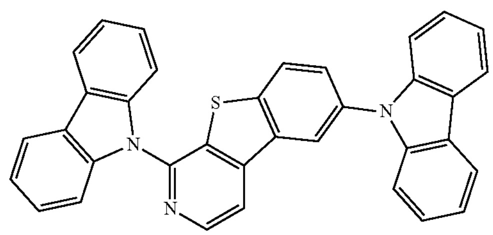

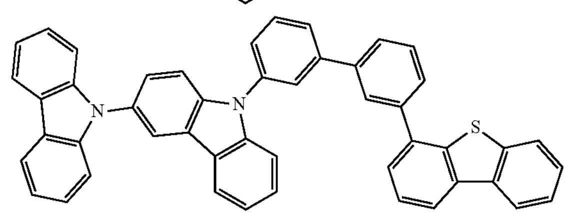

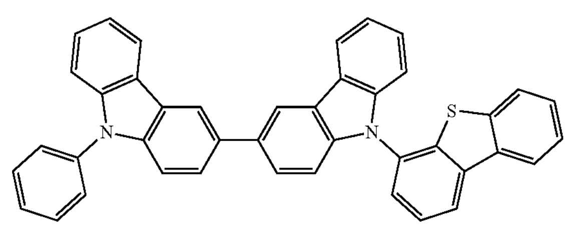

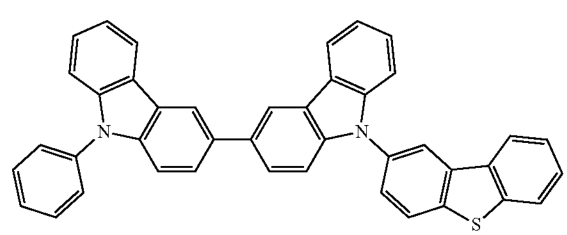

-continued
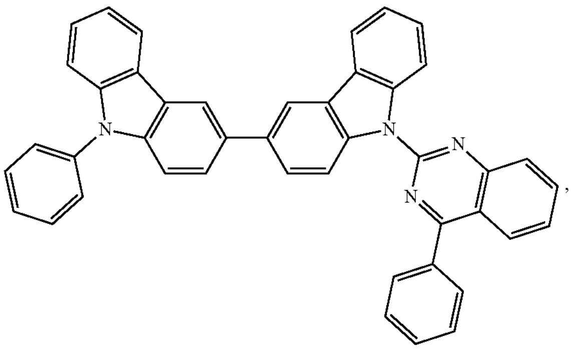
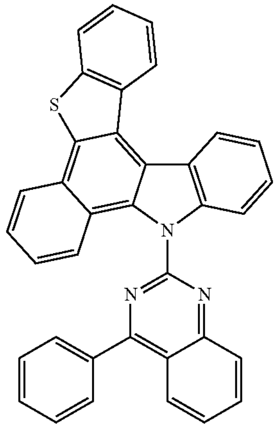
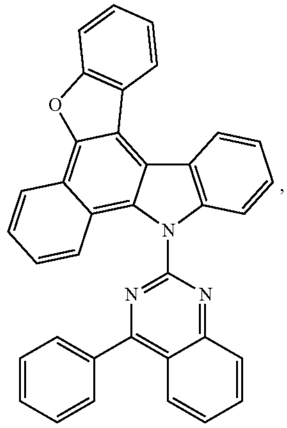
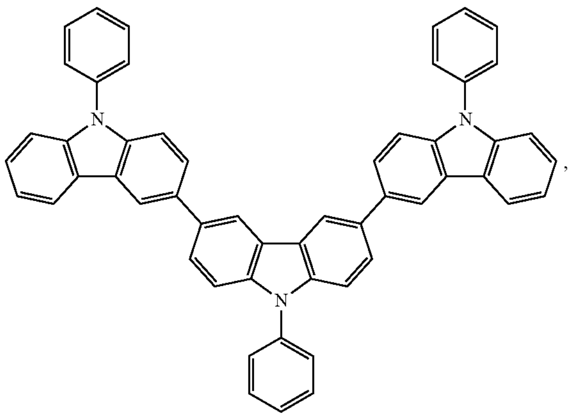
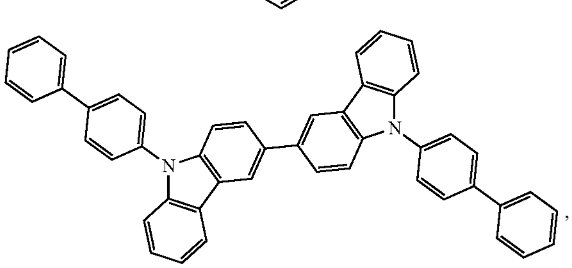
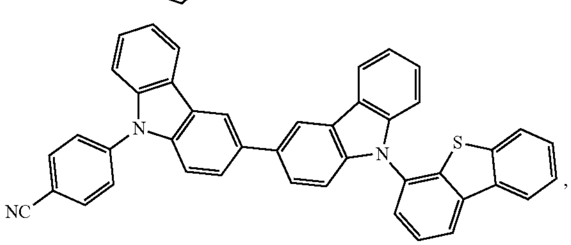
-continued
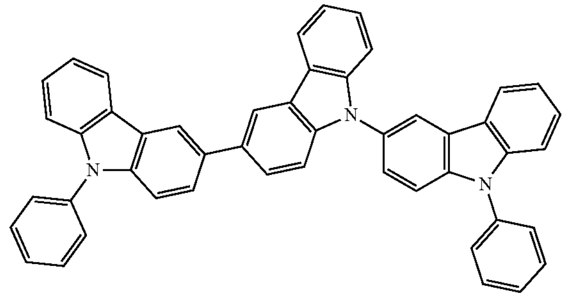
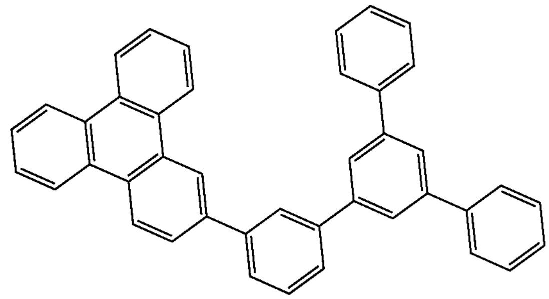
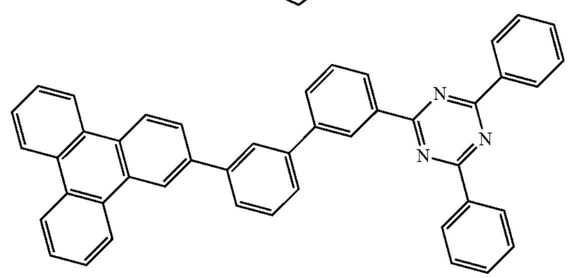
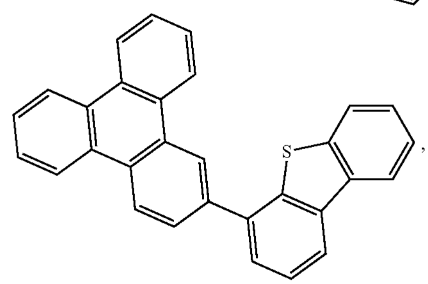
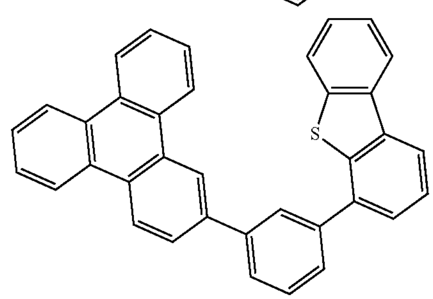
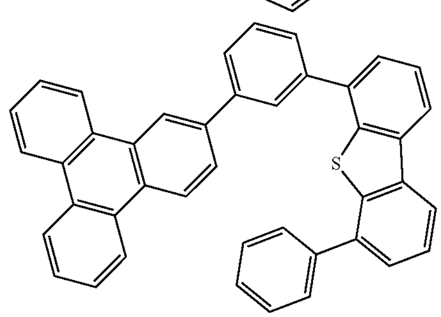

-continued

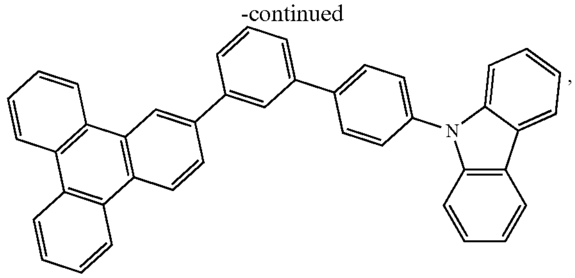

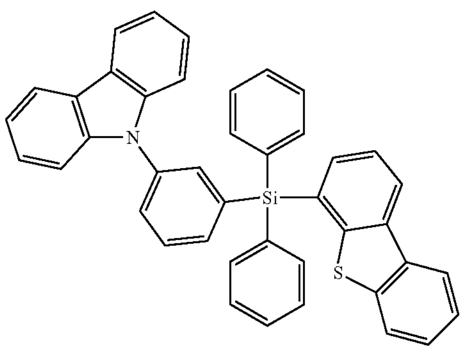

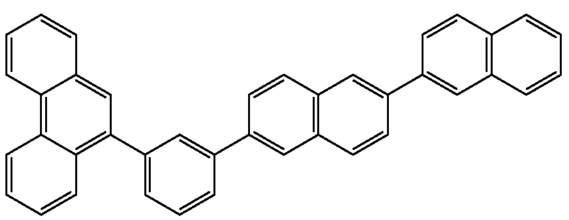

and combinations thereof.

8. A consumer product comprising an organic light emitting device (OLED) comprising:

an anode;

a cathode; and an organic layer, disposed between the anode and the cathode, comprising a compound having the formula:

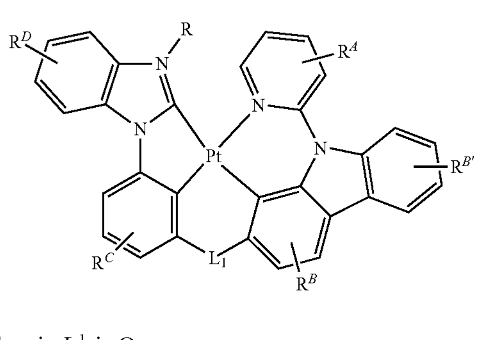

wherein $L^1$ is O;

wherein $R^B$, $R^{B'}$, $R^C$, and $R^D$, each represents mono to a maximum allowable substitutions, or no substitution;

wherein each $R^B$ and $R^{B'}$ is independently hydrogen, deuterium, nitrile, or a substituent selected from the group consisting of alkyl, cycloalkyl, aryl, heteroaryl, fluorinated variants thereof, and deuterated variants thereof, which may be further substituted by one or more alkyl, cycloalkyl, aryl, heteroaryl, nitrile, fluorinated variants thereof, or deuterated variants thereof;

wherein each $R^D$ is independently selected from the group consisting of hydrogen, deuterium, alkyl, cycloalkyl, aryl, fluorinated variants thereof, and deuterated variants thereof, which may be further substituted by one or more alkyl, cycloalkyl, aryl, fluorinated variants thereof, or deuterated variants thereof;

wherein R is alkyl, cycloalkyl, partially or fully fluorinated alkyl or cycloalkyl, partially or fully deuterated alkyl or cycloalkyl or a combination of both;

wherein each $R^A$ is independently selected from the group consisting of hydrogen, alkyl, cycloalkyl, partially or fully fluorinated alkyl or cycloalkyl, partially or fully deuterated alkyl or cycloalkyl or a combination of both, and at least one $R^A$ is not hydrogen; and wherein each $R^C$ is independently H or aryl which can be partially or fully deuterated, and which can be substituted by alkyl, aryl, partially or fully fluorinated alkyl or cycloalkyl, partially or fully deuterated alkyl or cycloalkyl or a combination of both.

9. The consumer product of claim 8, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

10. A formulation comprising the compound of claim 1.

11. The compound of claim 1, wherein at least one $R^D$ is selected from the group consisting of alkyl, partially and fully deuterated alkyl, and partially and fully fluorinated alkyl.

12. The compound of claim 1, wherein each $R^D$ is hydrogen.

13. The compound of claim 1, wherein $R^D$ is selected from the group consisting of hydrogen, alkyl, partially and fully deuterated alkyl, and partially and fully fluorinated alkyl.

14. The compound of claim 1, wherein each $R^C$ is H.

15. The compound of claim 1, wherein exactly one $R^C$ is aryl, which can be substituted by alkyl or aryl, and can be partially or fully deuterated.

16. The compound of claim 1, wherein R is partially or fully deuterated alkyl, partially or fully fluorinated alkyl, or a combination of both.

17. The compound of claim 1, wherein $R^A$ is partially or fully deuterated alkyl or cycloalkyl, partially or fully fluorinated alkyl or cycloalkyl, or a combination of both.

18. The compound of claim 1, wherein the compound has the formula $Pt(L_{Ay})(L_{Bz})$, wherein $L_{Ay}$ has the following structures:

| $L_{Ay}$ | Structure of $L_{Ay}$ | $Ar^1$, $R^1$ | y |
|---|---|---|---|
| | 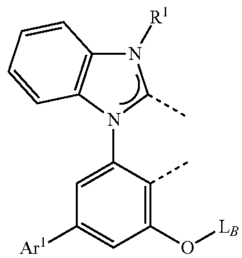 | wherein $Ar^1$ = Ai and $R^1$ = Rk, wherein i is an integer from 1 to 10, and k is an integer selected from 1-19, and | y = 30(i − 1) + k |
| | 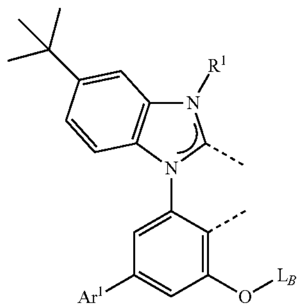 | wherein $Ar^1$ = Ai and $R^1$ = Rk, wherein i is an integer from 1 to 10, and k is an integer selected from 1-19, and | y = 30(i − 1) + k + 900 |
| | 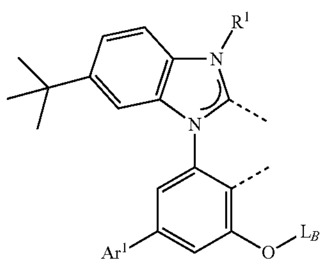 | wherein $Ar^1$ = Ai and $R^1$ = Rk, wherein i is an integer from 1 to 10, and k is an integer selected from 1-19, and | y = 30(i − 1) + k + 1800 |
| | 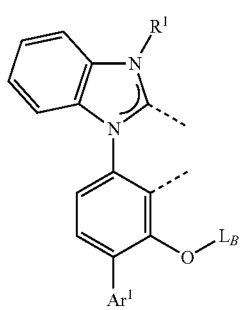 | wherein $Ar^1$ = Ai and $R^1$ = Rk, wherein i is an integer from 1 to 10, and k is an integer selected from 1-19, and | y = 30(i − 1) + k + 2700 |
| | 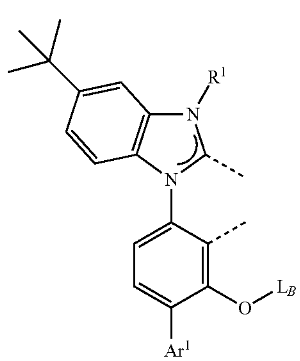 | wherein $Ar^1$ = Ai and $R^1$ = Rk, wherein i is an integer from 1 to 10 and k is an integer selected from 1-19, and | y = 30(i − 1) + k + 3600 |

-continued

| $L_{Ay}$ | Structure of $L_{Ay}$ | $Ar^1$, $R^1$ | y |
|---|---|---|---|
| | 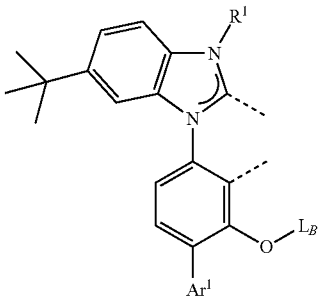 | wherein $Ar^1$ = Ai and $R^1$ = Rk, wherein i is an integer from 1 to 10, and k is an integer selected from 1-19, and | y = 30(i − 1) + k + 4500 |
| | 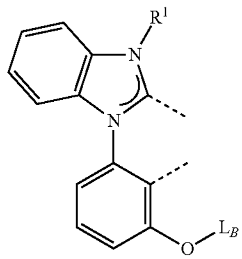 | wherein $R^1$ = Rk, wherein k is an integer selected from 1-19, and | y = k + 7200 |
| | 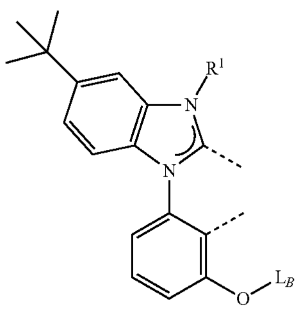 | wherein $R^1$ = Rk, wherein k is an integer selected from 1-19, and | y = k + 7230 |
| | 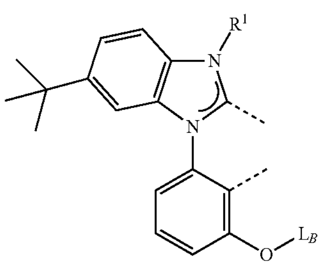 | wherein $R^1$ = Rk, wherein k is an integer selected from 1-19, and | y = k + 7260 |

wherein $L_{Bz}$ has the following structures:

| $L_{Bz}$ | $L_{Bz}$ structure | $Ar^2$, $Ar^3$, $R^2$ | z |
|---|---|---|---|
| | 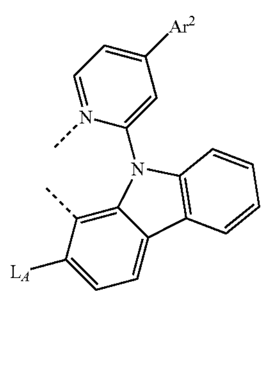 | wherein $Ar^2$ = Aj, wherein j is an integer from 11 to 30, and | z = j |

-continued

| $L_{Bz}$ | $L_{Bz}$ structure | $Ar^2$, $Ar^3$, $R^2$ | z |
|---|---|---|---|
| | 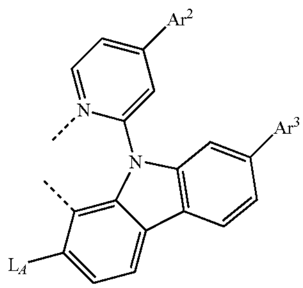 | wherein $Ar^2$ = Aj and $Ar^3$ = Am, wherein j is an integer from 11 to 30 and m is an integer from 1 to 30, and | z = 30(j − 1) + m + 31 |
| | 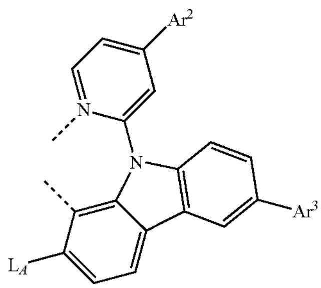 | wherein $Ar^2$ = Aj and $Ar^3$ = Am, wherein j is an integer from 11 to 30 and m is an integer from 1 to 30, and | z = 30(j − 1) + m + 961 |
| | 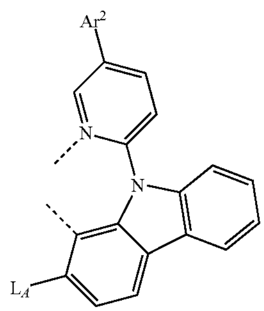 | wherein $Ar^2$ = Aj, wherein j is an integer from 11 to 30, and | z = j + 1891 |
| | 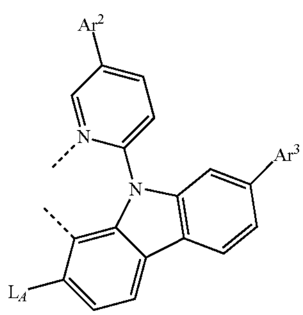 | wherein $Ar^2$ = Aj and $Ar^3$ = Am, wherein j is an integer from 11 to 30 and m is an integer from 1 to 30, and | z = 30(j − 1) + m + 1921 |
| | 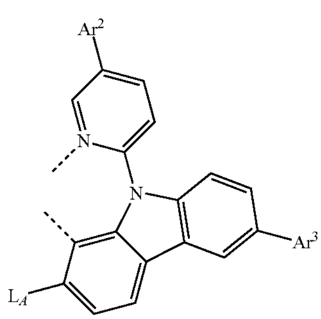 | wherein $Ar^2$ = Aj and $Ar^3$ = Am, wherein j is an integer from 11 to 30 and m is an integer from 1 to 30, and | z = 30(j − 1) + m + 2821 |

-continued

| $L_{Bz}$ | $L_{Bz}$ structure | $Ar^2$, $Ar^3$, $R^2$ | z |
|---|---|---|---|
| | 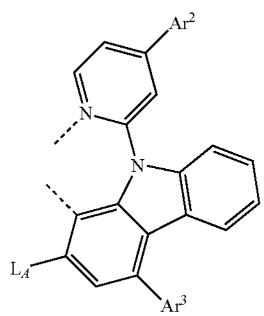 | wherein $Ar^2$ = Aj and $Ar^3$ = Am, wherein j is an integer from 11 to 30 and m is an integer from 1 to 30, and | z = 30(j − 1) + m + 3721 |
| | 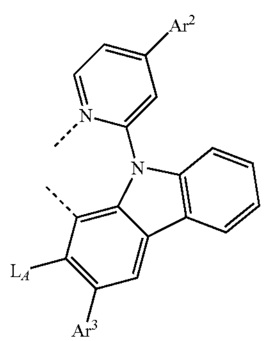 | wherein $Ar^2$ = Aj and $Ar^3$ = Am, wherein j is an integer from 11 to 30 and m is an integer from 1 to 30, and | z = 30(j − 1) + m + 4651 |
| | 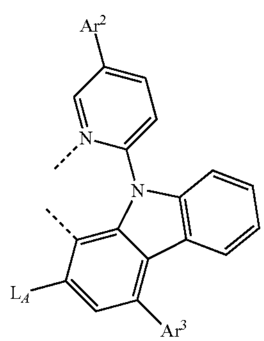 | wherein $Ar^2$ = Aj and $Ar^3$ = Am, wherein j is an integer from 11 to 30 and m is an integer from 1 to 30, and | z = 30(j − 1) + m + 5581 |
| | 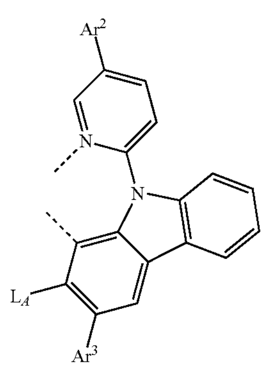 | wherein $Ar^2$ = Aj and $Ar^3$ = Am, wherein j is an integer from 11 to 30 and m is an integer from 1 to 30, and | z = 30(j − 1) + m + 6481 |

-continued
| $L_{Bz}$ | $L_{Bz}$ structure | $Ar^2$, $Ar^3$, $R^2$ | z |
|---|---|---|---|
| | 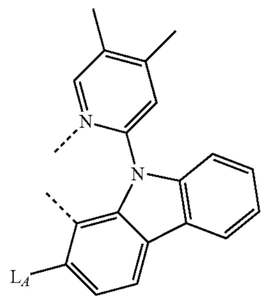 | | z = 7382 |
| | 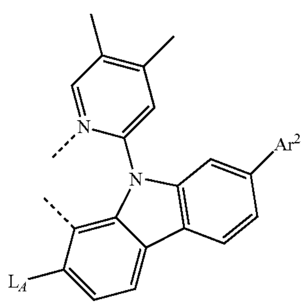 | wherein $Ar^2$ = Aj, wherein j is an integer from 1 to 30, and | z = j + 7382 |
| | 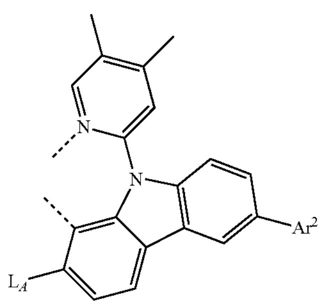 | wherein $Ar^2$ = Aj, wherein j is an integer from 1 to 30, and | z = j + 7412 |
| | 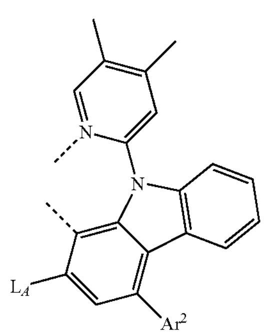 | wherein $Ar^2$ = Aj, wherein j is an integer from 1 to 30, and | z = j + 7442 |
| | 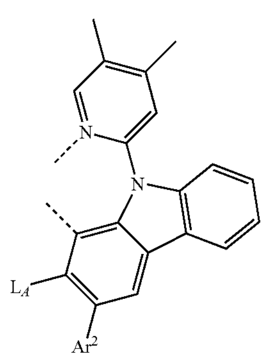 | wherein $Ar^2$ = Aj, wherein j is an integer from 1 to 30, and | z = j + 7472 |

wherein A1 to A30 have the following structures:
A1
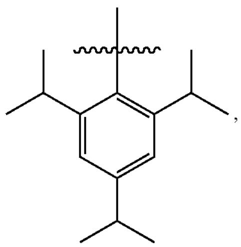
A2
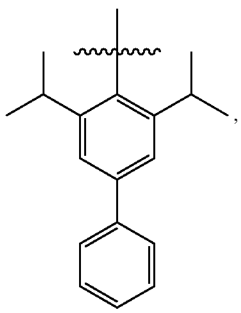
A3
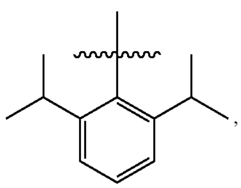
A4
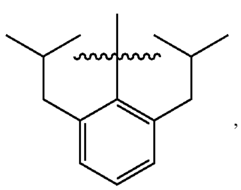
A5
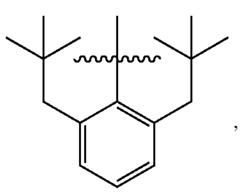
A6
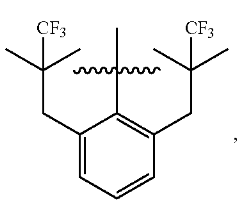
A7
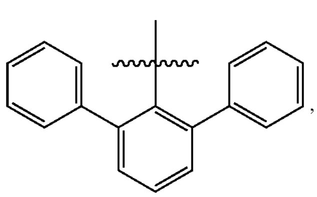
-continued
A8
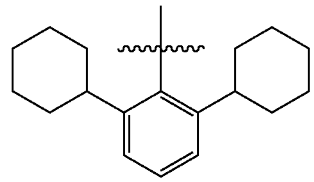
A9
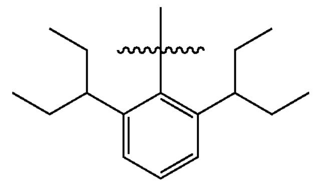
A10
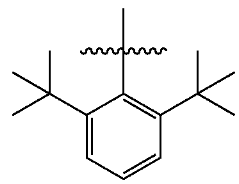
A11
Me,
A12
iPr,
A13
tBu,
A14
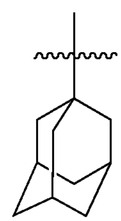
A15
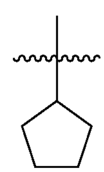
A16
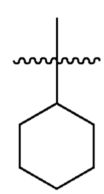
A17
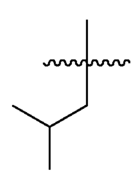

-continued
A18
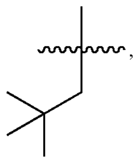
A19
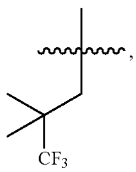
A20
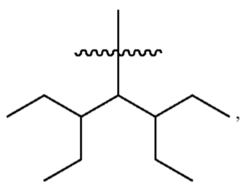
A21
$CD_3$,
A22
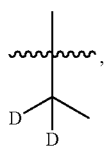
A23
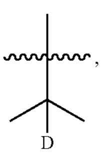
A24
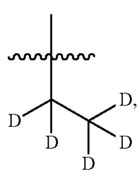
A25
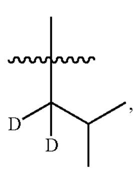
A26
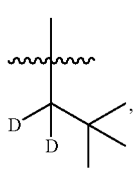
A27
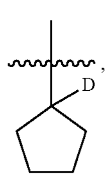
-continued
A28
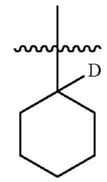
A29
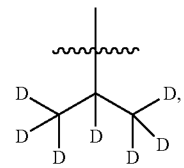
A30
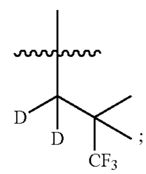
and wherein R1 to R30 have the following structures:
R1
Me,
R2
iPr,
R3
tBu,
R4
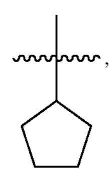
R5
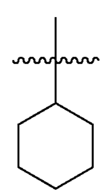
R6
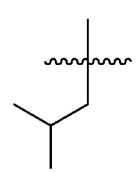
R7
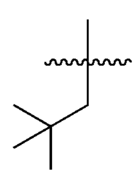

-continued
R8
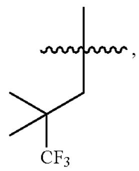
R9
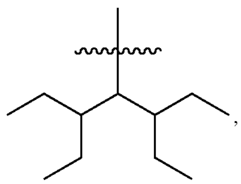
R10
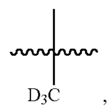
R11
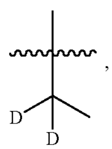
R12
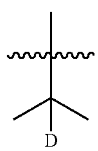
R13
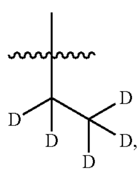
R14
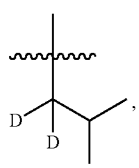
-continued
R15
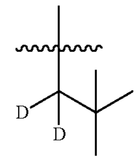
R16
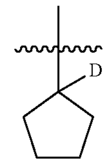
R17
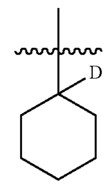
R18
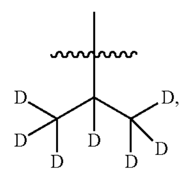
R19
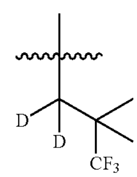
* * * * *